US012707977B2

(12) United States Patent
Yeh et al.

(10) Patent No.: US 12,707,977 B2
(45) Date of Patent: Aug. 11, 2026

(54) INTEGRATED CIRCUIT PACKAGES AND METHODS OF FORMING THE SAME

(71) Applicant: Taiwan Semiconductor Manufacturing Co., Ltd., Hsinchu (TW)

(72) Inventors: Der-Chyang Yeh, Hsinchu (TW); Kuo-Chiang Ting, Hsinchu (TW); Yu-Hsiung Wang, Zhubei (TW); Chao-Wen Shih, Zhubei (TW); Sung-Feng Yeh, Taipei (TW); Ta Hao Sung, Hsinchu (TW); Cheng-Wei Huang, Hsinchu (TW); Yen-Ping Wang, Hemei Township (TW); Chang-Wen Huang, Hsinchu (TW); Sheng-Ta Lin, Gongguan Township (TW); Li-Cheng Hu, Hsinchu (TW); Gao-Long Wu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 505 days.

(21) Appl. No.: 18/151,556

(22) Filed: Jan. 9, 2023

(65) Prior Publication Data

US 2024/0055371 A1 Feb. 15, 2024

Related U.S. Application Data

(60) Provisional application No. 63/420,406, filed on Oct. 28, 2022, provisional application No. 63/370,814, filed on Aug. 9, 2022.

(51) Int. Cl.
*H10W 42/00* (2026.01)
*H10W 20/20* (2026.01)
(Continued)

(52) U.S. Cl.
CPC ......... *H10W 42/121* (2026.01); *H10W 20/20* (2026.01); *H10W 42/00* (2026.01); *H10W 74/016* (2026.01); *H10W 74/134* (2026.01)

(58) Field of Classification Search
None
See application file for complete search history.

(56) References Cited

U.S. PATENT DOCUMENTS 5,834,829 A 11/1998 Dinkel et al.
9,000,584 B2 4/2015 Lin et al.
(Continued)

FOREIGN PATENT DOCUMENTS

JP H1098014 A 4/1998
KR 20200116866 A 10/2020
(Continued)

*Primary Examiner* — Jay C Chang
(74) *Attorney, Agent, or Firm* — Slater Matsil, LLP

(57) ABSTRACT

Embodiments include a crack stopper structure surrounding an embedded integrated circuit die, and the formation thereof. The crack stopper structure may include multiple layers separated by a fill layer. The layers of the crack stopper may include multiple sublayers, some of the sublayers providing adhesion, hardness buffering, and material gradients for transitioning from one layer of the crack stopper structure to another layer of the crack stopper structure.

20 Claims, 34 Drawing Sheets

(51) Int. Cl.

| | |
|---|---|
| ***H10W 74/01*** | (2026.01) |
| ***H10W 74/10*** | (2026.01) |

(56) References Cited

U.S. PATENT DOCUMENTS

| | | | |
|---|---|---|---|
| 9,048,222 | B2 | 6/2015 | Hung et al. |
| 9,048,233 | B2 | 6/2015 | Wu et al. |
| 9,064,879 | B2 | 6/2015 | Hung et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,368,460 | B2 | 6/2016 | Yu et al. |
| 9,372,206 | B2 | 6/2016 | Wu et al. |
| 9,496,189 | B2 | 11/2016 | Yu et al. |
| 2012/0217641 | A1 | 8/2012 | Chen et al. |
| 2019/0072620 | A1* | 3/2019 | Ishizaki ............... G01R 33/096 |
| 2019/0139851 | A1 | 5/2019 | Myung et al. |
| 2020/0312774 | A1 | 10/2020 | Yu et al. |
| 2020/0395338 | A1* | 12/2020 | Hsu ......................... H01L 25/50 |
| 2021/0020601 | A1* | 1/2021 | Chen ................. H01L 21/02274 |
| 2021/0098398 | A1 | 4/2021 | Yang et al. |
| 2021/0375827 | A1* | 12/2021 | Chen ................... H01L 25/0657 |
| 2022/0238353 | A1 | 7/2022 | Lii et al. |
| 2022/0246549 | A1 | 8/2022 | Wu et al. |

FOREIGN PATENT DOCUMENTS

| | | | |
|---|---|---|---|
| KR | 20210039896 | A | 4/2021 |
| KR | 20220109272 | A | 8/2022 |
| TW | 201919177 | A | 5/2019 |
| TW | 202123415 | A | 6/2021 |
| TW | 202145466 | A | 12/2021 |

* cited by examiner

INTEGRATED CIRCUIT PACKAGES AND METHODS OF FORMING THE SAME

PRIORITY CLAIM AND CROSS-REFERENCE

This application claims the benefit of U.S. Provisional Application No. 63/370,814, filed on Aug. 9, 2022 and U.S. Provisional Application No. 63/420,406, filed on Oct. 28, 2022, which applications are hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 23 is a cross-sectional view of an integrated circuit package, in accordance with some other embodiments.

DETAILED DESCRIPTION

Figure 1:
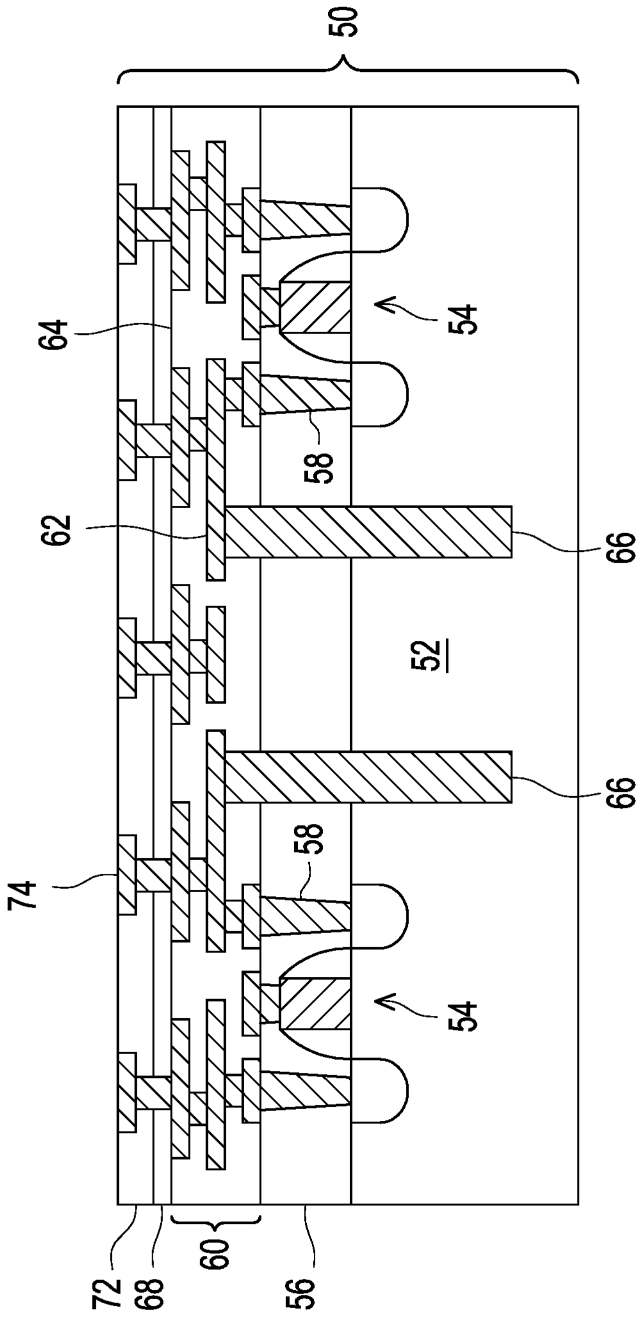
FIG. 1 is a cross-sectional view of an integrated circuit die.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For system-on-integrated-circuit (SOIC) devices, integrated circuit devices (which may also be referred to as dies or chips) are attached together into a single system device package. Gap fill materials, such as oxide materials, may be used to fill the areas around the attached dies. The SOIC devices may then be used in additional packages, such as used in an integrated fan out (InFO) package, used in a chip-on-wafer-on-substrate (CoWoS) package, or used in another 3D package. Gap fill materials may be brittle and prone to cracking, especially when used in bulk filling applications, such as used in gap filling. Cracking may occur, for example, during stresses caused by heating and/or cooling cycles associated with downstream processes or during die saw mechanical stress. Cracks may damage functional dies or induce process failures. For example, a crack can propagate into a die and cause it to have reduced function or reduced performance, or a crack can leave an avenue for contamination from debris or liquid wicking, such as solder, oils, cleaners, etc.

According to various embodiments, after an integrated circuit die is placed, a crack stopper structure is provided to envelop the integrated circuit die prior to depositing the major portion of the gap fill material. As will be described in greater detail below, the crack stopper structure can include a single layer or multi-layer structure that provides a stress relief point for any cracks to stop at, so that the cracks do not damage the attached die. The stress relief achieved may prevent cracks from forming altogether, however, even when cracks do form, the crack stopper structure reduces the lengths of the cracks and prevents or reduces the cracks from affecting the attached die. Although the crack stopper structure is referred to as such, it should be understood that the various crack stopper structures include varying layers of different dielectric materials at specific thicknesses to curtail the propagation of cracks. Thus, it should be understood that the "crack stopper structure" as referenced herein is synonymous with an arrangement of dielectric layers.

FIG. 1 is a cross-sectional view of an integrated circuit die 50. The integrated circuit die 50 will be packaged in subsequent processing to form an integrated circuit device. The integrated circuit die 50 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The integrated circuit die 50 may be formed in a wafer, which may include different device regions that are singulated in subsequent steps to form a plurality of integrated circuit dies. The integrated circuit die 50 may be processed according to applicable manufacturing processes to form integrated circuits. For example, the integrated circuit die 50 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back side.

Devices 54 (represented by a transistor) are disposed at the active surface of the semiconductor substrate 52. The devices 54 may be active devices (e.g., transistors, diodes, etc.), capacitors, resistors, etc. For example, the devices 54 may be transistors that include gate structures and source/drain regions, where the gate structures are on channel regions, and the source/drain regions are adjacent the channel regions. The channel regions may be patterned regions of the semiconductor substrate 52. For example, the channel regions may be regions of semiconductor fins, semiconductor nanosheets, semiconductor nanowires, or the like patterned in the semiconductor substrate 52. When the devices 54 are transistors, they may be nanostructure field-effect transistors (Nanostructure-FETs), fin field-effect transistors (FinFETs), planar transistors, or the like.

An inter-layer dielectric 56 is disposed over the active surface of the semiconductor substrate 52. The inter-layer dielectric 56 surrounds and may cover the devices 54. The inter-layer dielectric 56 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like, which may be formed by a deposition process such as chemical vapor deposition (CVD), atomic layer deposition (ALD), or the like. Contacts 58 extend through the inter-layer dielectric 56 to electrically and physically couple the devices 54. For example, when the devices 54 are transistors, the contacts 58 may couple the gates and source/drain regions of the transistors. The contacts 58 may be formed of a suitable conductive material such as tungsten, cobalt, nickel, copper, silver, gold, aluminum, the like, or combinations thereof, which may be formed by a deposition process such as physical vapor deposition (PVD) or CVD, a plating process such as electrolytic or electroless plating, or the like.

An interconnect structure 60 is disposed over the inter-layer dielectric 56 and contacts 58. The interconnect structure 60 interconnects the devices 54 to form an integrated circuit. The interconnect structure 60 may be formed of, for example, metallization patterns 62 in dielectric layers 64. The dielectric layers 64 may be, e.g., low-k dielectric layers. The metallization patterns 62 include metal lines and vias, which may be formed in the dielectric layers 64 by a damascene process, such as a single damascene process, a dual damascene process, or the like. The metallization patterns 62 may be formed of a suitable conductive material, such as copper, tungsten, aluminum, silver, gold, a combination thereof, or the like. The metallization patterns 62 are electrically coupled to the devices 54 by the contacts 58.

The conductive vias 66 extend into the interconnect structure 60 and/or the semiconductor substrate 52. The conductive vias 66 are electrically coupled to the metallization patterns 62 of the interconnect structure 60. The conductive vias 66 may be through-substrate vias, such as through-silicon vias. As an example to form the conductive vias 66, recesses can be formed in the interconnect structure 60 and/or the semiconductor substrate 52 by, for example, etching, milling, laser techniques, a combination thereof, or the like. A thin barrier layer may be conformally deposited in the recesses, such as by CVD, atomic layer deposition (ALD), physical vapor deposition (PVD), thermal oxidation, a combination thereof, or the like. The barrier layer may be formed from an oxide, a nitride, a carbide, combinations thereof, or the like. A conductive material may be deposited over the barrier layer and in the recesses. The conductive material may be formed by an electro-chemical plating process, CVD, ALD, PVD, a combination thereof, or the like. Examples of conductive materials include copper, tungsten, aluminum, silver, gold, a combination thereof, or the like. Excess conductive material and barrier layer is removed from a surface of the interconnect structure 60 or the semiconductor substrate 52 by, for example, a chemical-mechanical polish (CMP). The remaining portions of the barrier layer and conductive material in the recesses form the conductive vias 66.

In this embodiment, the conductive vias 66 are formed by a via-middle process, such that the conductive vias 66 extend through a portion of the interconnect structure 60 (e.g., a subset of the dielectric layers 64) and extend into the semiconductor substrate 52. The conductive vias 66 formed by a via-middle process are connected to a middle metallization pattern 62 of the interconnect structure 60. In another embodiment, the conductive vias 66 are formed by a via-first process, such that the conductive vias 66 extend into the semiconductor substrate 52 but not the interconnect structure 60. The conductive vias 66 formed by a via-first process are connected to a lower metallization pattern 62 of the interconnect structure 60. In yet another embodiment, the conductive vias 66 are formed by a via-last process, such that the conductive vias 66 extend through an entirety of the interconnect structure 60 (e.g., each of the dielectric layers 64) and extend into the semiconductor substrate 52. The conductive vias 66 formed by a via-last process are connected to the upper metallization pattern 62 of the interconnect structure 60.

One or more passivation layer(s) 68 are disposed on the interconnect structure 60. The passivation layer(s) 68 may be formed of one or more suitable dielectric materials such as silicon oxynitride, silicon nitride, low-k dielectrics such as carbon doped oxides, extremely low-k dielectrics such as porous carbon doped silicon oxide, a polymer such as polyimide, solder resist, polybenzoxazole (PBO), a benzocyclobutene (BCB) based polymer, molding compound, the like, or a combination thereof. The passivation layer(s) 68 may be formed by chemical vapor deposition (CVD), spin coating, lamination, the like, or a combination thereof. In some embodiments, the passivation layer(s) 68 include a silicon oxynitride layer or a silicon nitride layer.

A dielectric layer 72 is disposed on the passivation layer(s) 68. The dielectric layer 72 may be formed of an oxide such as silicon oxide, phosphosilicate glass (PSG), borosilicate glass (BSG), boron-doped phosphosilicate glass (BPSG), a tetraethyl orthosilicate (TEOS) based oxide, or the like; a nitride such as silicon nitride or the like; a polymer such as PBO, polyimide, a BCB-based polymer, or the like; a combination thereof; or the like. The dielectric layer 72 may be formed, for example, by CVD, spin coating, lamination, or the like. In some embodiments, the dielectric layer 72 is formed of TEOS-based silicon oxide.

Die connectors 74 extend through the dielectric layer 72 and the passivation layer(s) 68. The die connectors 74 may include conductive pillars, pads, or the like, to which external connections can be made. In some embodiments, the die connectors 74 include bond pads at the front-side surface of the integrated circuit die 50, and include bond pad vias that connect the bond pads to the upper metallization pattern 62 of the interconnect structure 60. In such embodiments, the die connectors 74 (including the bond pads and the bond pad vias) may be formed by a damascene process, such as a single damascene process, a dual damascene process, or the like. The die connectors 74 can be formed of a conductive material, such as a metal, such as copper, aluminum, or the like, which can be formed by, for example, plating, or the like.

Optionally, solder regions (not separately illustrated) may be disposed on the die connectors 74 during formation of the integrated circuit die 50. The solder regions may be used to perform chip probe (CP) testing on the integrated circuit die 50. For example, the solder regions may be solder balls, solder bumps, or the like, which are used to attach a chip probe to the die connectors 74. Chip probe testing may be performed on the integrated circuit die 50 to ascertain whether the integrated circuit die 50 is a known good die (KGD). Thus, only integrated circuit dies 50, which are KGDs, undergo subsequent processing are packaged, and dies which fail the chip probe testing are not packaged. After testing, the solder regions may be removed in subsequent processing steps.

In some embodiments, the integrated circuit die 50 is a stacked device that includes multiple semiconductor substrates 52. For example, the integrated circuit die 50 may be a memory device that includes multiple memory dies such as a hybrid memory cube (HMC) device, a high bandwidth memory (HBM) device, or the like. In such embodiments, the integrated circuit die 50 includes multiple semiconductor substrates 52 interconnected by through-substrate vias (TSVs) such as through-silicon vias. Each of the semiconductor substrates 52 may (or may not) have a separate interconnect structure 60.

FIGS. 2, 3, and 11-23 are cross-sectional views of intermediate stages in the manufacturing of integrated circuit packages 100, in accordance with some embodiments. Specifically, integrated circuit packages 100 are formed by packaging multiple integrated circuit dies 50 in respective package regions 102P. The package regions 102P are separated by scribe line regions 102S. The package regions 102P will be singulated along the scribe line regions 102S in subsequent processing to form the integrated circuit packages 100. Processing of two package regions 102P is illustrated, but it should be appreciated that any number of package regions 102P can be simultaneously processed to form any number of integrated circuit packages 100. The integrated circuit packages 100 may be system-on-integrated-chips (SoIC) devices, although other types of packages may be formed.

Figure 2:
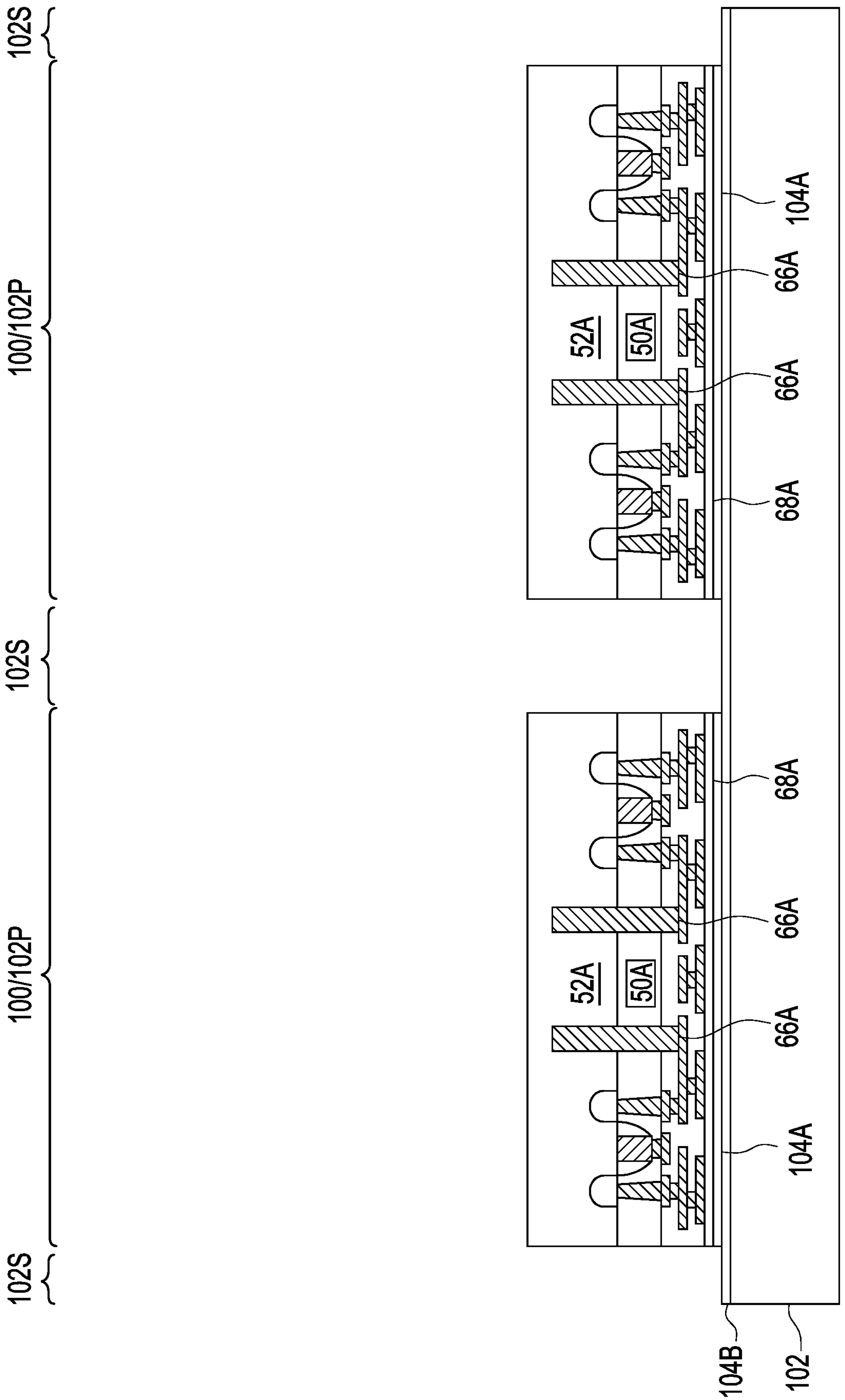
FIGS. 2-6, 7A, 8A, 9A, 11-23 are cross-sectional views of intermediate stages in the manufacturing of integrated circuit packages, in accordance with some embodiments.

In FIG. 2, a carrier substrate 102 is provided. The carrier substrate 102 may be a glass carrier substrate, a ceramic carrier substrate, or the like. The carrier substrate 102 may be a wafer, such that multiple packages can be formed on the carrier substrate 102 simultaneously.

First integrated circuit dies 50 (e.g., integrated circuit dies 50A) are attached to the carrier substrate 102 in a face-down manner, such that the front-sides of the integrated circuit dies 50 are attached to the carrier substrate 102. One integrated circuit die 50A is placed in each package region 102P. The integrated circuit dies 50A may be placed by, e.g., a pick-and-place process. The integrated circuit dies 50A may be logic devices, such as CPUs, GPUs, SoCs, microcontrollers, or the like.

The integrated circuit dies 50A may be attached to the carrier substrate 102 by bonding the integrated circuit dies 50A to the carrier substrate 102 with a bonding film 104. The bonding film 104 is on front-sides of the integrated circuit dies 50A and on a surface of the carrier substrate 102. In some embodiments, the bonding film 104 is a release layer, such as an epoxy-based thermal-release material, which loses its adhesive property when heated, such as a light-to-heat-conversion (LTHC) release coating; an ultra-violet (UV) glue, which loses its adhesive property when exposed to UV lights; or the like. In some embodiments, the bonding film 104 is an adhesive, such as a suitable epoxy, die attach film (DAF), or the like. In some embodiments, the bonding film 104 is an oxide layer such as a layer of silicon oxide. The bonding film 104 may include any desired quantity of release layers and/or adhesive films. In some embodiments, the bonding film 104 includes a first bonding film 104A applied to front-sides of the integrated circuit dies 50 and/or a second bonding film 104B applied over the surface of the carrier substrate 102. For example, the first bonding film 104A may be applied to the back-sides of the integrated circuit dies 50 before singulating to separate the integrated circuit dies 50.

At this stage of processing, the integrated circuit dies 50A may not yet include the dielectric layer 72 or the die connectors 74 (previously described for FIG. 1). As such, the upper passivation layers 68A of the respective integrated circuit dies 50A may be attached to the carrier substrate 102. In such embodiments, die connectors for the integrated circuit dies 50A will be subsequently formed after other integrated circuit dies are attached to the integrated circuit dies 50A.

Figure 3:
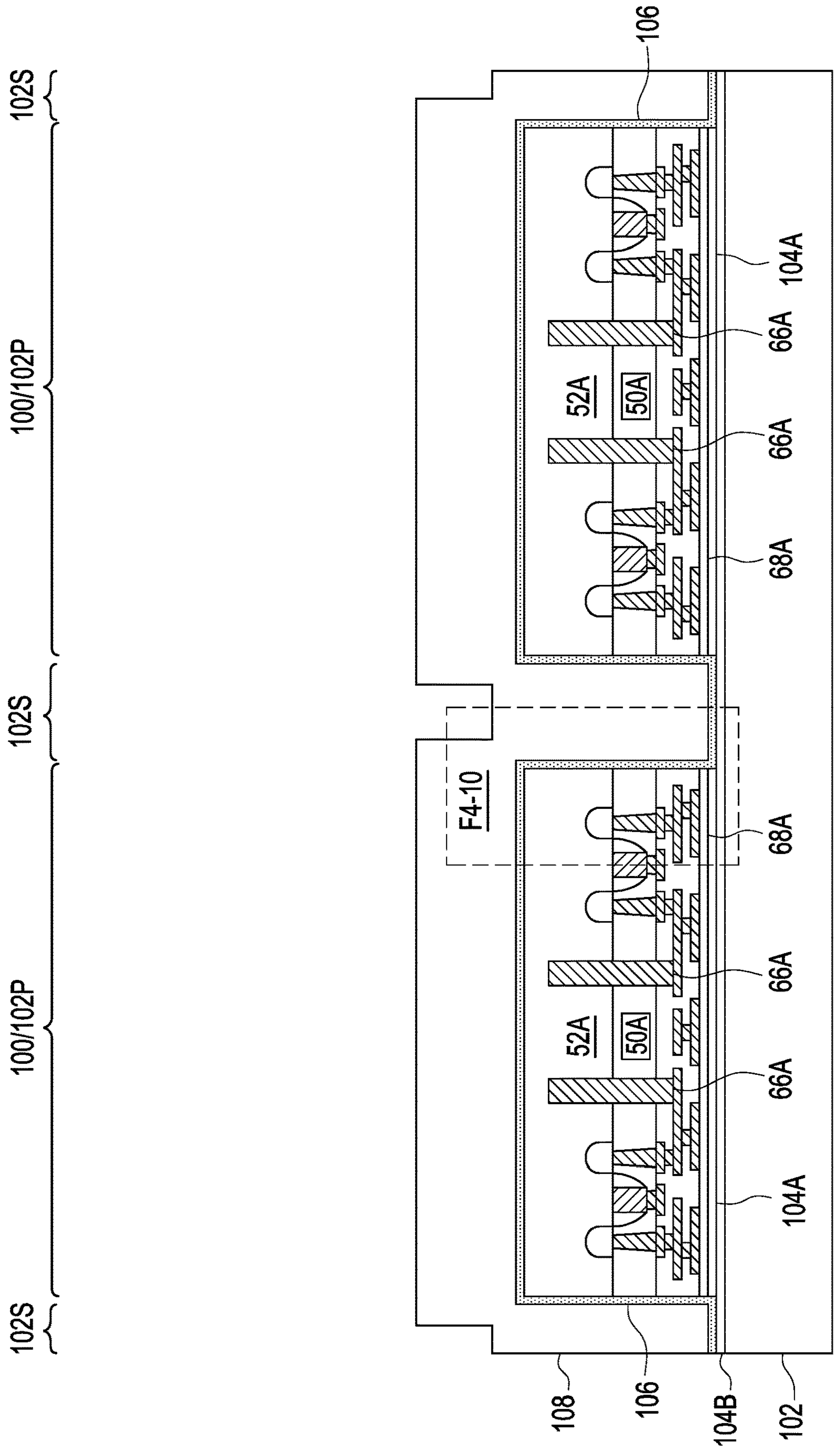

In FIG. 3, the semiconductor substrates 52A of the integrated circuit dies 50A are optionally thinned, which can help reduce the overall thickness of the integrated circuit packages 100. The thinning process may be, for example, a chemical-mechanical polish (CMP), a grinding process, an etch-back process, or the like, which is performed at the back-side of the integrated circuit dies 50A. The thinning process reduces the thickness of the semiconductor substrate 52A. The conductive vias 66A of the integrated circuit dies 50A may remain buried by the respective semiconductor substrates 52A after this step of thinning. Thinning the semiconductor substrates 52A at this step of processing can help reduce the costs of exposing the conductive vias 66A in subsequent processing steps.

Also in FIG. 3, a crack stopper structure 106 is formed over each of the integrated circuit dies 50A, along the sides of the integrated circuit dies 50A, and along upper surfaces of the bonding film 104B (if present) or carrier substrate 102

(if the bonding film 104B is not present). The formation of the crack stopper structure 106 will be described below with respect to FIGS. 4 through 10G.

After forming the crack stopper structure, a gap-filling dielectric 108 is formed on the crack stopper structure 106 between the integrated circuit dies 50A and over the integrated circuit dies 50A, burying them or encapsulating them laterally and vertically, such that the top surface of the gap-filling dielectric 108 is above the top surfaces of the integrated circuit dies 50A. The gap-filling dielectric 108 is disposed over the portions of the carrier substrate 102 between the integrated circuit dies 50A, and contacts the top surface of the crack stopper structure 106 between the integrated circuit dies 50A. The gap-filling dielectric 108 fills (and may overfill) the gaps between the integrated circuit dies 50A. The gap-filling dielectric 108 may be formed of a dielectric material, such as an oxide such as silicon oxide, phosphosilicate glass (PSG), borosilicate glass (BSG), boron-doped phosphosilicate glass (BPSG), a tetraethyl orthosilicate (TEOS) based oxide, or the like, which may be formed by a suitable deposition process such as chemical vapor deposition (CVD), atomic layer deposition (ALD), or the like.

A total thickness of the crack stopper structure 106 and gap-filling dielectric 108 depends on the thickness of the integrated circuit dies 50A. In some embodiments, the total thickness may be between about 20 μm and 30 μm. In some embodiments, the crack stopper structure 106 may be between about 0.4 μm and about 15 μm, depending on the variations of the crack stopper structure 106, such as described below.

Portions of the crack stopper structure 106 and the gap-filling dielectric 108 are disposed in the scribe line regions 102S. The crack stopper structure 106 will provide protection against cracks which may result from the singulation of the packages 100 through the scribe line regions 102S.

FIGS. 4, 5, 6, 7A, 7B, 8A, 8B, 8C, 9A, and 9B include close-up views of variations within the formation of the crack stopper structure 106. FIGS. 4 through 9B are close-up views of the dashed box of FIG. 3 labeled F4-10, in accordance with some embodiments. For each of the FIGS. 4 through 9B, details of the integrated circuit die 50/50A and carrier substrate 102 with bonding film 104B (if used) have been omitted for clarity. Each of FIGS. 4 through 9B illustrate the formation of the crack stopper structure 106 and the gap-filling dielectric 108. FIGS. 10A, 10B, 10C, 10D, 10E, 10F, and 10G provide flow diagrams for the various configurations illustrated in FIGS. 4 through 9B. The formation of the crack stopper structure 106 is described within each specific configuration. The formation of the gap-filling dielectric 108 is described above with respect to FIG. 3.

Figure 10A:
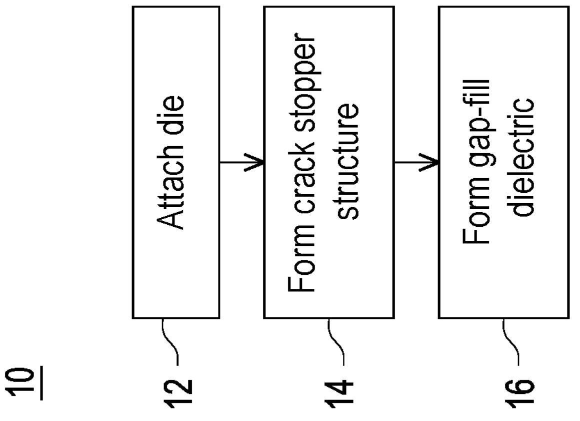
FIGS. 10A, 10B, 10C, 10D, 10E, 10F, and 10G are flow diagrams of a process of forming a crack stopper structure, in accordance with various embodiments.

Turning briefly to FIG. 10A, a process 10 includes attaching a die to a carrier at step 12, such as described above with respect to the integrated circuit dies 50A of FIG. 2. Next, a crack stopper structure (e.g., the crack stopper structure 106) is formed over the die and over the carrier at step 14. Then, a gap-fill dielectric (e.g., the gap-fill dielectric 108) is formed over the crack stopper structure. FIGS. 10B, 10C, 10D, 10E, 10F, and 10G provide details for the step 14 of forming the crack stopper structure, which will be described in greater detail below. Like elements are labeled with the like reference identifiers.

Figure 4:
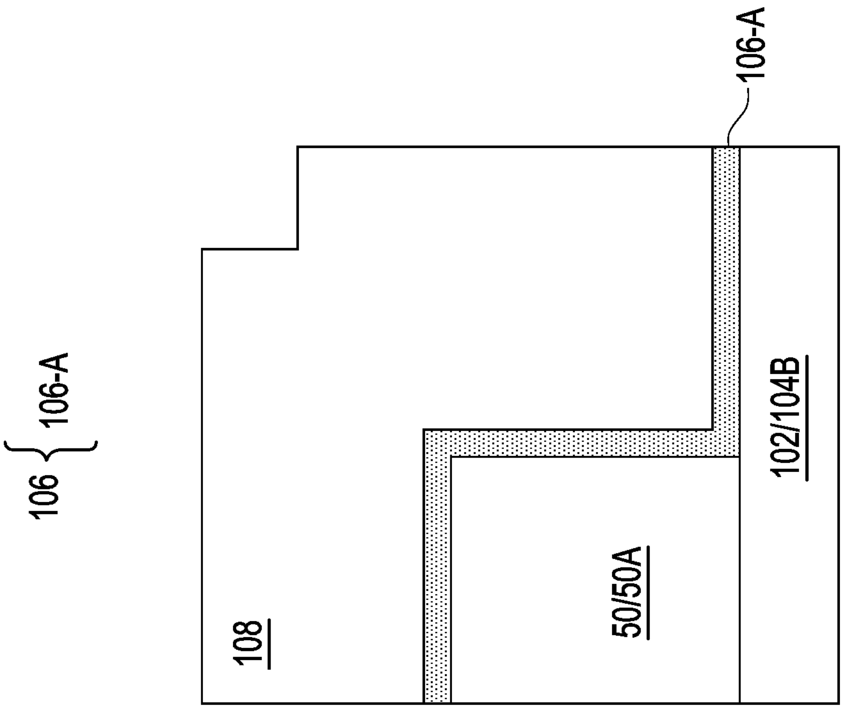
Figure 10B:
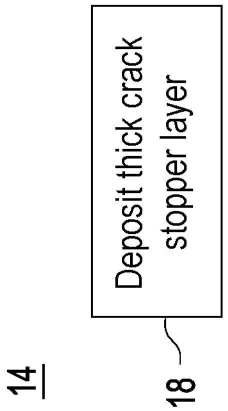

In FIGS. 4 and 10B, the crack stopper structure 106 is a single layer crack stopper including a first crack stopper layer 106 A, in accordance with some embodiments. The first crack stopper layer 106-A is formed on the carrier substrate 102 and along sidewalls and an upper surface of the integrated circuit dies 50A (or generically, any similar integrated circuit die 50). The material of the first crack stopper layer 106-A has a mechanical strength (e.g., yield strength or hardness) higher than that of the gap-filling dielectric 108. For example, silicon nitride has a higher yield strength than silicon oxide, the ratio of the yield strength of silicon nitride to silicon oxide being about 1.5:1. A first crack stopper layer 106-A with a material yield strength between about 1.2 and 3 times that of the gap-filling dielectric 108 may be used. A similar relationship holds for hardness. In some embodiments, the first crack stopper layer 106 A may be formed of silicon nitride, silicon carbonitride, silicon oxynitride, silicon oxycarbonitride, silicon carbide, or the like, which may, at step 18 of FIG. 10B, be formed by a suitable deposition process such as chemical vapor deposition (CVD), atomic layer deposition (ALD), plasma enhanced CVD (PECVD), plasma enhanced ALD (PEALD), or the like. When utilizing a single crack stopper layer 106-A, such as illustrated in FIGS. 4 and 10B, in some embodiments, the first crack stopper layer 106 A may be deposited to have a thickness between about 3000 and 5000 angstroms, such as about 4000 angstroms, providing more substantial support than a liner layer. In some embodiments, the first crack stopper layer 106-A may be deposited to have a thickness between about 1800 and 3000 angstroms, such as about 2000 angstroms.

Figure 5:
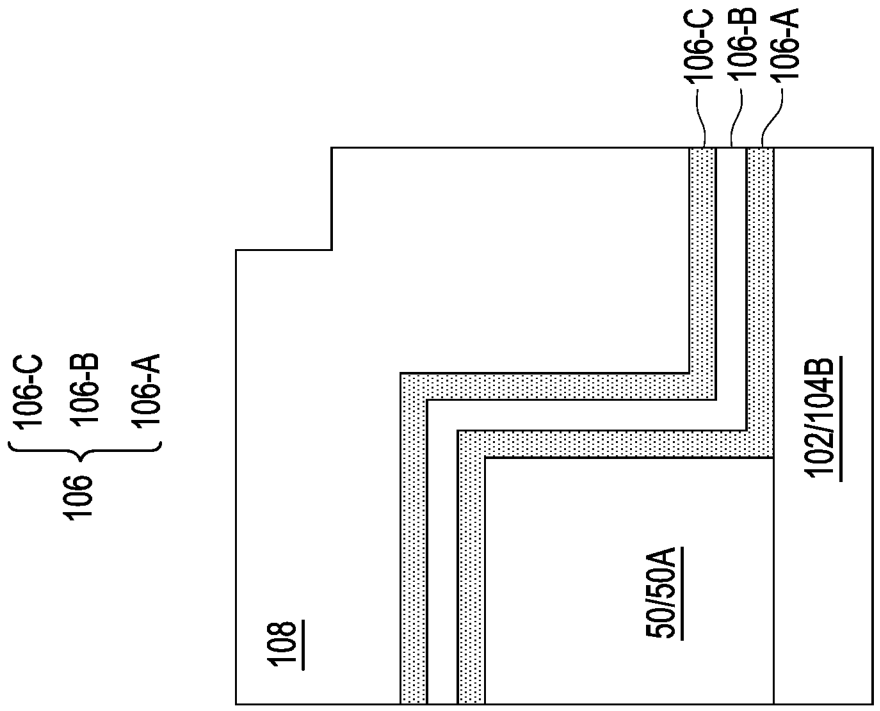
Figure 6:
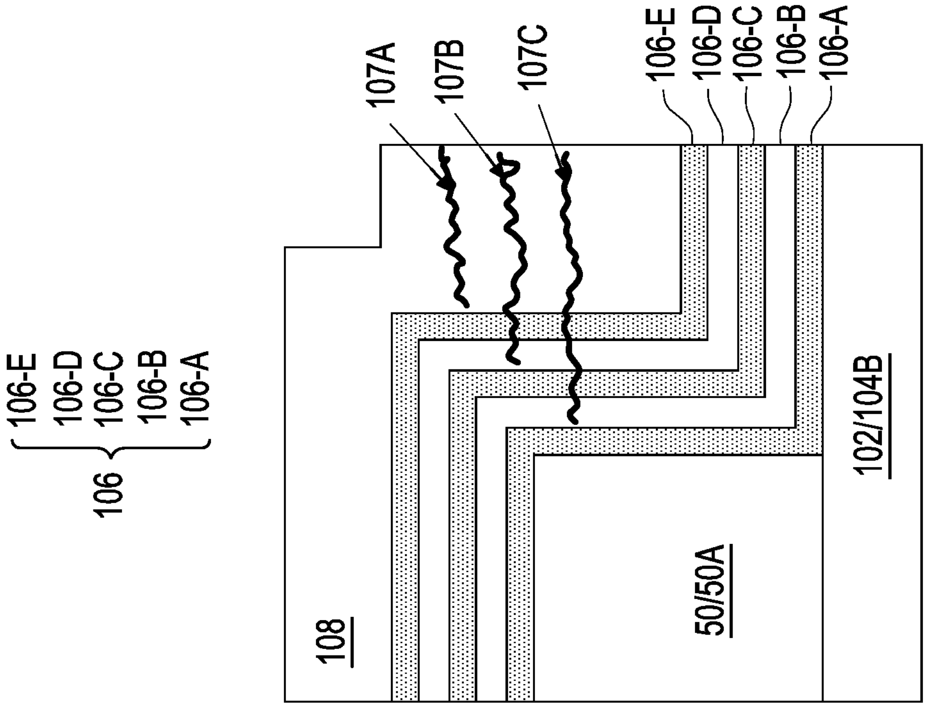

In FIGS. 5, 6, 10C, and 10D, the crack stopper structure 106 is a multi-layered structure, having a sandwich structure with two or more crack stopper layers and a dielectric film interposed between each consecutive sets of crack stopper layers, in accordance with some embodiments. A two-layer crack stopper structure 106 is illustrated in FIG. 5 and a three-layer crack stopper structure 106 is illustrated in FIG. 6, however, it should be appreciated that the same processes in corresponding FIGS. 10C and 10D may be used to make a four-layer crack stopper structure, a five-layer crack stopper structure, etc.

Figure 10C:
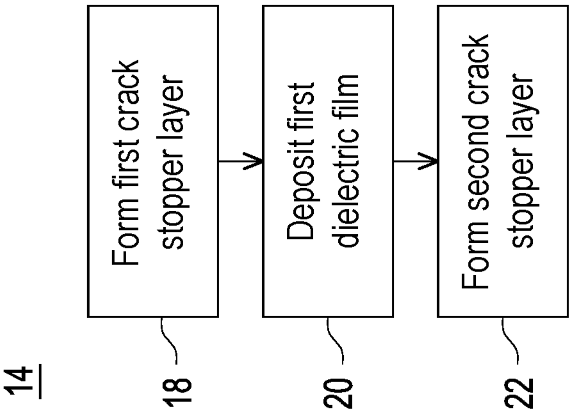

In FIGS. 5 and 10C, the crack stopper structure 106 includes a first crack stopper layer 106-A and a second crack stopper layer 106-C separated from each other by an interposed first dielectric film 106-B, in accordance with some embodiments. The first crack stopper layer 106-A may be formed at step 18 using materials and processes similar to those used to form the first crack stopper layer 106-A described above with respect to FIGS. 4 and 10B. Following the formation of the first crack stopper layer 106-A at step 18 of FIG. 10C, the first dielectric film 106-B is deposited at step 20. The first dielectric film 106-B may be deposited using processes and materials similar to those used to deposit the gap-filling dielectric 108 described with respect to FIG. 3. Indeed, in some embodiments, the material of the first dielectric film 106-B may be the same material subsequently used to form the gap-filling dielectric 108, however, in other embodiments, the material of the first dielectric film 106-B may be a different material than that used for forming the gap-filling dielectric 108. Following the formation of the first dielectric film 106-B, the second crack stopper layer 106-C is deposited at step 22 on the first dielectric film 106-B. The second crack stopper layer 106-C may be deposited using materials and processes similar to those used to form the first crack stopper layer 106-A. The first crack stopper layer 106-A and second crack stopper layer 106-C may be formed of the same materials or different materials. As illustrated in FIG. 5, following formation of the second crack stopper layer 106-C, the gap-filling dielectric 108 is formed.

Figure 10D:
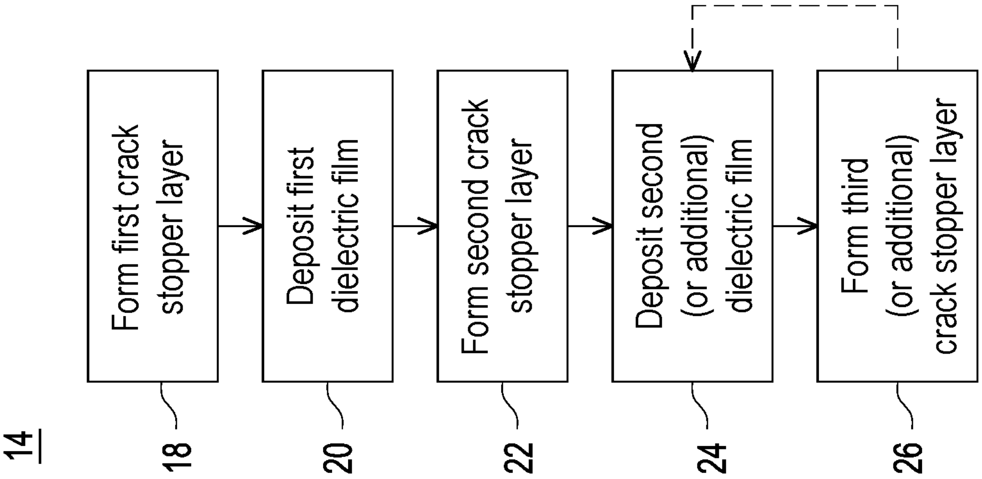

In FIGS. 6 and 10D, the crack stopper structure 106 includes a first crack stopper layer 106-A and a second crack stopper layer 106-C separated from each other by an interposed first dielectric film 106-B, and a third crack stopper layer 106-E separated from the second crack stopper layer 106-C by an interposed second dielectric film 106-D, in accordance with some embodiments. Referring back to FIG. 5, FIG. 6 illustrates that, prior to depositing the gap-filling dielectric 108 at step 16, a second dielectric film 106-D is deposited at step 24 on the second crack stopper layer 106-C. The second dielectric film 106-D may be formed using processes and materials similar to those used to form the first dielectric film 106-B. The material of the second dielectric film 106-D may be the same material used to form the first dielectric film 106-B or may be a different material. Similarly, the material of the second dielectric film 106-D may be the same material subsequently used to form the gap-filling dielectric 108 or may be a different material. Additional sandwiched dielectric films (if used) may also be made of the same or different materials as the other sandwiched dielectric films. The crack stopper structure 106 functions to stop or reduce the number or severity of cracks, for example, by reducing their propagation, as indicated by the cracks 107A, 107B, and 107C, which are discussed with respect to the singulation process below.

Following the formation of the second dielectric film 106-D at step 24, the third crack stopper layer 106-E is deposited at step 26 on the second dielectric film 106-D. The third crack stopper layer 106-E may be deposited using materials and processes similar to those used to form the first crack stopper layer 106-A and/or the second crack stopper layer 106-C. In some embodiments, the first crack stopper layer 106-A, second crack stopper layer 106-C, and third crack stopper layer 106-E are each be formed of the same materials, however, in other embodiments one or more of the first crack stopper layer 106-A, second crack stopper layer 106-C, and third crack stopper layer 106-E are formed of different materials.

As illustrated in FIGS. 6, 10A, and 10D, following formation of the third crack stopper layer 106-E, the gap-filling dielectric 108 is formed at step 16. It should be appreciated, however, that the process of depositing dielectric films (e.g., such as the first dielectric film 106-B or second dielectric film 106-D) and crack stopper layers (e.g., such as the second crack stopper layer 106-C or third crack stopper layer 106-E) may be repeated as many times as desired (as indicated by the dashed arrow) to achieve a certain number of sandwich layers of the crack stopper structure 106.

In FIGS. 5 and 6 each of the crack stopper layers (e.g., 106-A, 106-C, and 106-E) may be deposited to have a thickness between about 500 and 5000 angstroms, such as between about 1000 and 4000 angstroms. The first crack stopper layer 106-A may be deposited so that it has a greater minimum thickness so that the thickness is between about 1000 and about 5000 angstroms. In some embodiments, each of the crack stopper layers may have about the same thickness. For example, the first crack stopper layer 106-A, the second crack stopper layer 106-C, the third crack stopper layer 106-E (if used), and/or each additional layer (if used) may each have the same thickness between about 500 and about 2500 angstroms. In some embodiments, the first crack stopper layer 106-A may be 2 to 3 times thicker than one or more of the other crack stopper layers. For example, the first crack stopper layer 106-A may be 1.5 to 3 times thicker than the second crack stopper layer 106-C and/or the third crack stopper layer 106-E (if used) and/or each additional layer (if used). For example, for FIG. 6, the first crack stopper layer 106-A may be about 1500 to about 5000 angstroms and the second crack stopper layer 106-C and/or the third crack stopper layer 106-E may each be about 500 to about 2500 angstroms.

In FIGS. 5, 6, 10C and 10D each of the first dielectric film 106-B and second dielectric film 106-D (if used), and each additional sandwiched dielectric film (if used) may be deposited to have a thickness between about 1 μm to about 5 μm. Each of the sandwiched dielectric films may be deposited to have the same thicknesses or one or more of the sandwiched dielectric films may have different thicknesses.

Figure 7B:
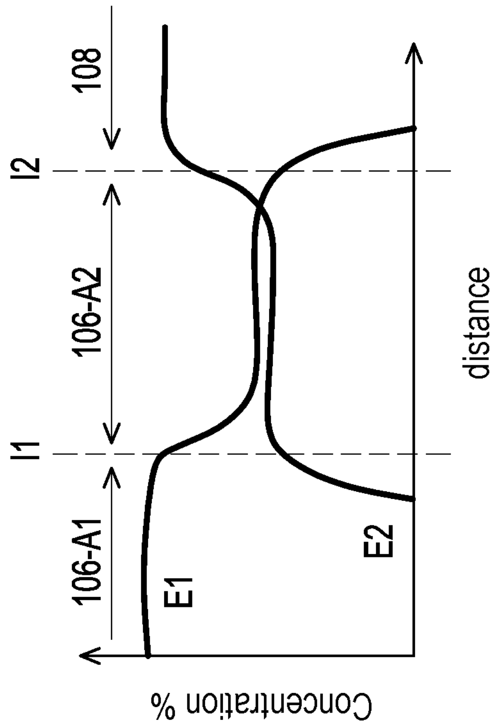
FIGS. 7B, 8B, 8C, and 9B are gradient charts of elements according to various configurations of integrated circuit packages, in accordance with some embodiments.
Figure 7A:
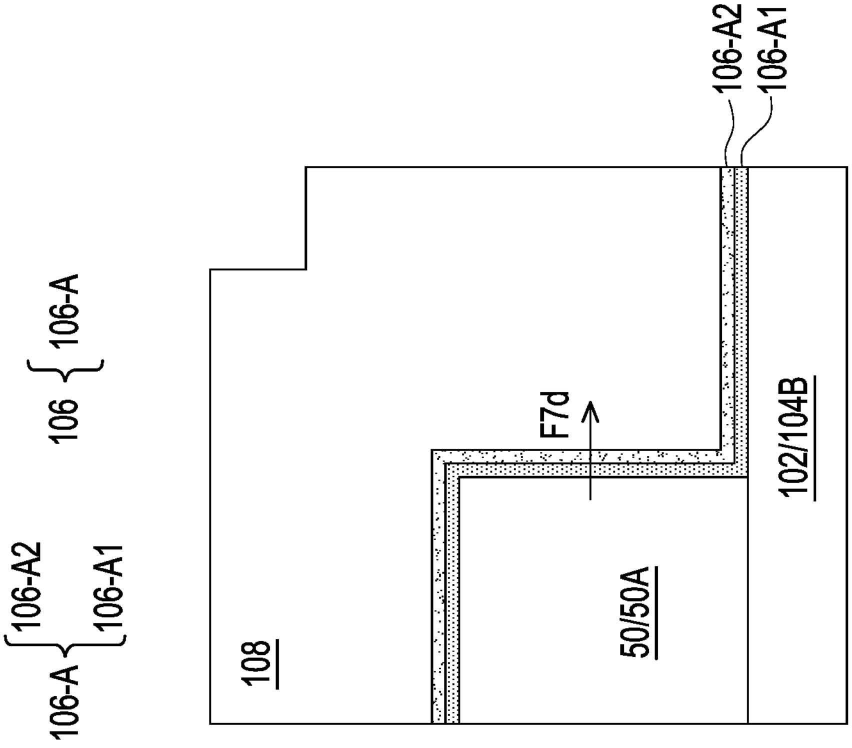
Figure 10E:
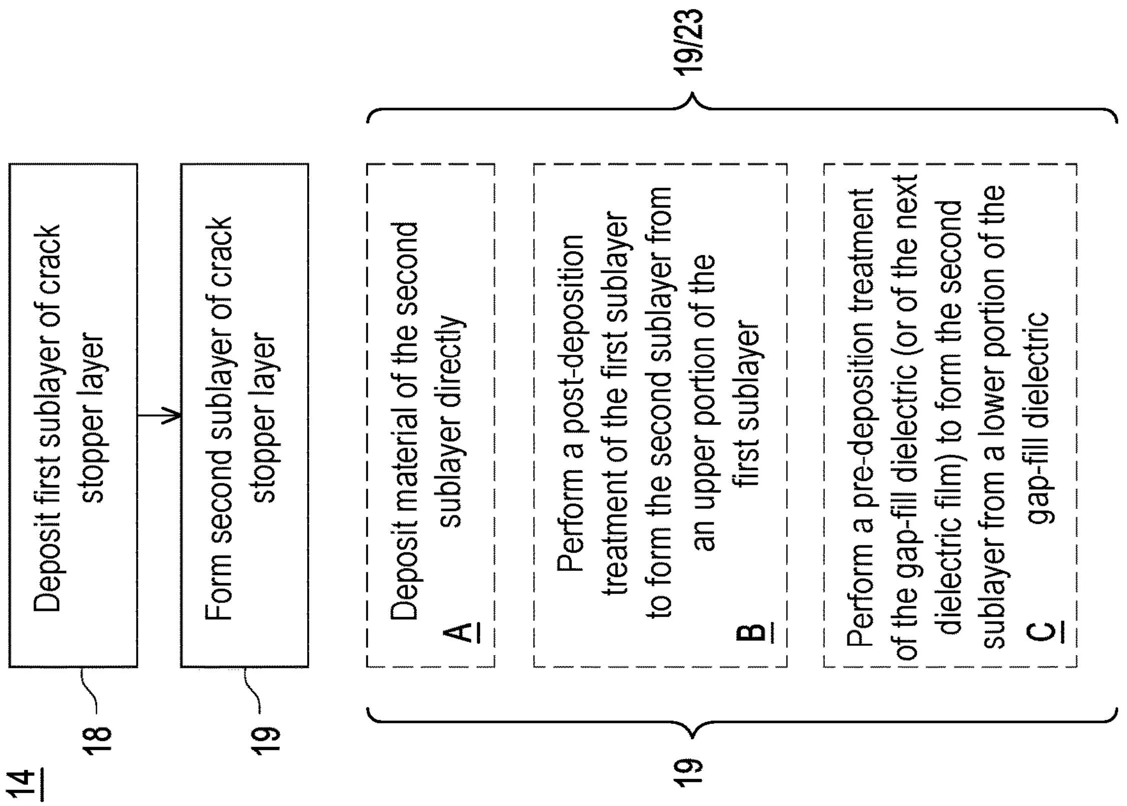

FIGS. 7A and 10E illustrates the formation of a crack stopper structure 106 that includes a first crack stopper layer 106-A that includes a first sublayer 106-A1 and a second sublayer 106-A2. FIG. 7A is therefore similar to FIG. 4, except that the first crack stopper layer includes the first sublayer 106-A1 and the second sublayer 106-A2. The first sublayer 106-A1 may be formed, in step 18, using processes and materials similar to those used to form the first crack stopper layer 106-A, discussed above with respect to FIG. 4. The second sublayer 106-A2 may be formed, in step 19, as a buffer layer between the first sublayer 106-A1 and the gap-fill dielectric 108 (which is formed in step 16 of FIG. 10E). The function of the second sublayer 106-A2 as a buffer layer provides a yield strength which is between the yield strength of the first sublayer 106-A1 and the gap-fill dielectric 108, providing a gentler transition from the hardness of the first sublayer 106-A1 to the softer hardness of the gap-fill dielectric 108.

The second sublayer 106-A2 also serves as an adhesion layer to provide better adhesion between the first crack stopper layer 106-A and the gap-fill dielectric 108 than a hard transition from, for example, silicon nitride to silicon oxide. As an adhesion layer, the second sublayer 106-A2 may include an overlap of elements in the first sublayer 106-A1 and elements in the gap-fill dielectric 108. For example, if the gap-fill dielectric 108 is silicon oxide and the first sublayer 106-A1 is silicon nitride, then the second sublayer 106-A2 may include an overlap of elements in the first sublayer 106-A1 and elements in the gap-fill dielectric 108, which could include silicon, nitrogen, and oxygen. In this example, the second sublayer 106-A2 could be silicon oxynitride, silicon oxycarbonitride, and so forth, so that the second sublayer 106-A2 contains at least silicon, nitrogen, and oxygen. Other elements may be present, such as carbon, hydrogen, chlorine, and so forth. In another example, if the gap-fill dielectric 108 is silicon oxide and the first sublayer 106-A1 is silicon carbide, then the second sublayer 106-A2 may include an overlap of elements in the first sublayer 106-A1 and elements in the gap-fill dielectric 108, which could include silicon, carbon, and oxygen. In this example, the second sublayer 106-A2 could be silicon oxycarbide, silicon oxycarbonitride, and so forth, so that the second sublayer 106-A2 contains at least silicon, argon, and oxygen. Other elements may be present, such as nitrogen, hydrogen, chlorine, and so forth. Accordingly, the second sublayer 106-A2 serves to provide adhesion and to buffer the transition from the material (e.g., silicon nitride) of the first sublayer 106-A1 to the material (e.g., silicon oxide) of the gap-fill dielectric 108.

In some embodiments, at option 19A, the second sublayer 106-A2 may be formed by direct deposition of the material of the second sublayer, such as by PEALD, ALD, PECVD. In other embodiments, at option 19B, the second sublayer 106-A2 may be formed by providing a treatment process to the first sublayer 106-A1. For example, the treatment process may be an oxygen plasma process which converts an upper portion of the first sublayer 106-A1 into the second sublayer 106-A2 by using the oxygen plasma to embed oxygen radicals and oxygen ions in the first sublayer 106-A1. The high energy state of the oxygen radicals disrupt the bonds of the material of the first sublayer 106-A1 and cause at least some of the first sublayer 106-A1 to convert into the second sublayer 106-A2.

In yet other embodiments, at option 19C, the second sublayer 106-A2 may be formed by providing a pre-deposition treatment process when forming the gap-fill dielectric 108. For example, during the initial stages of depositing the gap-fill dielectric 108, an oxygen rich gas ratio may be used to cause an upper portion of the first sublayer 106-A1 to oxidize to form a thin layer of SiON. Then, the gas ratio may be altered to reduce the available oxygen to form the remaining gap-fill dielectric 108.

The thickness of the first sublayer 106-A1 may be between about 1000 and 4000 angstroms, such as about 2000 angstroms. The thickness of the second sublayer 106-A2 may be between about 50 and 1000 angstroms. As such, in embodiments using a two-layered first crack stopper layer 106-A, the total thickness of the first crack stopper layer 106-A may be between about 1000 and 5000 angstroms.

FIG. 7B illustrates a graph that provides a representation of the concentration content of a first element E1 (e.g., nitrogen and/or carbon) and a second element E2 (e.g., oxygen) in the various layers of the first crack stopper layer 106-A and the gap-fill dielectric 108. The y-axis indicates concentration percentage and the x-axis indicates distance (for example into the thickness of the layers in the direction indicated by the arrow F7*d*). It should be understood, that the lines are examples only and serve as representations of the relationships between the layers discussed below. In particular, the distance between the first interface I1 and the second interface 12 can be stretched or squeezed according to the thickness of the second sublayer 106-A2. In addition to the adhesion and buffer characteristics of the second sublayer 106-A2, the graph of FIG. 7B illustrates that second sublayer 106-A2 also serves as a gradient layer. The first element E1 and the second element E2 may be paired with a same base element to form a dielectric material. For example, if the first element E1 is nitrogen and the second element E2 is oxygen, then they may both be paired with silicon to form silicon nitride and silicon oxide, respectively. The first sublayer 106-A1 has a high concentration of the first element E1 and a significant concentration of the second element E2 only near the interface I1 between the first sublayer 106-A1 and the second sublayer 106-A2. The gap-fill dielectric 108 has a high concentration of the second element E2 and a significant concentration of the first element E1 only near the interface 12 between the second sublayer 106-A2 and the gap-fill dielectric 108. The second sublayer 106-A2 has a significant concentration of both the first element E1 and the second element E2, but less percentage concentration of each than the first sublayer 106-A1 and the gap-fill dielectric 108, respectively. At each of the interfaces between the layers, a gradient is formed which transitions the concentrations of the first element E1 and the second element E2 from one layer to the next. For example, at the interface I1 the element E1 has a negative gradient into the second sublayer 106-A2, due to the supplementation of the element E1 into the second sublayer 106-A2 by diffusion. The percentage concentration may then level-off for part of the thickness of the second sublayer 106-A2. Also, at the interface I1, the element E2 has a positive gradient into the second sublayer 106-A2, due to the supplementation of the element E2 into the first sublayer 106-A1 by diffusion from the second sublayer 106-A2. At the interface 12, the element E1 has a negative gradient into the gap-fill dielectric 108, due to the supplementation of the element E1 into the gap-fill dielectric 108 from the second sublayer 106-A2 by diffusion. Also, at the interface 12, the element E2 has a positive gradient into the gap-fill dielectric 108, due to the supplementation of the element E2 into the second sublayer 106-A2 by diffusion from the gap-fill dielectric 108.

Figure 8B:
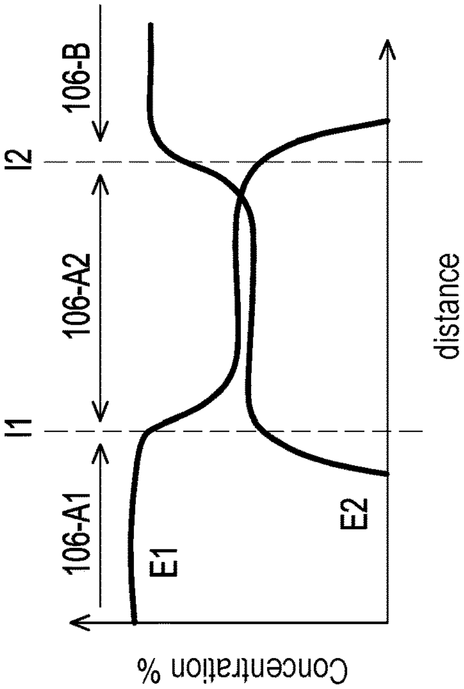
Figure 8C:
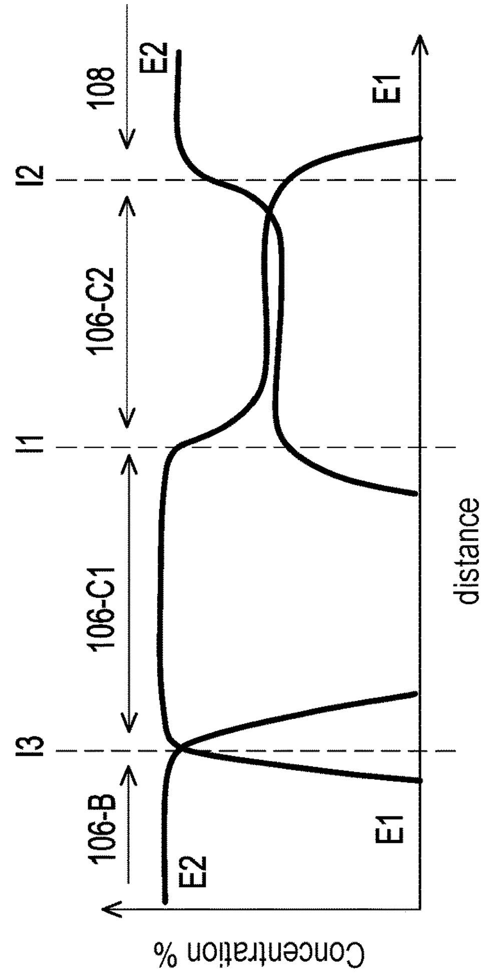
Figure 8A:
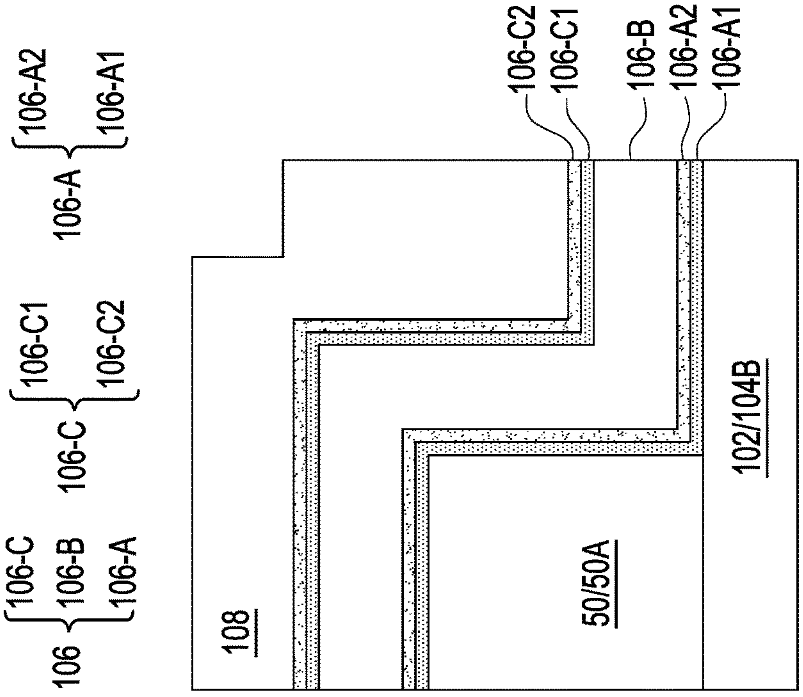

FIGS. 8A, 8B, 8C, and 10F illustrates the formation of a crack stopper structure 106 that includes a first crack stopper layer 106-A that includes a first sublayer 106-A1 and a second sublayer 106-A2, a sandwiched dielectric film 106-B, and a second crack stopper layer 106-C that includes a first sublayer 106-C1 and a second sublayer 106-C2. As such, in FIG. 8A, the crack stopper structure 106 is a multi-layered structure, having a sandwich structure with two or more crack stopper layers and a dielectric film interposed between each consecutive sets of crack stopper layers, in accordance with some embodiments. The two-layer crack stopper structure 106 illustrated in FIG. 8A is similar to that illustrated in FIG. 5, except that each of the first crack stopper layer 106-A and second crack stopper layer 106-C includes a first sublayer and second sublayer, as described in further detail below. Although FIG. 8A illustrates a two-layer crack stopper structure 106, it should be appreciated that the same processes may be used to make a three-layer crack stopper structure (such as illustrated in FIG. 6), four-layer crack stopper structure, a five-layer crack stopper structure, etc.

In FIG. 8A, the crack stopper structure 106 includes a first crack stopper layer 106-A and a second crack stopper layer 106-C separated from each other by an interposed first dielectric film 106-B, in accordance with some embodiments. The first crack stopper layer 106-A may include a first sublayer 106-A1 and a second sublayer 106-A2, which may be formed, at steps 18 and 19 of FIG. 10F, using materials and processes similar to those used to form respective sublayers of the first crack stopper layer 106-A described above with respect to FIG. 7A. Following the formation of the first crack stopper layer 106-A, the first dielectric film 106-B is deposited at step 20. The first dielectric film 106-B may be deposited using processes and materials similar to those used to deposit the gap-filling dielectric 108 described with respect to FIG. 3. Indeed, in some embodiments, the material of the first dielectric film 106-B may be the same material subsequently used to form the gap-filling dielectric 108, however, in other embodiments, the material of the first dielectric film 106-B may be a different material than that used for forming the gap-filling dielectric 108. Following the formation of the first dielectric film 106-B, the second crack stopper layer 106-C is formed, at steps 22 and 23 of FIG. 10F, on the first dielectric film 106-B. The second crack stopper layer 106-C may include a first sublayer 106-C1 formed at step 22 and second sublayer 106-C2 formed at step 23, each of which may be deposited using materials and processes similar to those used to form the first sublayer 106-A1 and second sublayer 106-A2, respectively, of the first crack stopper layer 106-A. The first crack stopper layer 106-A and second crack stopper layer 106-C may be formed of the same materials or different materials.

FIGS. 8B and 8C illustrate graphs that provides a representation of the concentration content of a first element E1 (e.g., nitrogen) and a second element E2 (e.g., oxygen) in the various layers of the first crack stopper layer 106-A, the first dielectric film 106-B, the second crack stopper layer 106-C, and the gap-fill dielectric 108. The graphs of FIGS. 8B and 8C also illustrate that second sublayer 106-A2 and 106-C2 serve as gradient layers. In FIGS. 8B and 8C are similar in structure to that described above with respect to FIG. 7B, and like references refer to like elements used above with respect to FIG. 7B. In particular, FIG. 8B is like unto FIG. 7B, except that the first dielectric film 106-B is substituted for the gap-fill dielectric 108 used in FIG. 7B. FIG. 8B also applies to the structures illustrated in FIG. 9A.

In FIG. 8C, the interactions of the first element E1 and the second element E2 around the first interface I1 and the second interface 12 are similar to those described above with respect to FIG. 7B. A third interface 13 is illustrated between the first dielectric film 106-B and the first sublayer 106-C1. As seen in FIG. 8C, the dielectric film 106-B has a high concentration of the second element E2 and the first sublayer 106-C1 has a high concentration of the first element E1. Diffusion of the first element E1 into the first sublayer 106-C1 causes a steep negative gradient of the first element E1 at the third interface 13. Similarly, diffusion of the second element E2 into the first dielectric film 106-B causes a steep positive gradient of the second element E2 at the third interface 13.

Figure 10F:
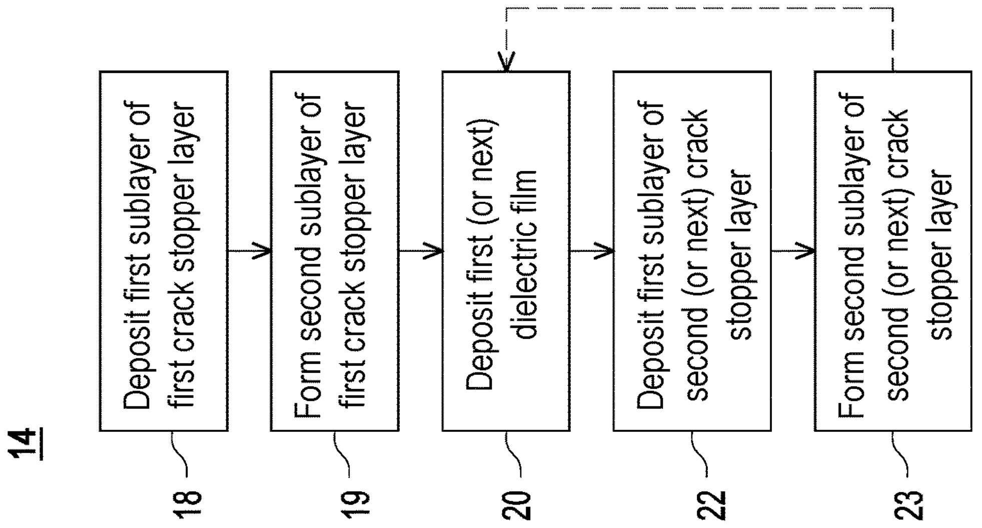

In some embodiments, at option 19A/23A of FIG. 10F (which refers to option 19A of FIG. 10E), the second sublayer 106-A2 and/or second sublayer 106-C2 may be formed by direct deposition of the material of the second sublayer, such as by PEALD, ALD, PECVD. In other embodiments, at option 19B/23B of FIG. 10F, the second sublayer 106-A2 and/or second sublayer 106-C2 may be formed by providing a treatment process to the first sublayer 106-A1, such as by an oxygen plasma process which converts an upper portion of the first sublayer 106-A1/106-C1 into the second sublayer 106-A2/106-C2 by using the oxygen plasma to embed oxygen radicals and oxygen ions in the first sublayer 106-A1/106-C1. In yet other embodiments, at option 19C/23C of FIG. 10F, the second sublayer 106-A2/106-C2 may be formed by a providing a pre-deposition treatment process to the first dielectric film 106-B and/or gap-fill dielectric 108, respectively, for example, by providing an oxygen rich gas ratio during the initial stages of depositing the first dielectric film 106-B and/or gap-fill dielectric 108.

In embodiments with a sandwiched first dielectric layer, for the first crack stopper layer 106-A, the thickness of the first sublayer 106-A1 may be between about 1000 and 4000 angstroms, such as about 2000 angstroms. The thickness of the second sublayer 106-A2 may be between about 50 and 1000 angstroms. As such, in embodiments using a two-layered first crack stopper layer 106-A, the total thickness of the first crack stopper layer 106-A may be between about 1000 and 5000 angstroms. In some embodiments, the second crack stopper layer 106-C may be formed with the same thicknesses as the first crack stopper layer 106-A. In other embodiments, the thickness of the first sublayer 106-A1 may be between 1.5 and 3 times thicker than the thickness of the first sublayer 106-C1, similar to that explained above with respect to FIGS. 5 and 6. In such embodiments, for example, the first sublayer 106-C1 may be between about 500 and 2500 angstroms. The second sublayer 106-C2 may be the same thickness as or a different thickness from the second sublayer 106-A2, each being between about 50 and 1000 angstroms. In some embodiments, the total thickness of the first crack stopper layer 106-A may be between 1 and 3 times the total thickness of the second crack stopper layer 106-C.

As indicated in FIG. 10F, after forming the second sublayer 106-C2, the steps of depositing a dielectric film (similar to the dielectric film 106-B) and depositing a crack stopper layer 106-C may be repeated as many times as desired to form a structure having three, four, five, etc. crack stopper layers in the crack stopper structure 106.

Figure 9A:
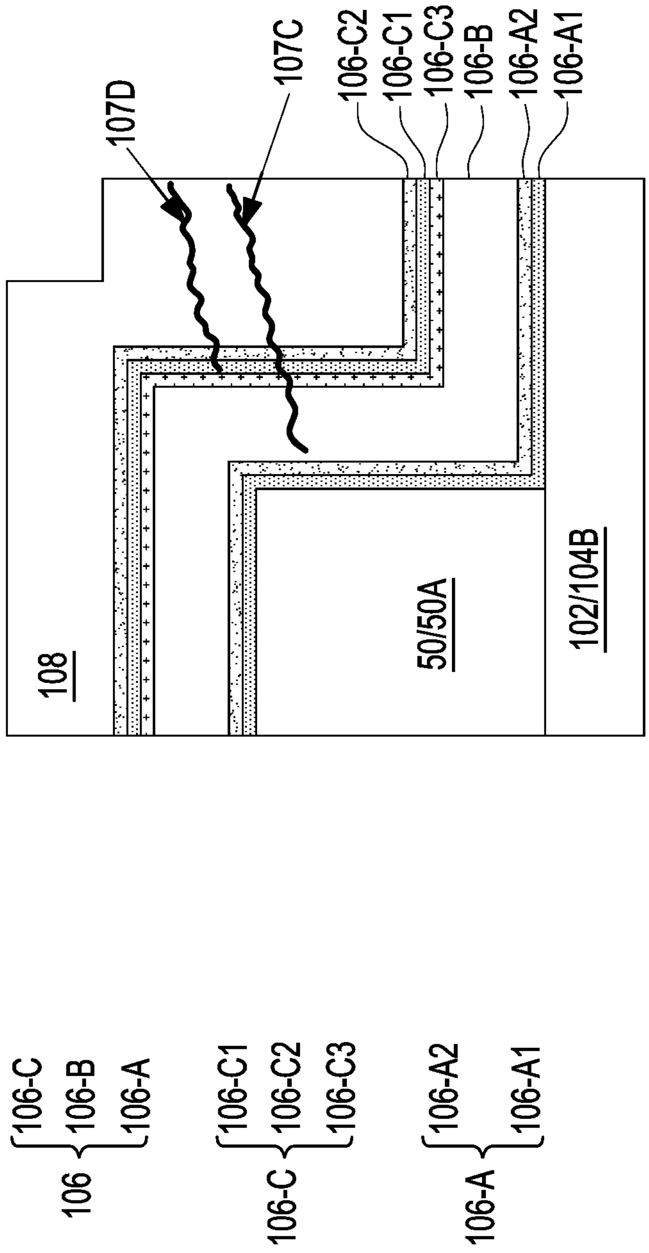
Figure 9B:
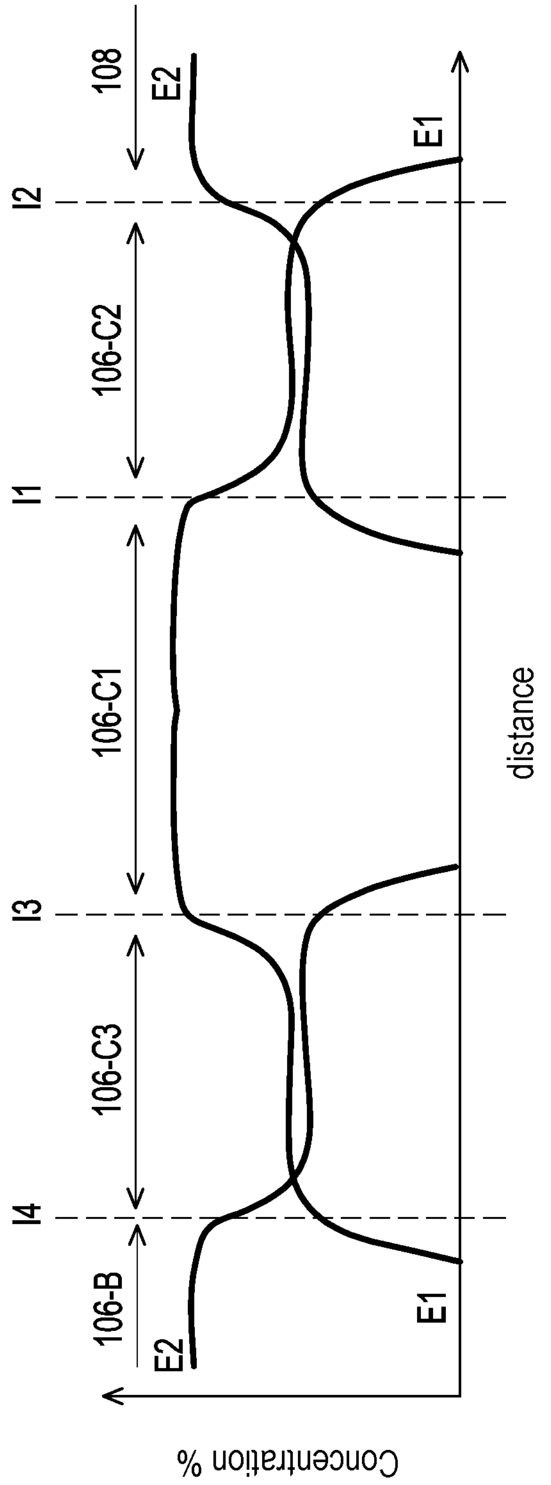
Figure 10G:
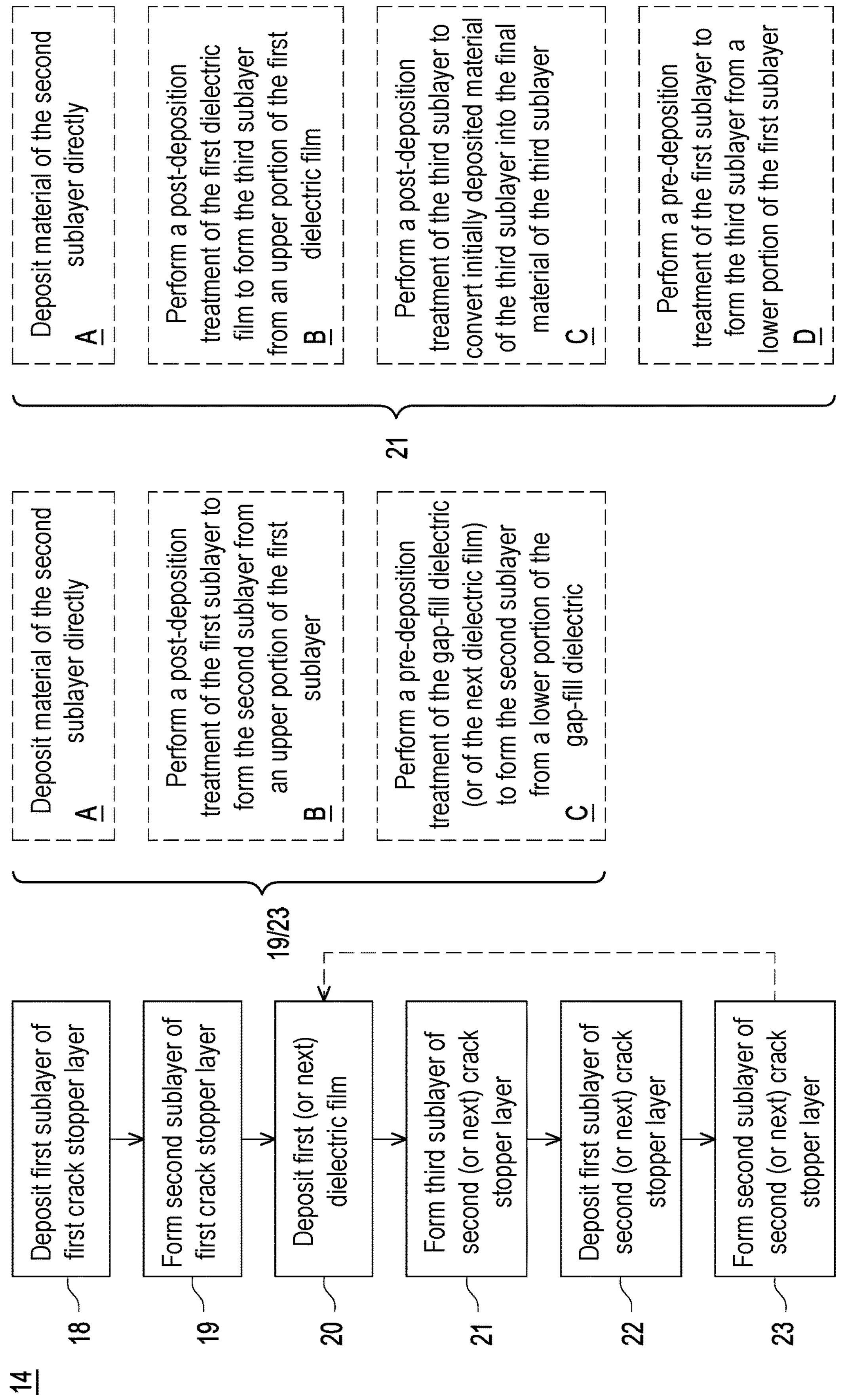

FIGS. 9A, 9B, and 10G illustrates the formation of a crack stopper structure 106 that includes a first crack stopper layer 106-A that includes a first sublayer 106-A1 and a second sublayer 106-A2, a sandwiched dielectric film 106-B, and a second crack stopper layer 106-C that includes a first sublayer 106-C1, a second sublayer 106-C2, and a third sublayer 106-C3. As such, in FIG. 9A, the crack stopper structure 106 is a multi-layered structure, similar to that illustrated and described above with respect to FIG. 8A, having a sandwich structure with two or more crack stopper layers and a dielectric film interposed between each consecutive sets of crack stopper layers, in accordance with some embodiments. In FIG. 9A, the crack stopper structure 106 includes a first crack stopper layer 106-A and a second crack stopper layer 106-C separated from each other by an interposed first dielectric film 106-B, in accordance with some embodiments. Although FIG. 9A illustrates a two-layer crack stopper structure 106, it should be appreciated that the same processes may be used to make a three-layer crack stopper structure (such as illustrated in FIG. 6), four-layer crack stopper structure, a five-layer crack stopper structure, etc. The crack stopper structure 106 functions to stop or reduce the number or severity of cracks, for example, by reducing their propagation, as indicated by the cracks 107C and 107D, which are discussed with respect to the singulation process below.

The first crack stopper layer 106-A may include a first sublayer 106-A1 and a second sublayer 106-A2, which may be formed at steps 18 and 19 of FIG. 10G using materials and processes similar to those used to form respective sublayers of the first crack stopper layer 106-A described above with respect to FIGS. 7A and 10E. Following the formation of the first crack stopper layer 106-A, the first dielectric film 106-B is deposited at step 20. The first dielectric film 106-B may be deposited using processes and materials similar to those used to deposit the gap-filling dielectric 108 described with respect to FIG. 3. Indeed, in some embodiments, the material of the first dielectric film 106-B may be the same material subsequently used to form the gap-filling dielectric 108, however, in other embodiments, the material of the first dielectric film 106-B may be a different material than that used for forming the gap-filling dielectric 108.

Following the formation of the first dielectric film 106-B, the second crack stopper layer 106-C is formed at steps 21, 22, and 23 of FIG. 10G on the first dielectric film 106-B. The second crack stopper layer 106 C may include a first sublayer 106-C1 and a second sublayer 106-C2, which are similar to the first sublayer 106-A1 and second sublayer 106-A2 of the first crack stopper layer 106-A, however, the second crack stopper layer 106-C may also include a third sublayer 106-C3 which is interposed between the first sublayer 106-C1 and the first dielectric film 106-B. As such, the third sublayer 106 C3 is formed at step 21 after formation of the first dielectric film 106-B, the first sublayer 106 C1 is formed at step 22 after formation of the third sublayer 106-C3, and then the second sublayer 106-C2 is formed after formation of the first sublayer 106-C1. The first sublayer 106-C1 and second sublayer 106-C2 are similar to those discussed above with respect to FIG. 8A. The third sublayer 106-C3 may serve a similar function as the second sublayer 106-C2 and the second sublayer 106-A2. The third sublayer 106-C3 may buffer the transition from the first dielectric film 106-B to the second crack stopper layer 106-C, provide increased adhesion, and provide gentler material gradients.

FIG. 9B illustrates a graph that provides a representation of the concentration content of a first element E1 (e.g., nitrogen) and a second element E2 (e.g., oxygen) in the various layers of the first crack stopper layer 106-A, the first dielectric film 106-B, the second crack stopper layer 106-C, and the gap-fill dielectric 108. The graph of FIG. 9B also illustrates that the second sublayer 106-C2 and the third sublayer 106-C3 serve as gradient layers. In FIG. 9B, like references refer to like elements used above with respect to FIG. 7B. FIG. 9B is like unto FIG. 8C, except that the third sublayer 106-C3 is included to provide a buffer and gradient between the first dielectric film 106-B and the first sublayer 106-C1. In FIG. 9B, the interactions of the first element E1 and the second element E2 around the first interface I1 and the second interface 12 are similar to those described above with respect to FIG. 7B. A third interface 13 is illustrated between the third sublayer 106-C3 and the first sublayer 106-C1 and a fourth interface 14 is illustrated between the third sublayer 106-C3 and the first dielectric film 106-B. As seen in FIG. 8C, the dielectric film 106-B and gap-fill dielectric 108 have a high concentration of the second element E2 and the first sublayer 106-C1 has a high concentration of the first element E1. The second sublayer 106-C2 and the third sublayer 106-C3 include a significant percentage of both the first element E1 and the second element E2. The third interface 13 is substantially a mirror of the first interface I1 and the fourth interface 14 is substantially a mirror of the second interface 12. In contrast to the third interface 13 as illustrated in FIG. 8C, the gradients of the first element E1 and the second element E2 in FIG. 9B are less steep due to the third sublayer 106-C3 serving as an additional buffer and gradient layer.

In some embodiments, at options 19A, 19B, 19C, 23A, 23B, and 23C of FIG. 10G, the second sublayer 106-A2 and/or second sublayer 106-C2 may be formed using various processes such as discussed above with respect to FIG. 10F. For the formation of the third sublayer 106-C3, at option 21A, the third sublayer 106-C3 may be formed by direct deposition of the material of the second sublayer, such as by PEALD, ALD, PECVD.

In other embodiments, at option 21B of FIG. 10G, the third sublayer 106-C3 may be formed by providing a post-deposition treatment process to the first dielectric film 106-B, for example, by providing a nitrogen treatment process to convert an upper portion of the first dielectric film 106-B into the third sublayer 106-C3. For example, the treatment process may be a nitrogen plasma process which converts an upper portion of the first dielectric film 106-B into the third sublayer 106-C3 by using the nitrogen plasma to embed nitrogen radicals and nitrogen ions in the first dielectric film 106-B. The high energy state of the nitrogen radicals disrupt the bonds of the material (e.g., silicon oxide) of the first dielectric film 106-B and cause at least some of the first dielectric film 106-B to convert into the third sublayer 106-C3.

In yet other embodiments, at option 21C of FIG. 10G, the third sublayer 106-C3 may be formed by providing a post-deposition treatment process to an initial deposition of the third sublayer 106-C3, for example, by providing an oxygen treatment process after depositing the third sublayer 106-C3 to convert the material deposited to the final material of the third sublayer 106-C3. The oxygen treatment process may be a plasma process which generates a plasma from oxygen, thereby generating ions and radicals of oxygen, which may convert the third sublayer 106-C3 from its original deposition.

In still other embodiments, at option 21D of FIG. 10G, the third sublayer 106-C3 may be formed by providing a pre-deposition treatment process to the deposition of the first sublayer 106-C1, for example, by providing oxygen gas during deposition of the first sublayer 106-C1 while another gas is ignited into a plasma. Radicals of the plasma can interact with the oxygen gas to cause oxygen to combine with the other materials of the first sublayer 106-C1 to form, e.g., silicon oxynitride, as an initial portion (the third sublayer 106-C3) of the first sublayer 106-C1. Following the formation of the third sublayer 106-C3, the oxygen gas may be stopped for the remainder of depositing the first sublayer 106-C1.

In embodiments with a sandwiched first dielectric layer, for the first crack stopper layer 106-A, the thickness of the first sublayer 106-A1 may be between about 1000 and 5000 angstroms, such as about 2000 angstroms. The thickness of the second sublayer 106-A2 may be between about 50 and 1000 angstroms. As such, in embodiments using a two-layered first crack stopper layer 106-A, the total thickness of the first crack stopper layer 106-A may be between about 1000 and 5000 angstroms. In some embodiments, the second crack stopper layer 106-C may be formed with the same thicknesses as the first crack stopper layer 106-A. In other embodiments, the thickness of the first sublayer 106-A1 may be between 2 and 3 times thicker than the thickness of the first sublayer 106-C1, similar to that explained above with respect to FIGS. 5 and 6. In such embodiments, for example, the first sublayer 106-C1 may be between about 700 to 1200 angstroms. The second sublayer 106-C2 may be the same thickness as or a different thickness from the second sublayer 106-A2, each being between about 600 and 5000 angstroms. The third sublayer 106-C3 may be the same thickness as or a different thickness from the second sublayer 106-C2. In some embodiments, the total thickness of the first crack stopper layer 106-A may be between 0.5 and 3 times the total thickness of the second crack stopper layer 106-C. In some embodiments, the total thickness of the second crack stopper layer 106-C may be between about 1900 and 14000 angstroms.

As indicated in FIG. 10G, after forming the second sublayer 106-C2, the steps of depositing a dielectric film (similar to the dielectric film 106-B) and depositing a crack stopper layer 106-C may be repeated as many times as desired to form a structure having three, four, five, etc. crack stopper layers in the crack stopper structure 106. Further, it should be appreciated, that the various configurations described above, with respect to the crack stopper layers of the crack stopper structures 106 may be combined to provide other variations not specifically discussed, such as combining the second crack stopper layer 106-C of FIG. 9A into the crack stopper structure 106 of FIG. 6, and so forth.

Figure 11:
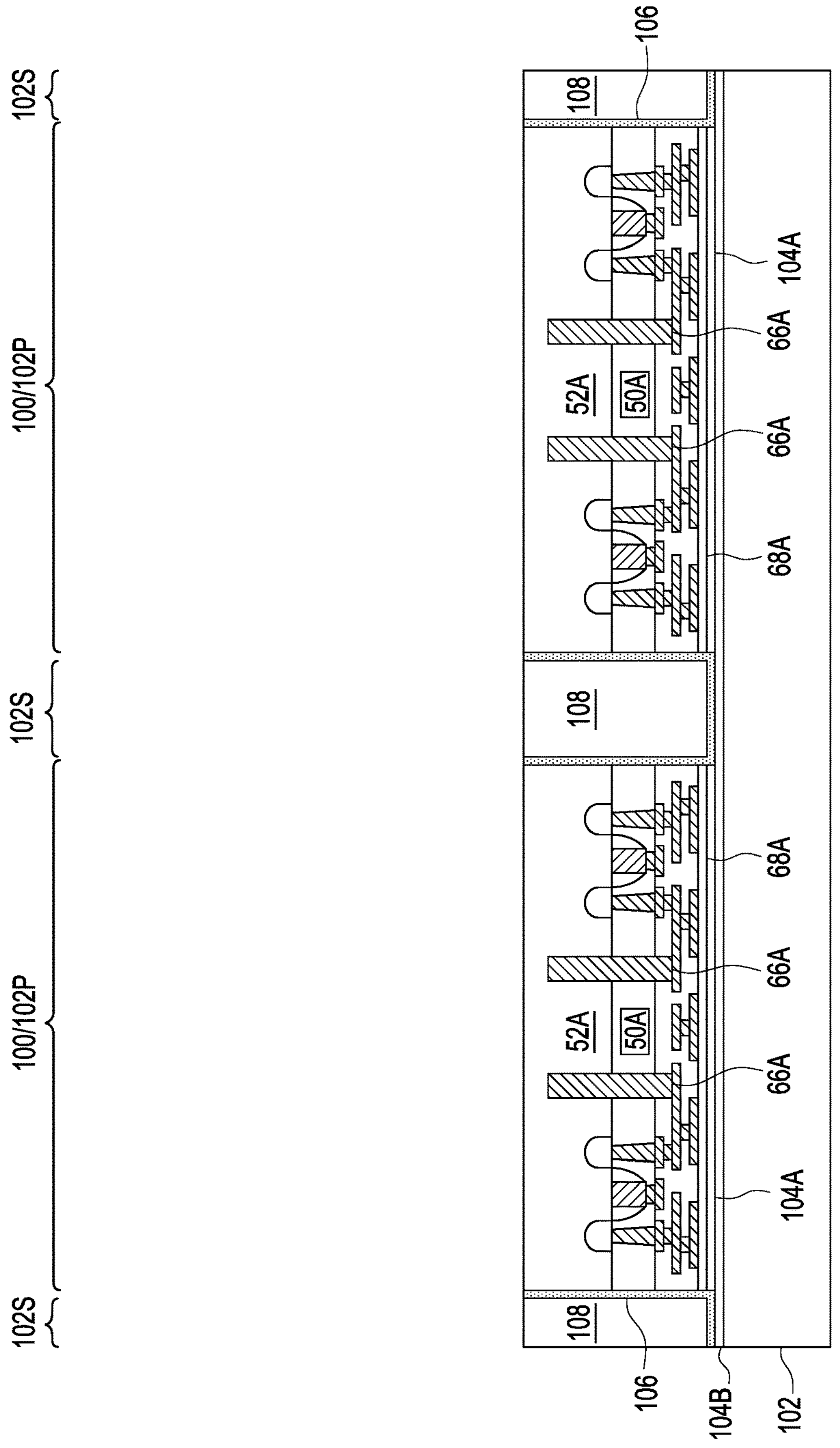

In FIG. 11, a removal process is performed to level surfaces of the gap-filling dielectric 108 with the back-side surfaces of the integrated circuit dies 50A. In some embodiments, a planarization process such as a chemical mechanical polish (CMP), an etch-back process, combinations thereof, or the like is utilized. After the planarization process, surfaces of the gap-filling dielectric 108, the crack stopper structure 106, and the integrated circuit dies 50A (including the semiconductor substrates 52A) are substantially coplanar (within process variations). The conductive vias 66A may remain buried by the semiconductor substrates 52A after the removal process.

Figure 12:
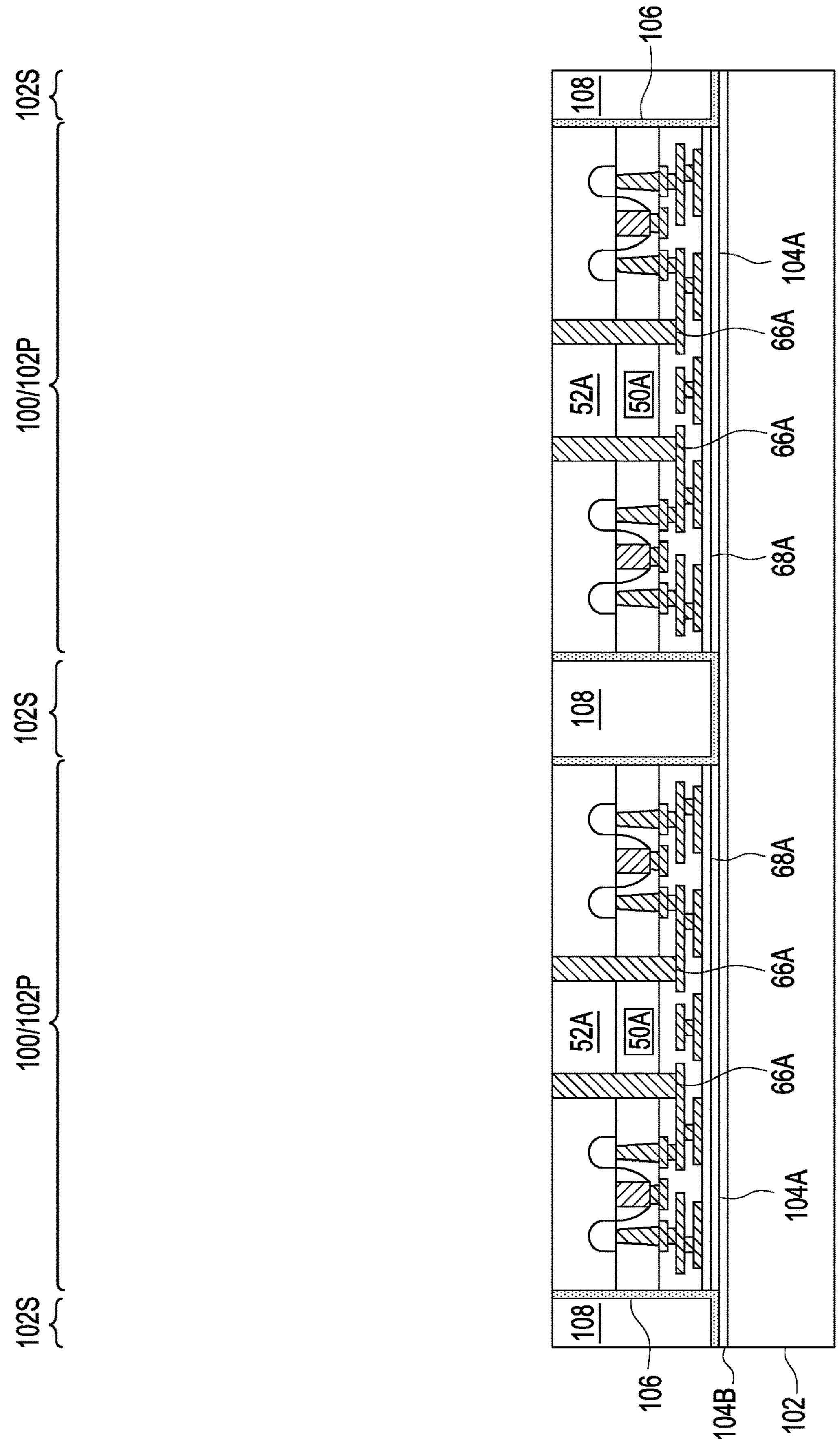

In FIG. 12, the semiconductor substrates 52A are thinned to expose the conductive vias 66A. Portions of the gap-filling dielectric 108 and portions of the crack stopper structure 106 may also be removed by the thinning process. The thinning process may be, for example, a chemical-mechanical polish (CMP), a grinding process, an etch-back process, or the like, which is performed at the back-side of the integrated circuit dies 50A.

Figure 13:
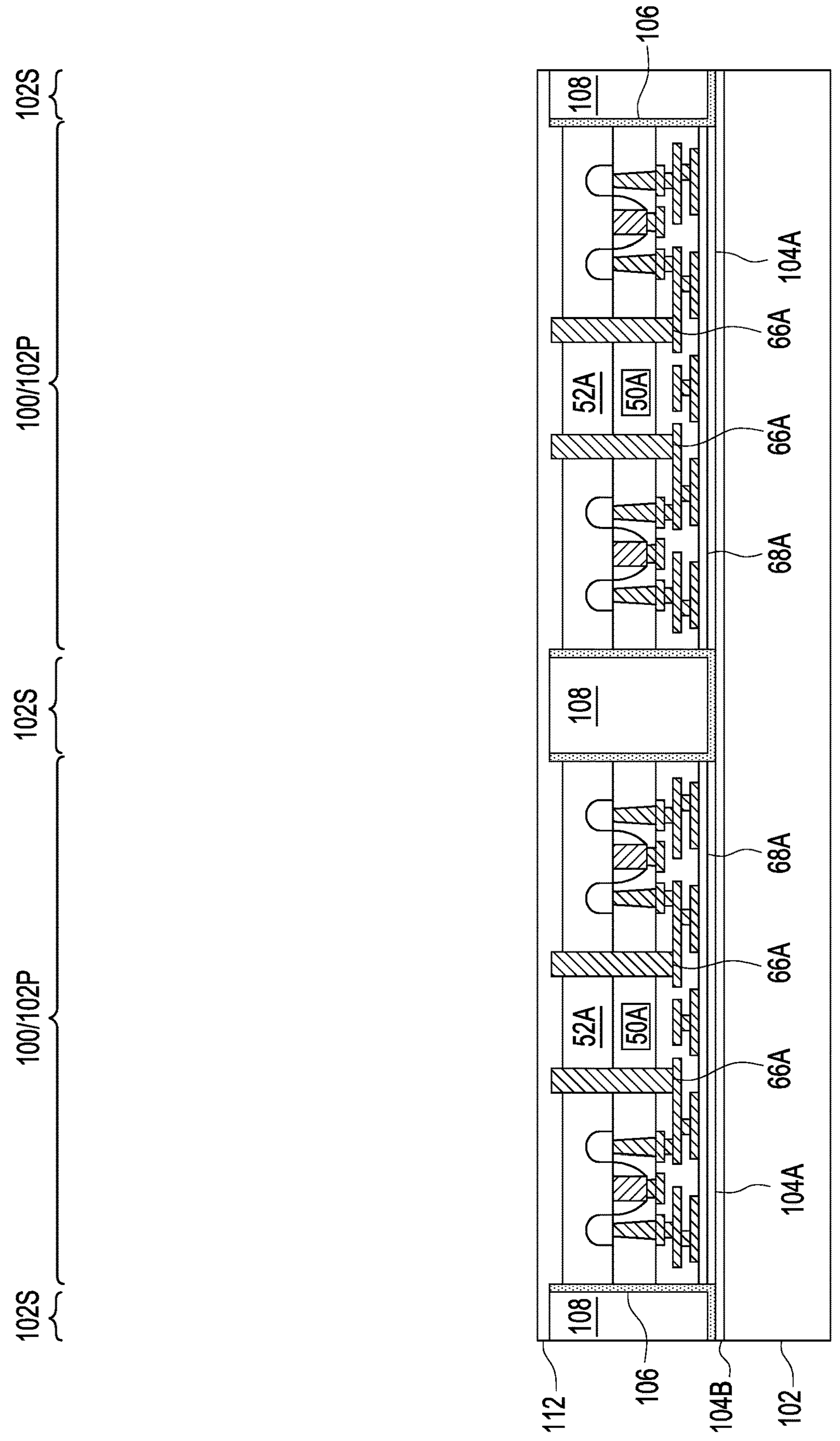

In FIG. 13, bonding layers 112 are optionally formed around the conductive vias 66A of each integrated circuit die 50A. The bonding layers 112 can help electrically isolate the conductive vias 66A from one another, thus avoiding shorting, and can also be utilized in a subsequent bonding process. As an example to form the bonding layers 112, the semiconductor substrates 52A can be recessed to expose portions of the sidewalls of the conductive vias 66A. The recessing may be performed by an etching process, such as a dry etch, a wet etch, or combinations thereof. A dielectric material can then be formed in the recesses. The dielectric material can be an oxide such as silicon oxide, phosphosilicate glass (PSG), borosilicate glass (BSG), boron-doped phosphosilicate glass (BPSG), a tetraethyl orthosilicate (TEOS) based oxide, or the like, which may be formed by a suitable deposition process such as chemical vapor deposition (CVD), atomic layer deposition (ALD), or the like. Other suitable dielectric, such as a low temperature polyimide material, PBO, an encapsulant, combinations of these, or the like may also be utilized. A planarization process, such as a CMP, grinding, or etch-back, can be performed to level the dielectric material over the conductive vias 66A. In some embodiments, such as illustrated in FIG. 13, excess portions of the dielectric material over the conductive vias 66A may be removed, while in other embodiment a portion of the dielectric material over the conductive vias 66A may remain. The remaining portions of the dielectric material in the recesses form the bonding layers 112. The bonding layers 112 laterally surround portions of the sidewalls of the respective conductive vias 66A.

Figure 14:
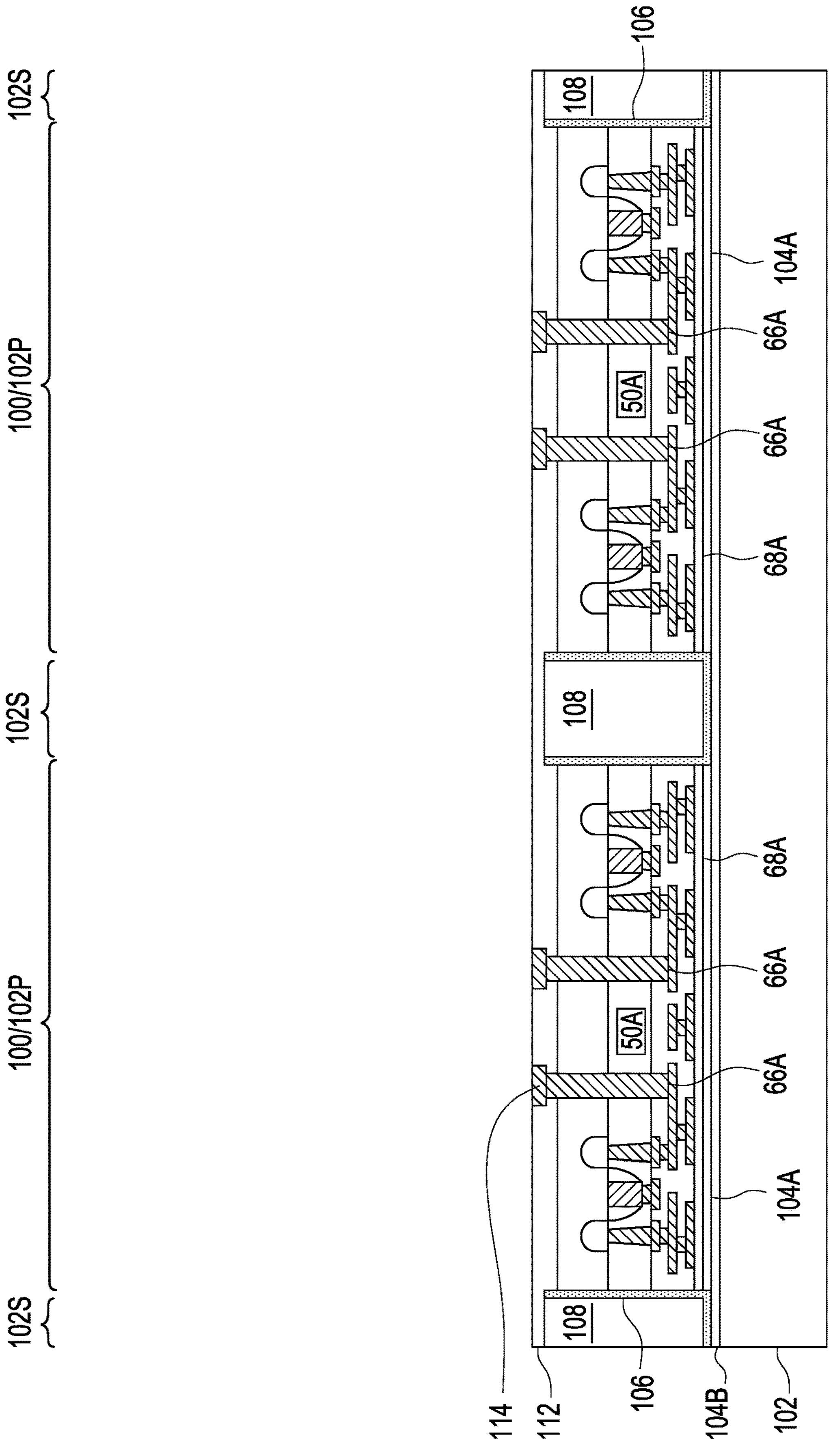

In FIG. 14, bonding pads 114 are optionally formed over the conductive vias 66A of each integrated circuit die 50A. The bonding pads 114 may be used to bond an additional integrated circuit die 50 to the back side of the integrated circuit dies 50A. As an example to form the bonding pads 114, openings may be formed in the bonding layers 112, thereby exposing the conductive vias 66A, and the bonding pads 114 may be formed in the openings on the conductive vias 66A. The openings in the bonding layers 112 may be made by an etching process, such as a dry etch, a wet etch, or combinations thereof. A conductive material can then be formed in the openings. In some embodiments, a conductive liner or barrier layer may be formed first and then the conductive material deposited in the remainder of the openings. The bonding pads 114 may be formed of a suitable conductive material such as tungsten, cobalt, nickel, copper, silver, gold, aluminum, the like, or combinations thereof, which may be formed by a deposition process such as physical vapor deposition (PVD) or CVD, a plating process such as electrolytic or electroless plating, or the like.

Figure 15:
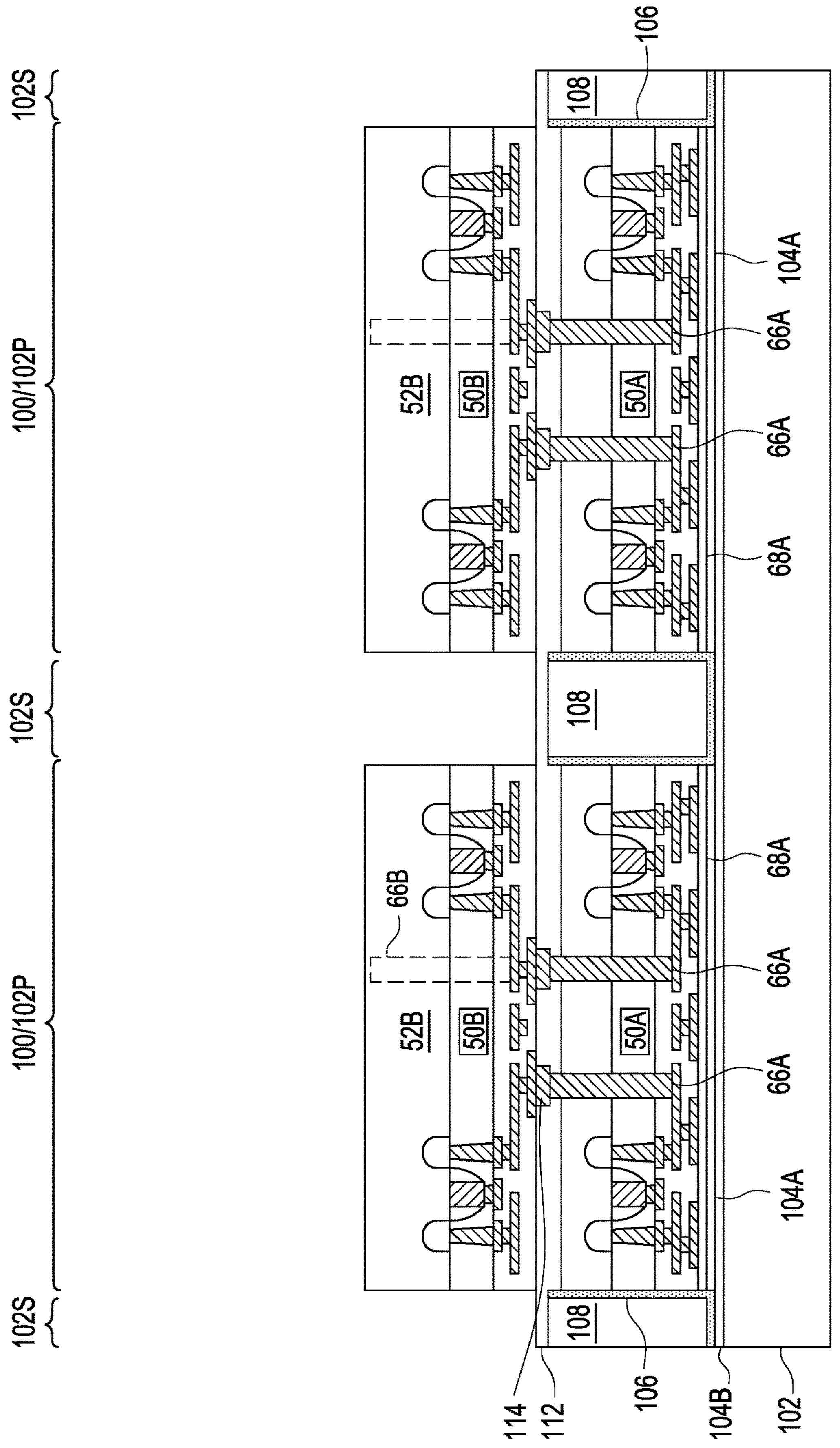

In FIG. 15, second integrated circuit dies 50 (e.g., integrated circuit dies 50B) are attached to the integrated circuit dies 50A in a face-to-back manner, such that the front-sides of the integrated circuit dies 50B are attached to the back-sides of the integrated circuit dies 50A. In the illustrated embodiment, one integrated circuit die 50B is placed in each package region 102P, although any desired quantity of integrated circuit dies 50B may be attached to each integrated circuit die 50A. In the illustrated embodiment, the integrated circuit dies 50B appear to have the same footprint as the integrated circuit dies 50A, however, it should be understood that the integrated circuit dies 50B may be smaller than or larger than the integrated circuit dies 50A. The integrated circuit dies 50B may be placed by, e.g., a pick-and-place process. The integrated circuit dies 50B may be memory devices, such as dynamic random-access memory (DRAM) dies, static random-access memory (SRAM) dies, hybrid memory cube (HMC) modules, high bandwidth memory (HBM) modules, or the like.

The integrated circuit dies 50B may be attached to the integrated circuit dies 50A by bonding the integrated circuit dies 50B to the integrated circuit dies 50A. As an example, the integrated circuit dies 50B may be bonded to the integrated circuit dies 50A by hybrid bonding. The dielectric layers 72B of the integrated circuit dies 50B are directly bonded to respective bonding layers 112 of the integrated circuit dies 50A through dielectric-to-dielectric bonding, without using any adhesive material (e.g., die attach film). The die connectors 74B of the integrated circuit dies 50B are directly bonded to respective bonding pads 114 (or conductive vias 66A) of the integrated circuit dies 50A through metal-to-metal bonding, without using any eutectic material (e.g., solder). The bonding may include a pre-bonding and an annealing. During the pre-bonding, a small pressing force is applied to press the integrated circuit dies 50B against the integrated circuit dies 50A. The pre-bonding is performed at a low temperature, such as about room temperature such as a temperature in the range of 15° C. to 30° C., and after the pre-bonding, the dielectric layers 72B are bonded to the bonding layers 112. The bonding strength is then improved in a subsequent annealing step, in which the bonding layers 112, the bonding pads 114 (or conductive vias 66A), the dielectric layers 72B, and the die connectors 74B are annealed. After the annealing, direct bonds such as fusion bonds are formed, bonding the bonding layers 112 to the dielectric layers 72B. For example, the bonds can be covalent bonds between the material of the bonding layers 112 and the material of the dielectric layer 72B. The bonding pads 114 (or conductive vias 66A) are connected to the die connectors 74B with a one-to-one correspondence. The bonding pads 114 (or conductive vias 66A) and the die connectors 74B may be in physical contact after the pre-bonding, or may expand to be brought into physical contact during the annealing. Further, during the annealing, the material of the bonding pads 114 (or conductive vias 66A) and the die connectors 74B (e.g., copper) intermingles, so that metal-to-metal bonds are also formed. Hence, the resulting bonds between the integrated circuit dies 50A, 50B are hybrid bonds that include both dielectric-to-dielectric bonds and metal-to-metal bonds.

When hybrid bonding is utilized to attach the integrated circuit dies 50B to the integrated circuit dies 50A, the integrated circuit packages 100 may be formed without some components. For example, utilizing hybrid bonding allows bonding pads to be omitted from the back-sides of the integrated circuit dies 50A. Instead, the conductive vias 66A are directly connected to the die connectors 74B, with no bonding pads interposed between the conductive vias 66A and the die connectors 74B.

The integrated circuit dies 50B may or may not include conductive vias 66 (previously described for FIG. 1) and illustrated in FIG. 15 in dashed outline. For example, if the device tier that the integrated circuit dies 50B is in is to be the uppermost tier, then the integrated circuit dies 50B may not need conductive vias 66B (shown in dashed outline) and so may be omitted. However, in another example, the conductive vias 66B may be used for a subsequently placed device over the uppermost tier of integrated circuit dies 50B of the integrated circuit packages 100.

Figure 16:
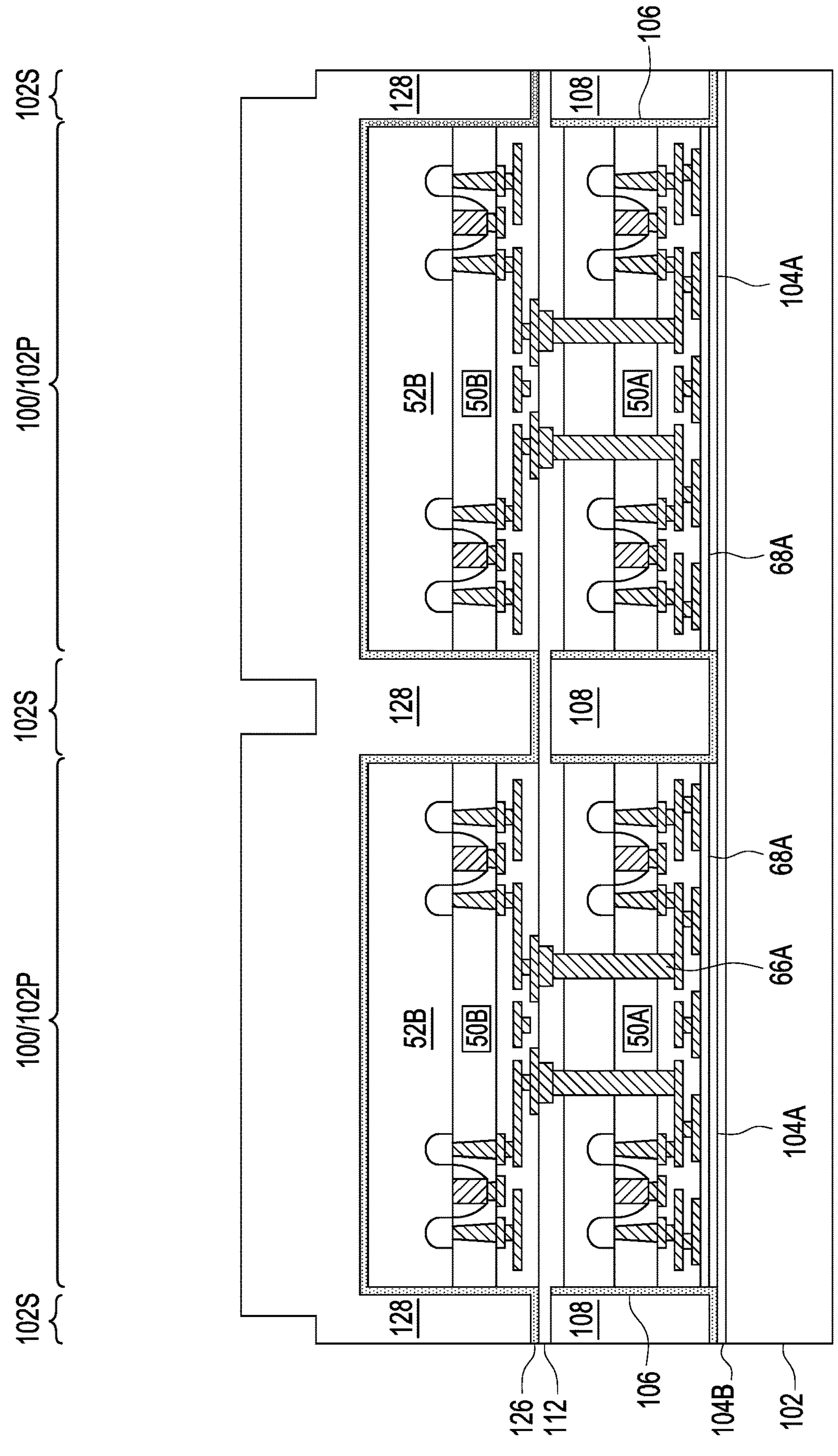

In FIG. 16, a crack stopper structure 126 is formed over the integrated circuit dies 50B and along upper surfaces of the bonding layer 112. The crack stopper structure 126 may be formed according to any of the configurations discussed above with respect to the crack stopper structure 106 (see FIGS. 4, 5, 6, 7A, 7B, 8A, 8B, 8C, 9A, 9B, 10A, 10B, 10C, 10D, 10E, 10F, and 10G). A gap-filling dielectric 128 is formed between the integrated circuit dies 50B. Initially, the gap-filling dielectric 128 may bury or cover the integrated circuit dies 50B, such that the top surface of the gap-filling dielectric 128 is above the top surfaces of the integrated circuit dies 50B. The gap-filling dielectric 128 is disposed over the portions of the gap-filling dielectric 108 between the integrated circuit dies 50A. The gap-filling dielectric 128 fills (and may overfill) the gaps between the integrated circuit dies 50B. The gap-filling dielectric 128 may be formed of a dielectric material, such as an oxide such as silicon oxide, phosphosilicate glass (PSG), borosilicate glass (BSG), boron-doped phosphosilicate glass (BPSG), a tetraethyl orthosilicate (TEOS) based oxide, or the like, which may be formed by a suitable deposition process such as chemical vapor deposition (CVD), atomic layer deposition (ALD), or the like. In some embodiments, the gap-filling dielectric 128 is formed of the same dielectric material as the gap-filling dielectric 108.

Figure 17:
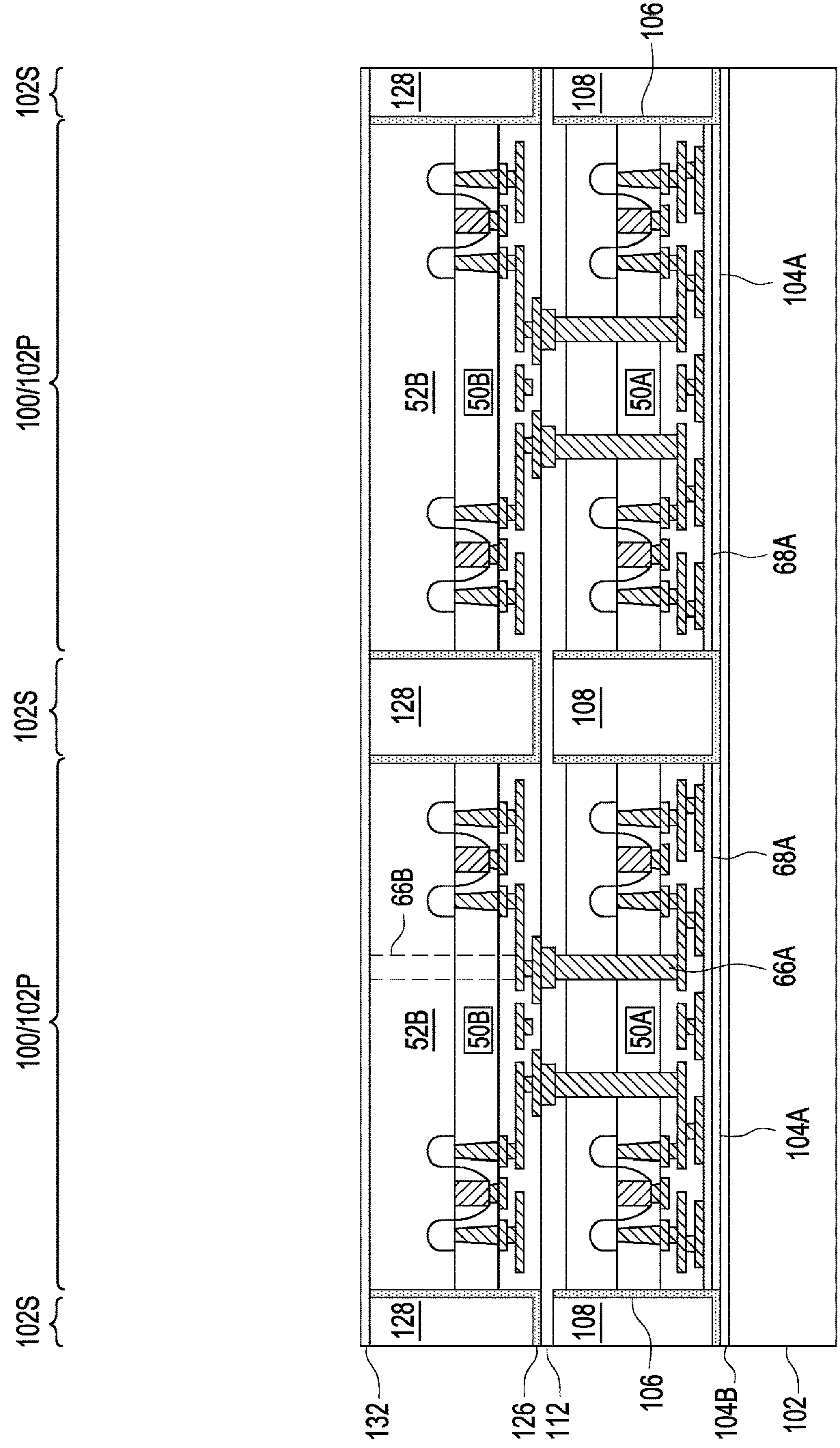

In FIG. 17, a removal process is performed to level surfaces of the gap-filling dielectric 128 with the back-side surfaces of the integrated circuit dies 50B. In some embodiments, a planarization process such as a chemical mechanical polish (CMP), an etch-back process, combinations thereof, or the like is utilized. After the planarization process, surfaces of the gap-filling dielectric 128, the crack stopper structure 126, and the integrated circuit dies 50B (including the semiconductor substrates 52B) are substantially coplanar (within process variations).

The crack stopper structure 106 extends along the sidewalls of the integrated circuit dies 50A, and the crack stopper structure 126 extends along the sidewalls of the integrated circuit dies 50B. The crack stopper structure 106 may be of a different variety than the crack stopper structure 126, such varieties described above in conjunction with the crack stopper structure 106. The outer sidewalls of the crack stopper structure 106 and the crack stopper structure 126 may or may not be aligned with one another. More generally, the crack stopper structure 106 and the crack stopper structure 126 each include vertical portions and horizontal portions, with the vertical portions of the crack stopper structure 126 being aligned, in some embodiments, with respective vertical portions of the crack stopper structure 106.

In FIG. 17, a bonding layer 132 is optionally formed on the planarized surfaces of the gap-filling dielectric 128, the crack stopper structure 126, and the integrated circuit dies 50B. In some embodiments, such as when optional conductive vias 66B (shown in dashed outline) are present, the semiconductor substrates 52B may also be recessed, such as described above with respect to the semiconductor substrates 52A of FIG. 13. The bonding layer 132 may be formed using processes and materials similar to those discussed above with respect to the bonding layer 112. In embodiments which omit the bonding layer 132, it should be understood that subsequent structures may be formed on or attached to the upper surfaces of the integrated circuit dies 50B, gap-fill dielectric 128, and crack stopper structures 126 instead of the described bonding layer 132.

Figure 18:
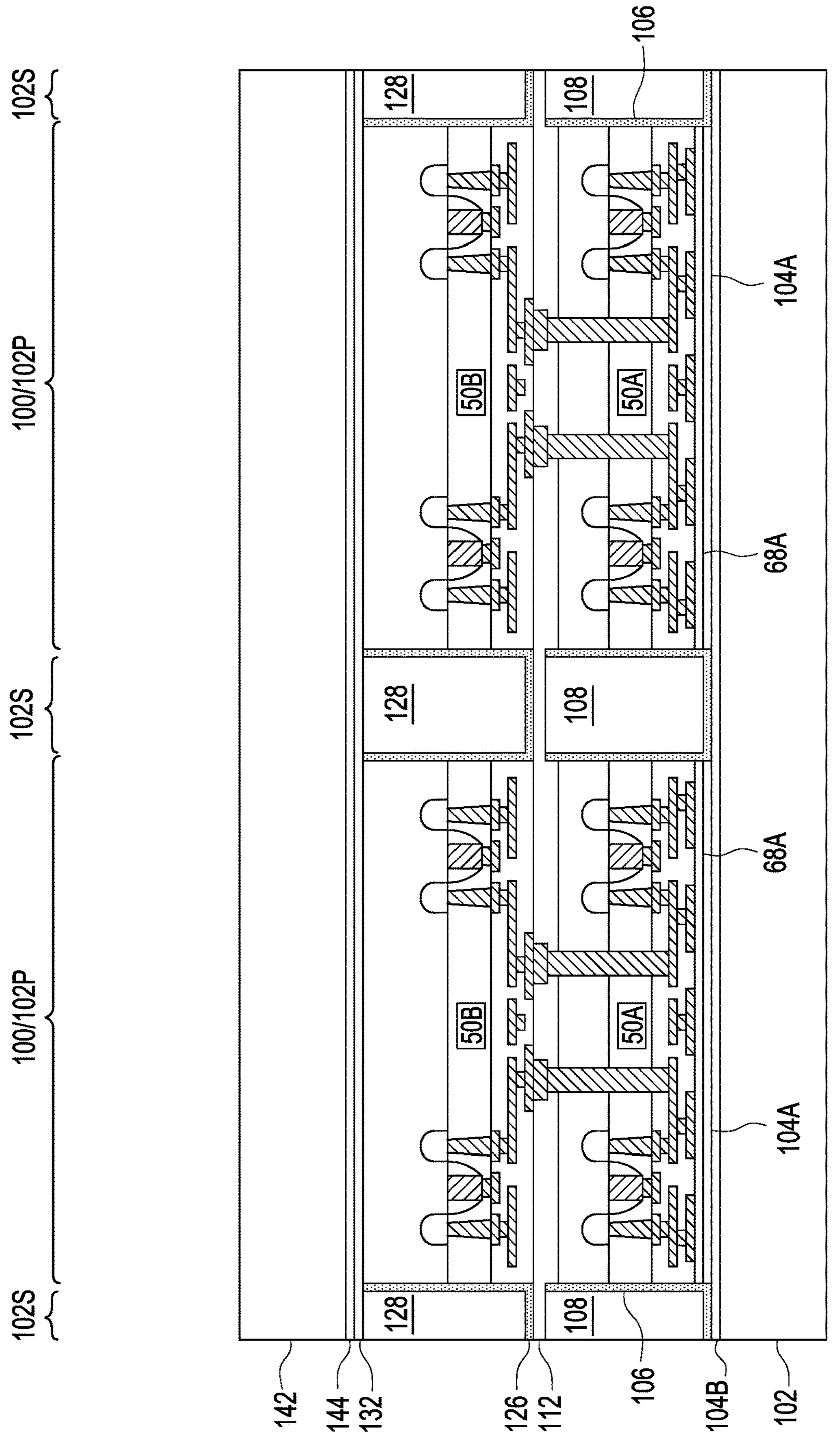

In FIG. 18, a support substrate 142 is attached to the bonding layer 132. The support substrate 142 may be a glass support substrate, a ceramic support substrate, or the like. The support substrate 142 may be a wafer.

The support substrate 142 may be attached to the bonding layer 132 by bonding the support substrate 142 to the bonding layer 132 with a bonding film 144. The bonding film 144 is on a surface of the support substrate 142 and a surface of the bonding layer 132. In some embodiments, the bonding film 144 is a release layer, such as an epoxy-based thermal-release material, which loses its adhesive property when heated, such as a light-to-heat-conversion (LTHC) release coating; an ultra-violet (UV) glue, which loses its adhesive property when exposed to UV lights; or the like. In some embodiments, the bonding film 144 is an adhesive, such as a suitable epoxy, die attach film (DAF), or the like. In some embodiments, the bonding film 144 is an oxide layer such as a layer of silicon oxide. The bonding film 144 may include any desired quantity of release layers and/or adhesive films. The bonding film 144 may be applied to the support substrate 142 and/or to the bonding layer 132. In some embodiments, the bonding film 144 may be omitted and the bonding layer 132 may be used as the bonding film 144.

Figure 19:
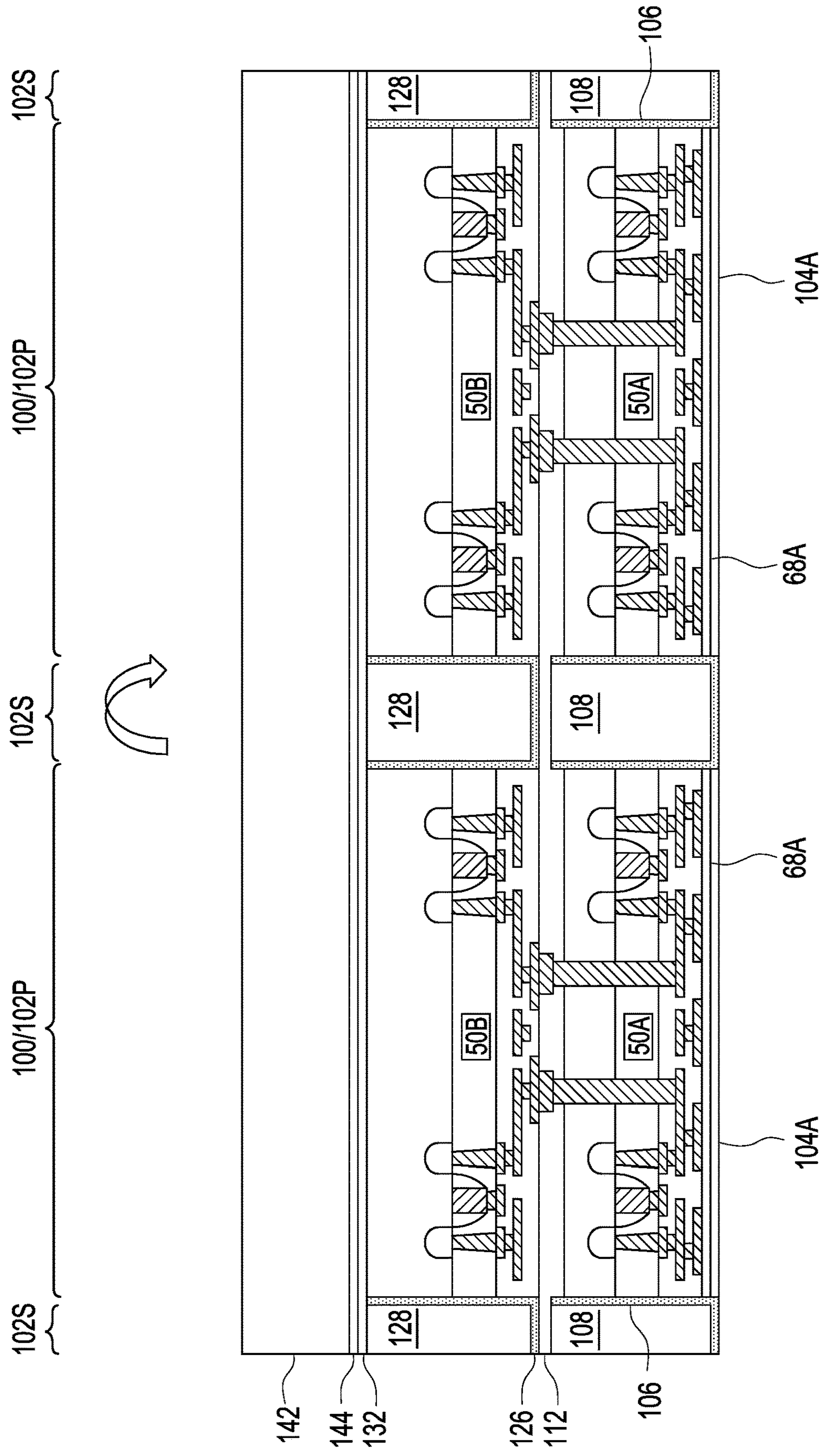

In FIG. 19, a carrier substrate de-bonding is performed to detach (or "de-bond") the carrier substrate 102 from the integrated circuit dies 50A. In accordance with some embodiments where the first bonding film 104A includes a release layer, the de-bonding includes projecting a light such as a laser light or an UV light on the first bonding film 104A so that the first bonding film 104A decomposes under the heat of the light and the carrier substrate 102 can be removed. The structure is then flipped over and placed on a tape (not separately illustrated).

Figure 20:
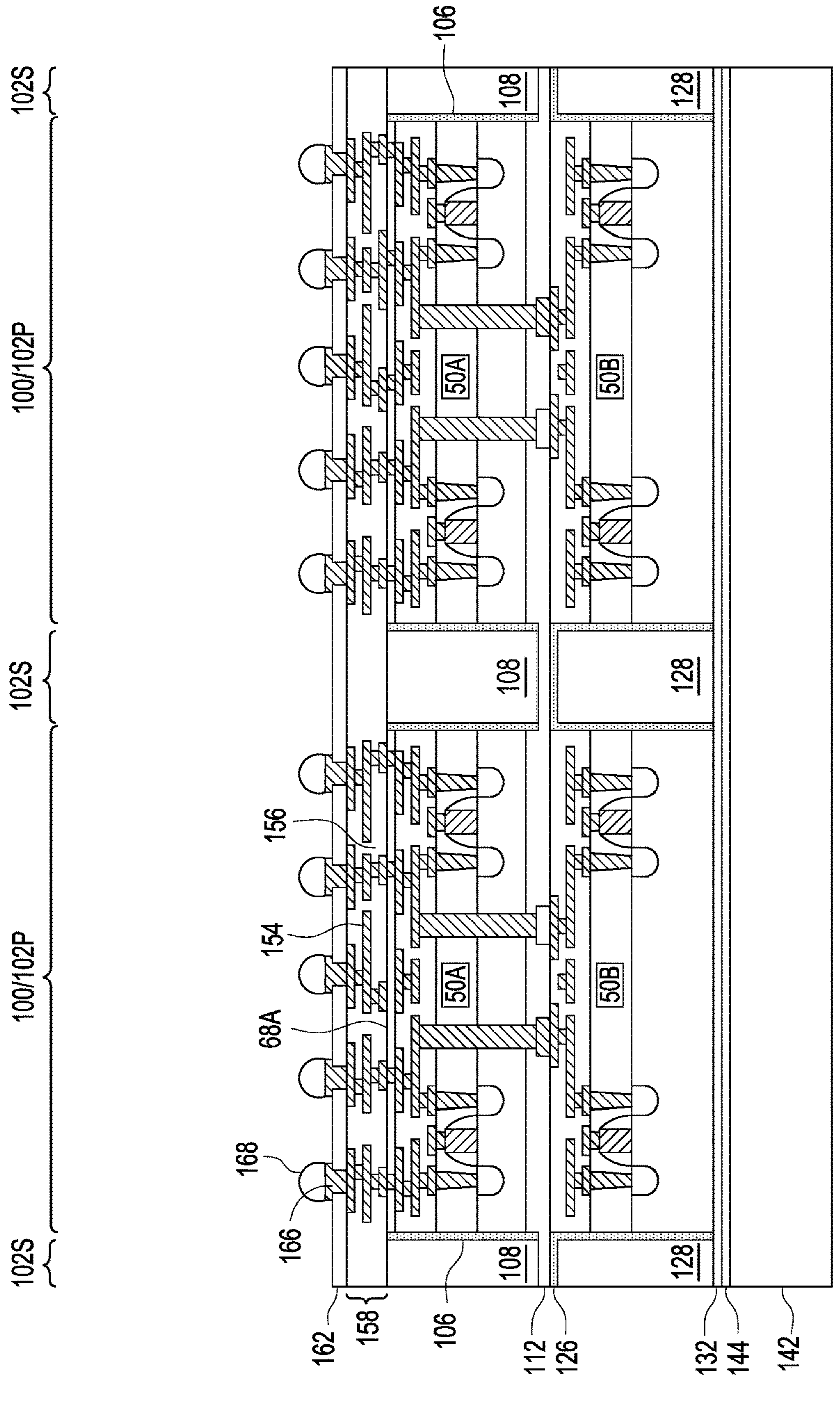
Figure 21:
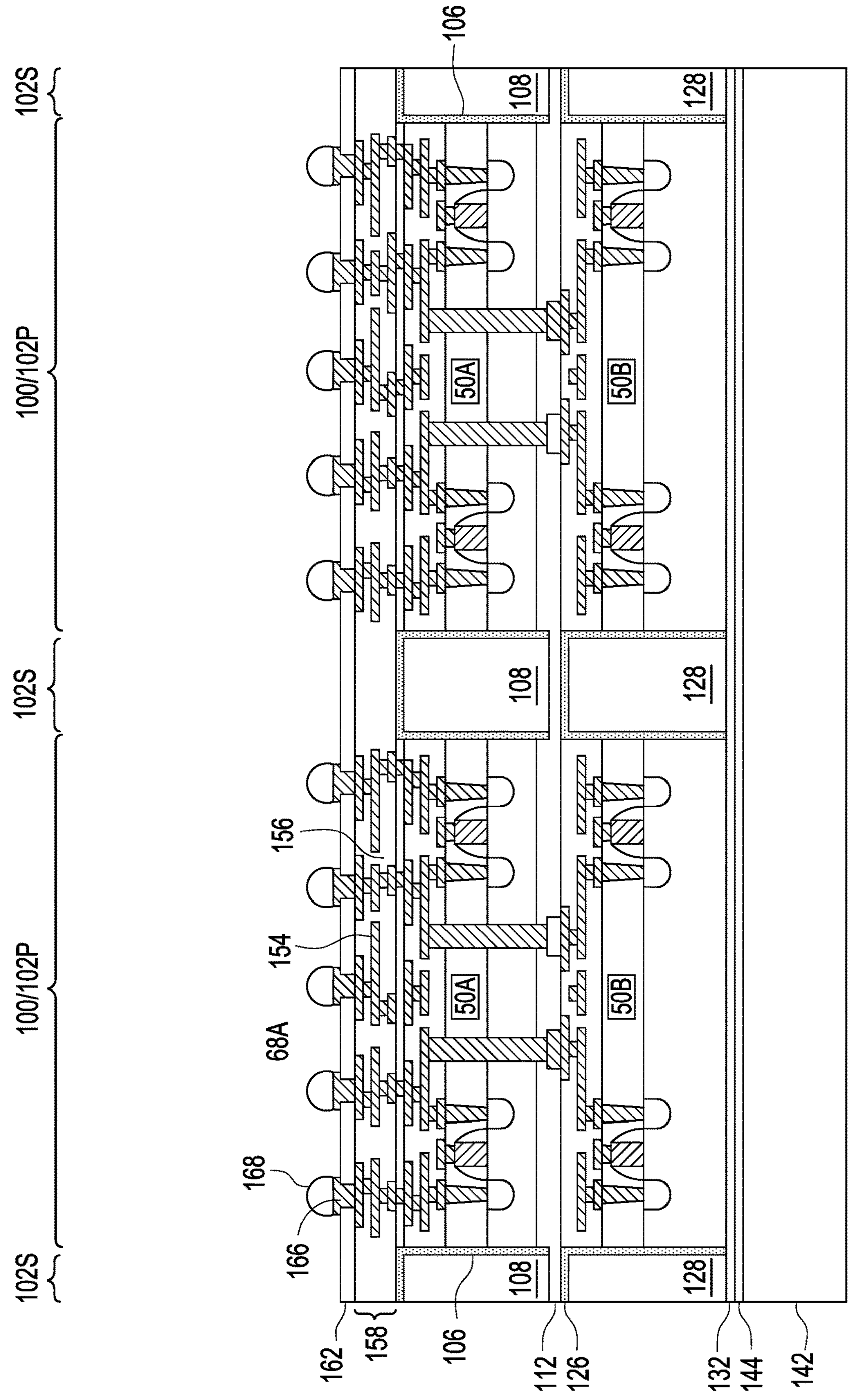

In FIGS. 20 and 21, a removal process is performed to expose the upper passivation layers 68A of the integrated circuit dies 50A. In FIG. 20, portions of the gap-filling dielectric 108 and portions of the crack stopper structure 106 may also be removed by the thinning process such that the gap-filling dielectric 108 is exposed. The removal process may level surfaces of upper passivation layers 68A with surfaces of the gap-filling dielectric 108 and the crack stopper structure 106. In some embodiments, a planarization process such as a chemical mechanical polish (CMP), an etch-back process, combinations thereof, or the like is utilized. After the planarization process, surfaces of the gap-filling dielectric 108, the crack stopper structure 106, and the integrated circuit dies 50A (including the upper passivation layers 68A) are substantially coplanar (within process variations). In FIG. 21, the first bonding film 104A was not used and so the horizontal portions of the crack stopper structure 106 may remain intact. In such embodiments, any residue from the second bonding film 104B may be removed by a cleaning process and the upper passivation layers 68A of the integrated circuit dies 50A are thereby exposed.

Also illustrated in FIGS. 20 and 21, an optional redistribution structure 158 is formed over front sides of the integrated circuit devices 50A, over the gap-fill dielectric 108, and over (now) upper surfaces of the crack stopper structure 106. The redistribution structure 158 interconnects the integrated circuit devices 50 (e.g., 50A and/or 50B) to subsequently formed front connectors and/or to each other. The redistribution structure 158 may be formed of, for example, metallization patterns 154 in dielectric layers 156. The metallization patterns 154 include metal lines and vias, which may be formed in the dielectric layers 156 by a damascene process, such as a single damascene process, a dual damascene process, or the like. The metallization patterns 154 may be formed of a suitable conductive material, such as copper, tungsten, aluminum, silver, gold, a combination thereof, or the like. In some embodiments, the redistribution structure 158 extends wider than the foot print of the integrated circuit dies 50A.

Next, a passivation layer 162 is formed over the redistribution structure 158 and over the integrated circuit dies 50A, the crack stopper structures 106, and the gap-fill dielectric 108. The passivation layer 162 may be formed of one or more suitable dielectric materials such as silicon oxynitride, silicon nitride, low-k dielectrics such as carbon doped oxides, extremely low-k dielectrics such as porous carbon doped silicon oxide, a polymer such as polyimide, solder resist, polybenzoxazole (PBO), a benzocyclobutene (BCB) based polymer, molding compound, the like, or a combination thereof. The passivation layer 162 may be formed by chemical vapor deposition (CVD), spin coating, lamination, the like, or a combination thereof. In some embodiments, the passivation layer 162 includes a first passivation layer formed of an oxide and a second passivation layer formed of a nitride.

After formation of the passivation layer 162, openings for die connectors 166 are formed through the passivation layer 162. The openings may be formed by suitable photolithography and etching techniques. In some embodiments, the openings expose portions of an upper metallization pattern 154 of the redistribution structure 158. In some embodiments, the openings expose portions of an upper metallization pattern 62A of the integrated circuit dies 50A.

Then, die connectors 166 are optionally formed in the openings through the passivation layer 162. The die connectors 166 may include conductive pillars, pads, or the like, to which external connections can be made. In some embodiments, the die connectors 166 include bond pads at the front-side surface of the passivation layer 162 and include bond pad vias extending through the passivation layer 162 that connect the bond pads to the upper metallization pattern 154 of the redistribution structure 158 (or if no redistribution structure 158, the upper metallization pattern 62A of the integrated circuit die 50A). The die connectors 166 (including the bond pads and the bond pad vias) may be formed by a damascene process, such as a single damascene process, a dual damascene process, or the like. The die connectors 166 can be formed of a conductive material, such as a metal, such as copper, aluminum, or the like, which can be formed by, for example, plating, or the like.

Conductive connectors 168 are optionally formed on the die connectors 166. The conductive connectors 168 may be formed before or after the singulation process described below with respect to FIG. 22. The conductive connectors 168 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 168 may include a conductive material such as solder, copper, aluminum, gold, nickel, silver, palladium, tin, the like, or a combination thereof. In some embodiments, the conductive connectors 168 are formed by initially forming a layer of a reflowable material (e.g., solder) through evaporation, electroplating, printing, solder transfer, ball placement, or the like. Once a layer of solder has been formed on the structure, a reflow may be performed in order to shape the material into the desired bump shapes. The conductive connectors 168 may be subsequently utilized to connect the integrated circuit package 100 to another component, such as an interposer, a packing substrate, or the like.

Figure 22:
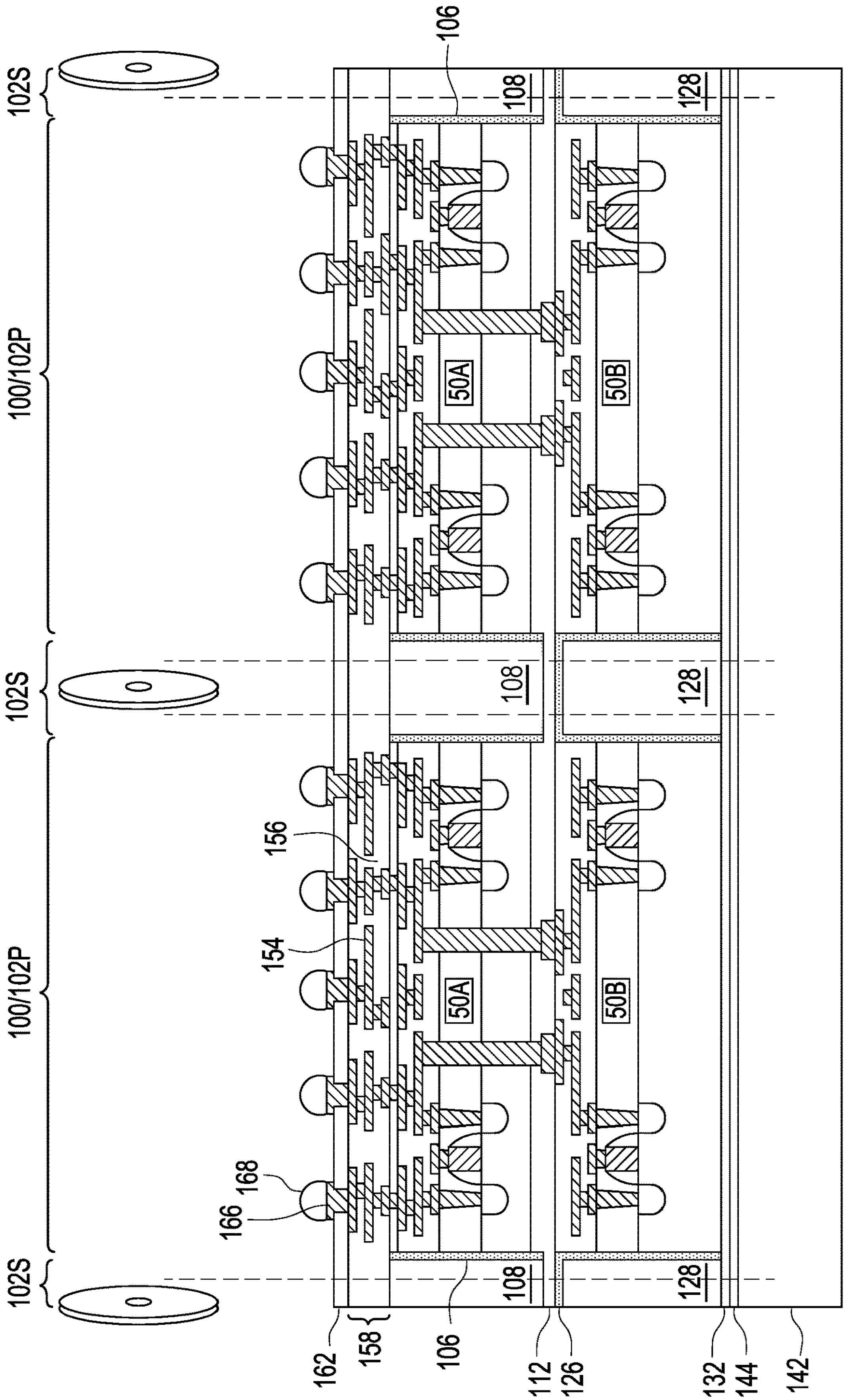

In FIG. 22, a singulation process is performed on the structure of FIG. 20 or 21 to singulate package regions 102P from one another. The singulation process may include a mechanical process such as a sawing process, a cutting process, or the like. In some embodiments, the singulation process may include an etching process, lasering process, mechanical process, and/or combinations thereof. The singulation is performed along the scribe line regions 102S through the passivation layer 162, redistribution structure 158, gap-fill dielectrics 108, 128, crack stopper structures 106, 126, bonding layer 132, bonding film 144, and support substrate 142. The resulting, singulated integrated circuit package 100 (see FIG. 23) is from one of the package regions 102P. After the singulation process, the singulated portions of the passivation layer 162, the etch stop layer 132, the bonding film 144, and the support substrate 142 are laterally coterminous.

Due to the crack stopper structure 106, cracks that may form in the gap-fill dielectric 108 and/or 128 as a result of the singulation are stopped at the crack stopper structure 106 and not allowed to propagate into the integrated circuit dies 50 (e.g., 50A, 50B, 50C, 50D). For example, referring to FIG. 6, a crack 107A may terminate at an outer layer (e.g., 106-E) of the crack stopper structure, a crack 107B may extend through the outer layer of the crack stopper structure 106 and terminate at an interior layer (e.g., 106-C) of the crack stopper structure 106, and a crack 107C may extend all the way through the crack stopper structure 106 except the inner layer (e.g., 106-A) of the crack stopper structure 106. In another example, referring to FIG. 9A, a crack 107C extends all the way through the crack stopper structure 106 except the inner layer (e.g., 106-A) of the crack stopper structure 106, while a crack 107D extends partially through a crack stopper layer having multiple sublayers.

Figure 23:
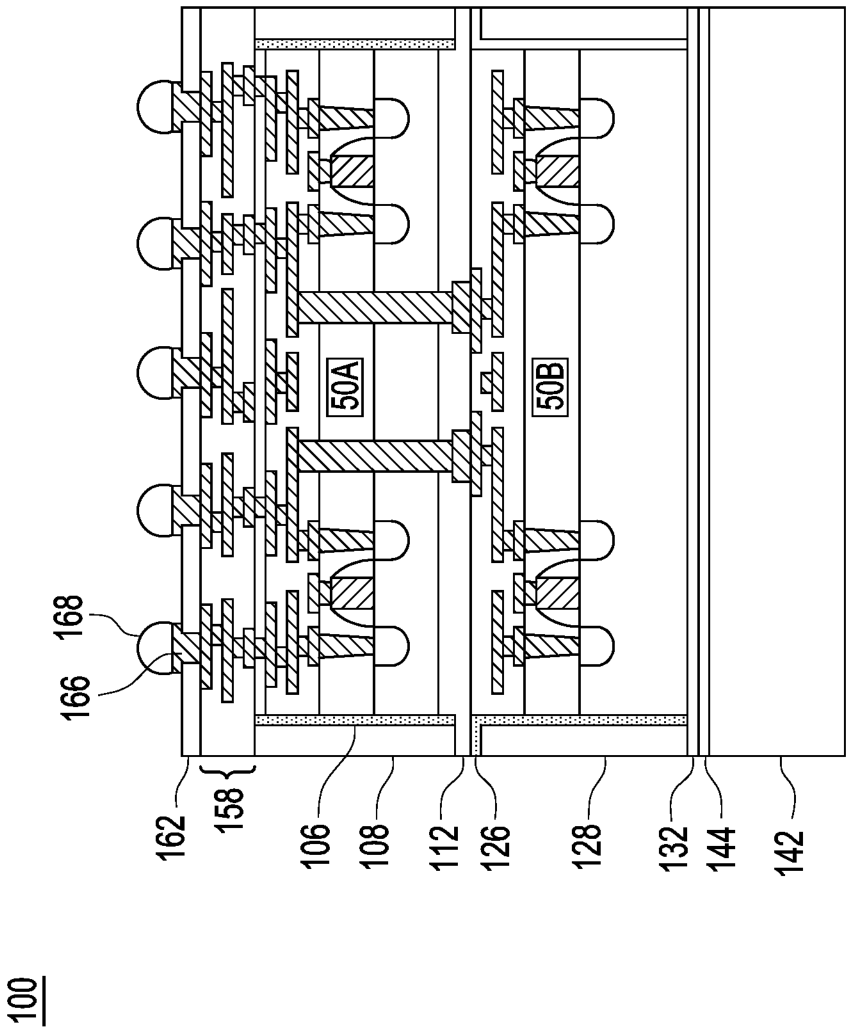

Referring to FIG. 23, the integrated circuit package 100 is a component that may be subsequently implemented in an integrated circuit device. In some embodiments, an integrated circuit device is formed by attaching the integrated circuit package 100 to another component, such as an interposer, a packing substrate, or the like. In some embodiments, an integrated circuit device is formed by encapsulating the integrated circuit package 100 and forming redistribution lines on the encapsulant to fan-out connections from the integrated circuit package 100. The integrated circuit dies 50 of the integrated circuit package 100 may be heterogeneous dies. Packaging the integrated circuit package 100 in lieu of or in addition to packaging dies individually may allow heterogeneous dies to be integrated with a smaller footprint.

Figure 24:
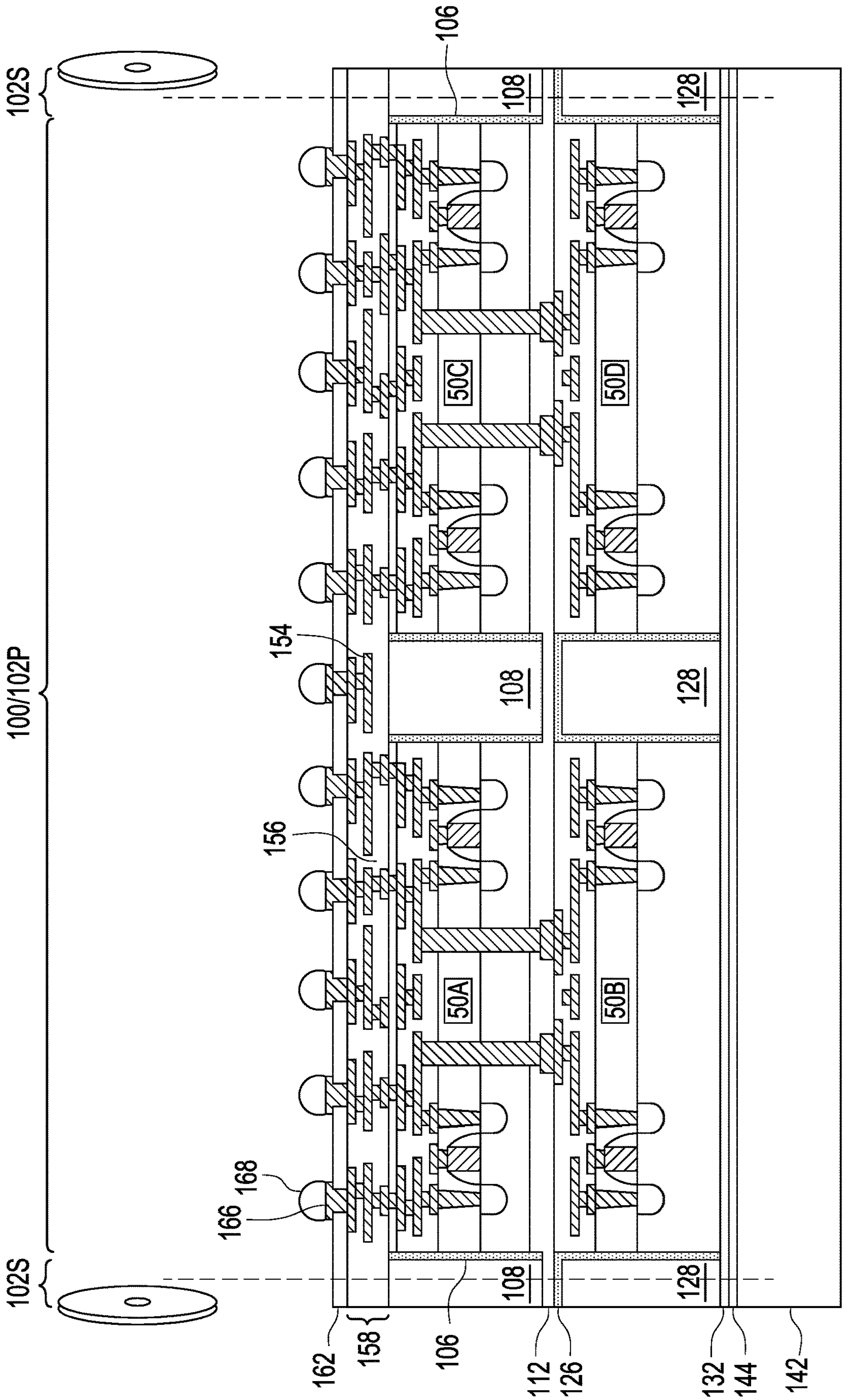
FIG. 24 is a cross-sectional view of an intermediate stage in the manufacturing of integrated circuit packages, in accordance with some embodiments.

In FIG. 24, the scribe line regions 102S are positioned differently and the singulation process is performed through the scribe line regions 102S to singulate package regions 102P from neighboring adjacent package regions 102P (not shown in this view). The singulation process may be as described above with respect to FIG. 22.

Figure 25A:
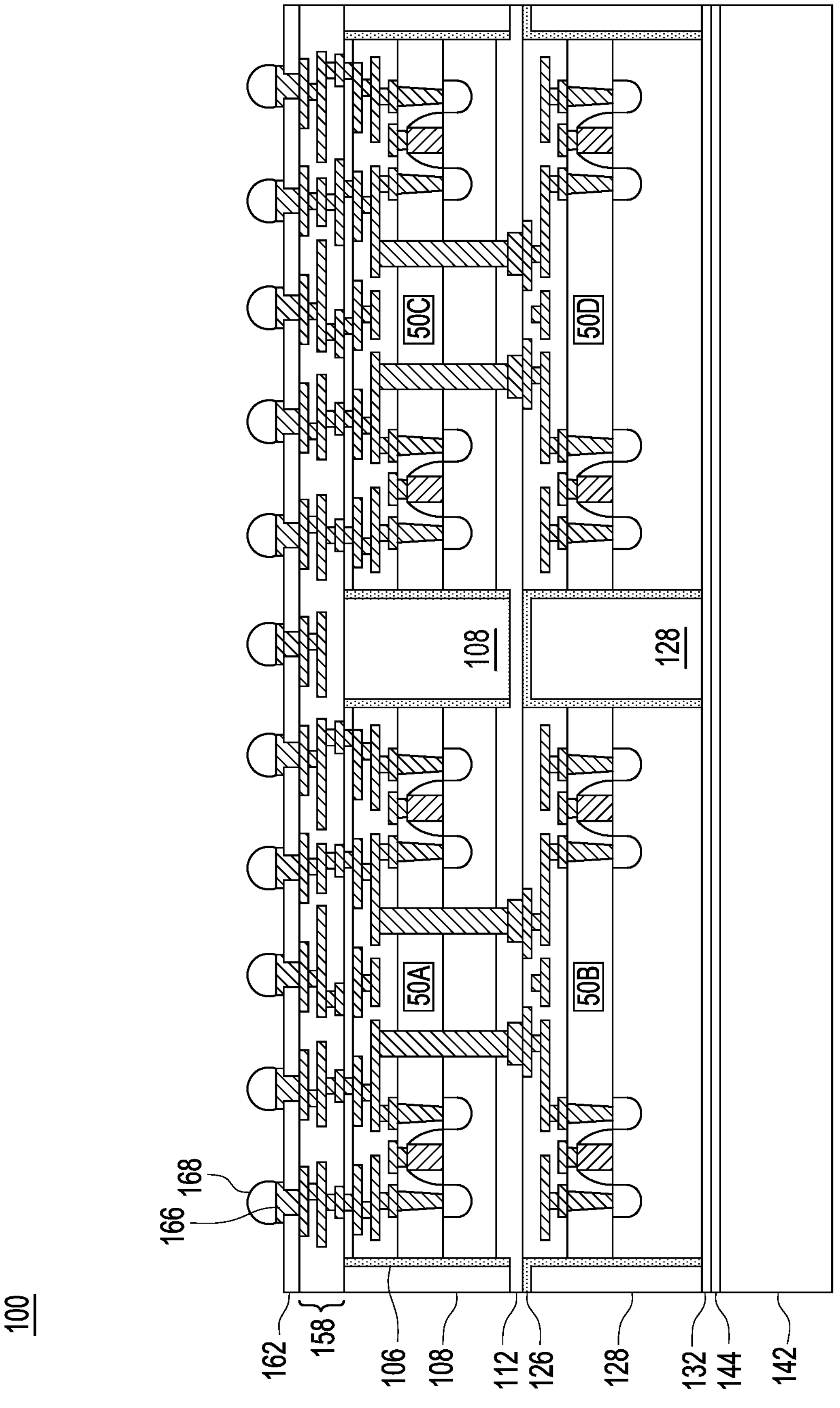
FIGS. 25A, 25B, 25C, and 25D are cross-sectional views of an integrated circuit package, in accordance with some other embodiments.
Figure 25B:
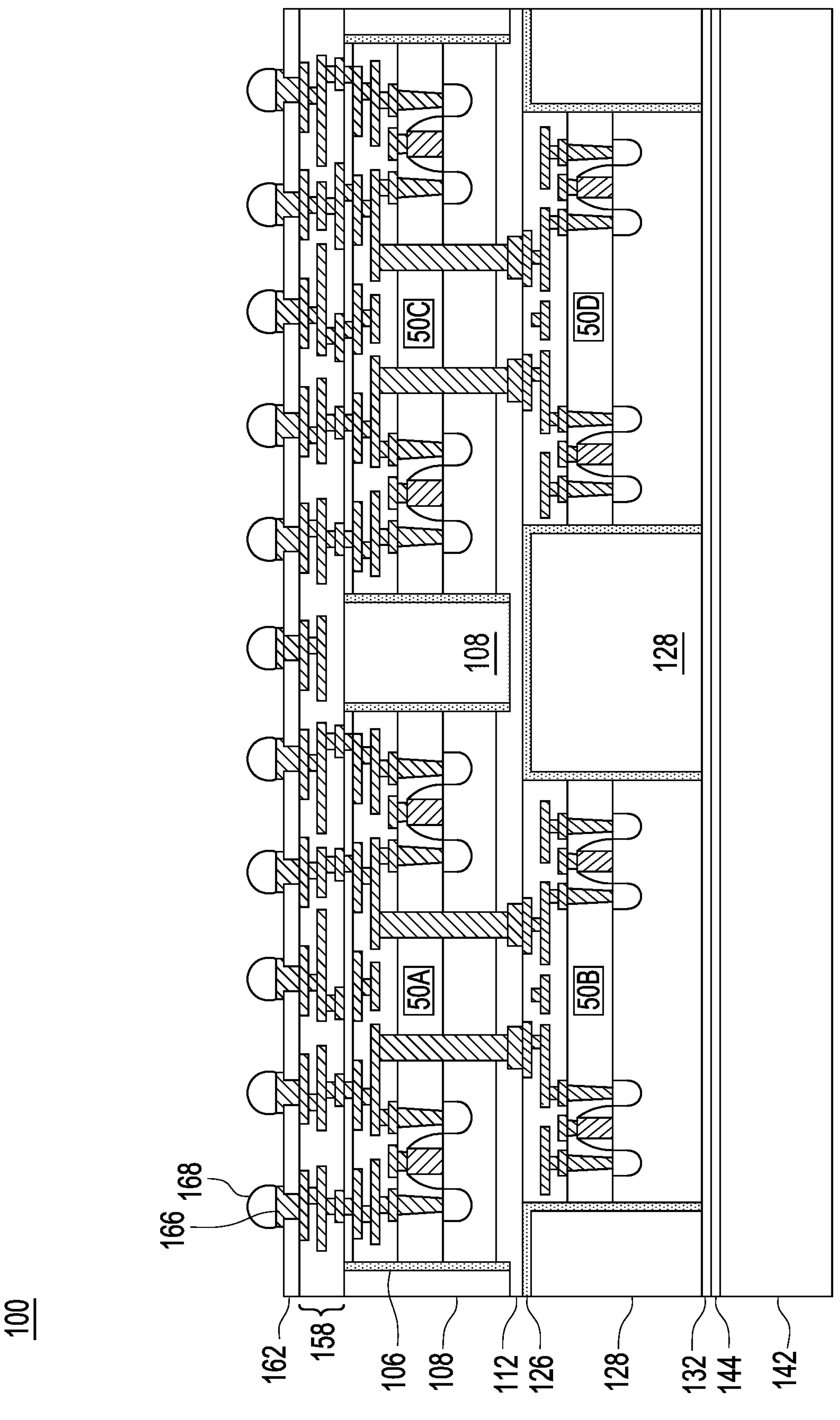

In FIGS. 25A through 25D, integrated circuit packages 100 are illustrated in accordance with variations which may be implemented in the above-described steps, with like references used for like elements. In FIG. 25A, for example, the package 100 includes multiple integrated circuit dies 50 in each tier, including integrated circuit dies 50A and 50C in the first tier and integrated circuit dies 50B and 50D in the second tier. The integrated circuit dies 50C and 50D may have functions which correspond to any of those discussed above with respect to the integrated circuit dies 50. In FIG.

Figure 25C:
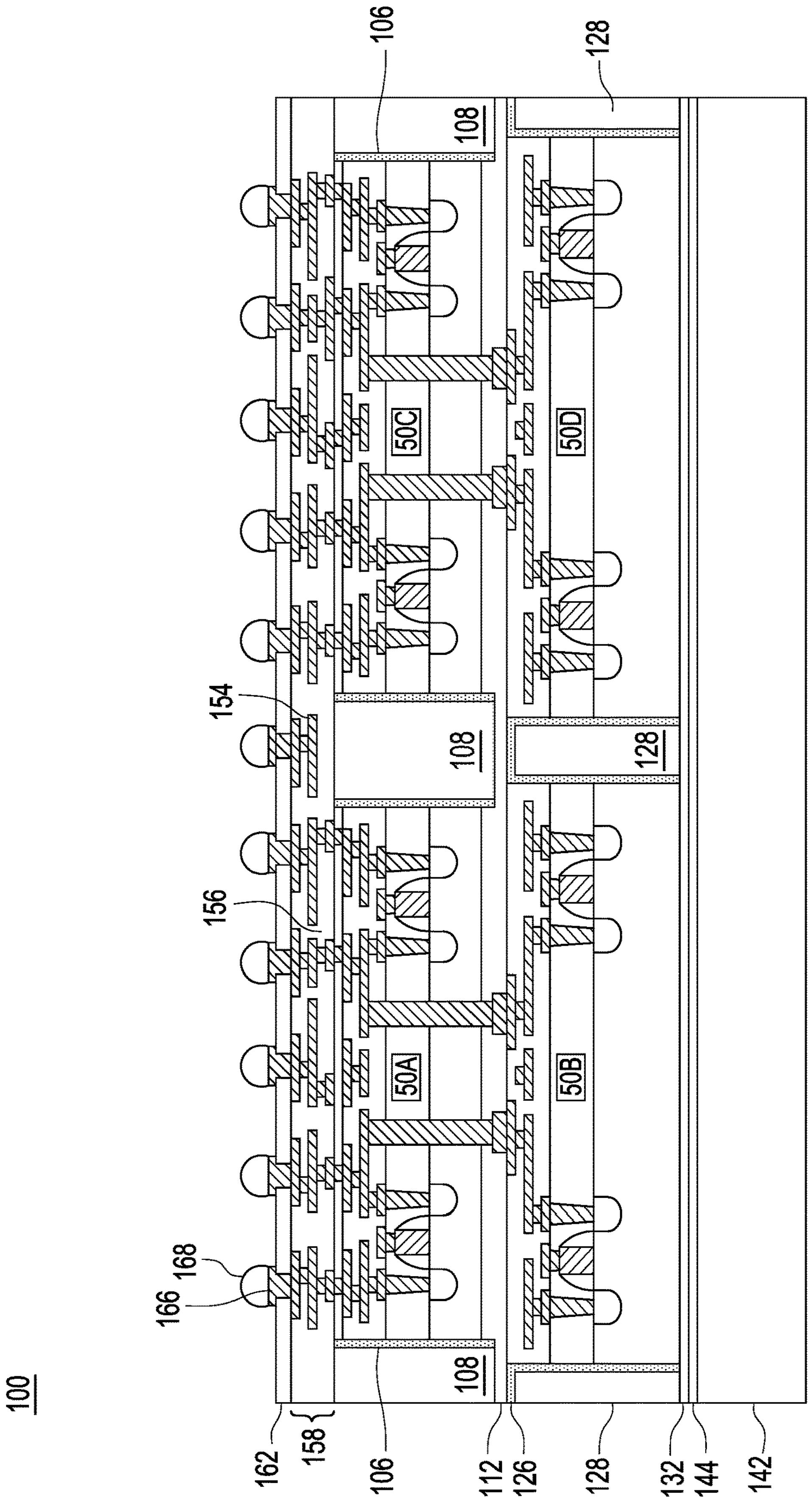
Figure 25D:
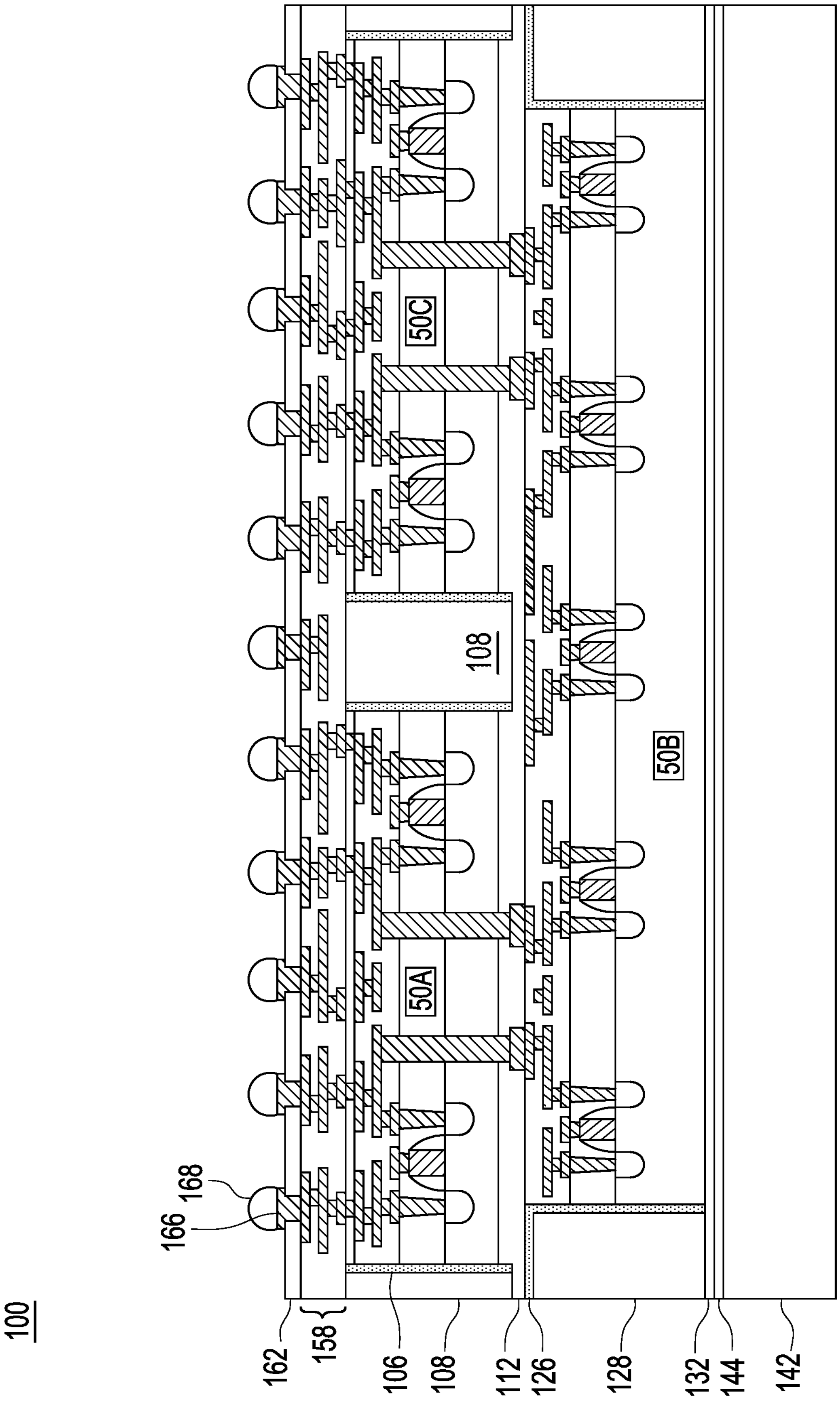

25B, the integrated circuit dies 50B and 50D are illustrated as having a smaller footprint than the integrated circuit dies 50A and 50C, resulting in a gap-fill dielectric 108 at the edge of the integrated circuit package 100 which has a different lateral thickness than the gap-fill dielectric 128 at the same edge of the integrated circuit package 100. In FIG. 25C, the integrated circuit dies 50B and 50D are illustrated as having a larger footprint than the integrated circuit dies 50A and 50C, resulting in a gap-fill dielectric 108 at the edge of the integrated circuit package 100 which has a different lateral thickness than the gap-fill dielectric 128 at the same edge of the integrated circuit package 100. In FIG. 25D, the integrated circuit dies 50B span two or more integrated circuit dies 50 (e.g., 50A and 50C) in the first tier (or second tier) of integrated circuit dies. The footprint of the spanning integrated circuit die 50B is illustrated as having smaller lateral extents than outer edges of the integrated circuit dies 50A and 50C, however, it should be understood that the size of the integrated circuit die 50B may be such that the outer edges of the integrated circuit die 50B are aligned to the outer edges of the integrated circuit dies 50A and 50C or may have larger lateral extents than the outer edges of the integrated circuit dies 50A and 50C.

Figure 26:
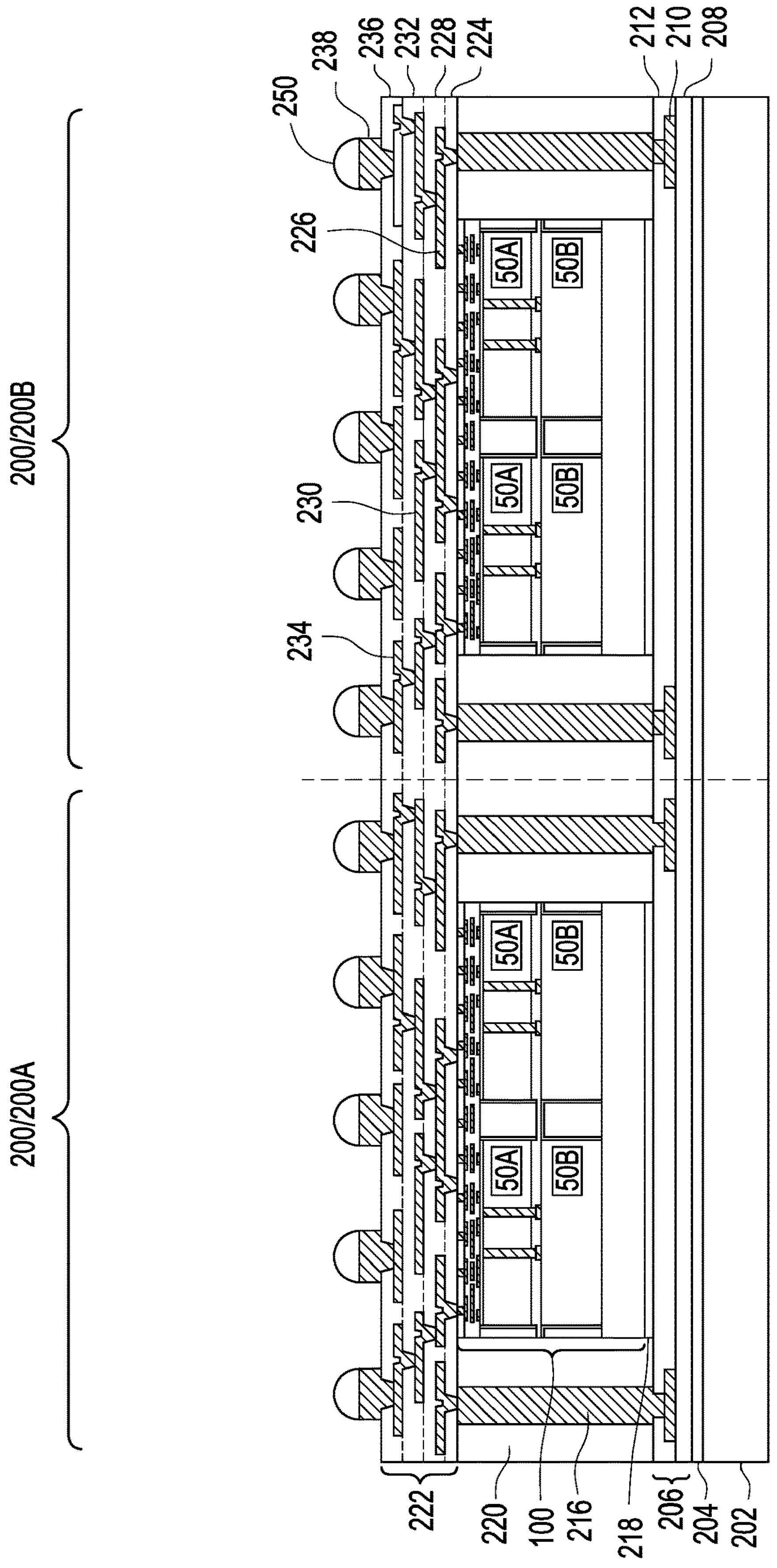
FIGS. 26-28 is a cross-sectional view of an intermediate stages in the manufacturing of integrated circuit packages, in accordance with some embodiments.
Figure 27:
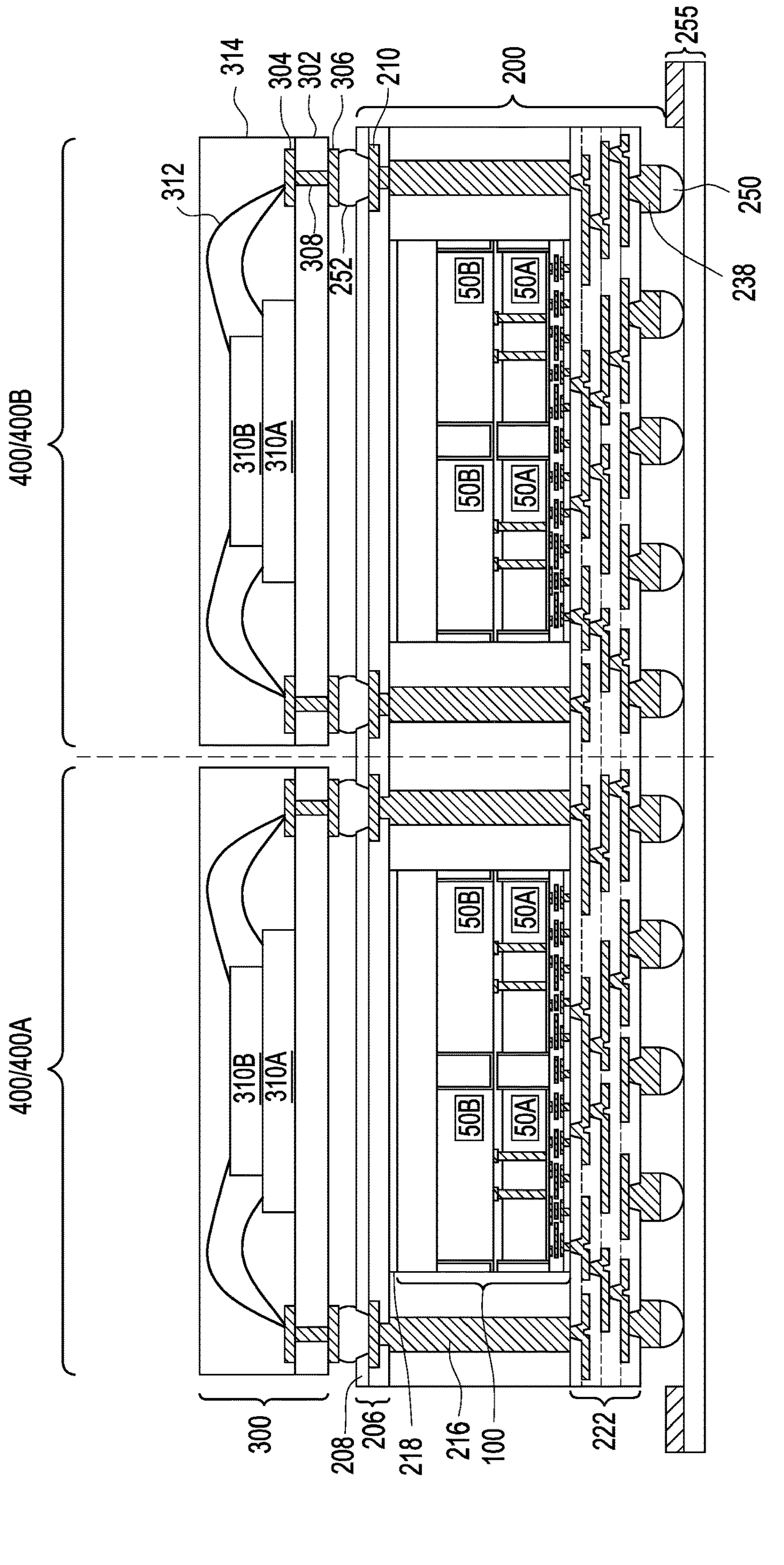
Figure 28:
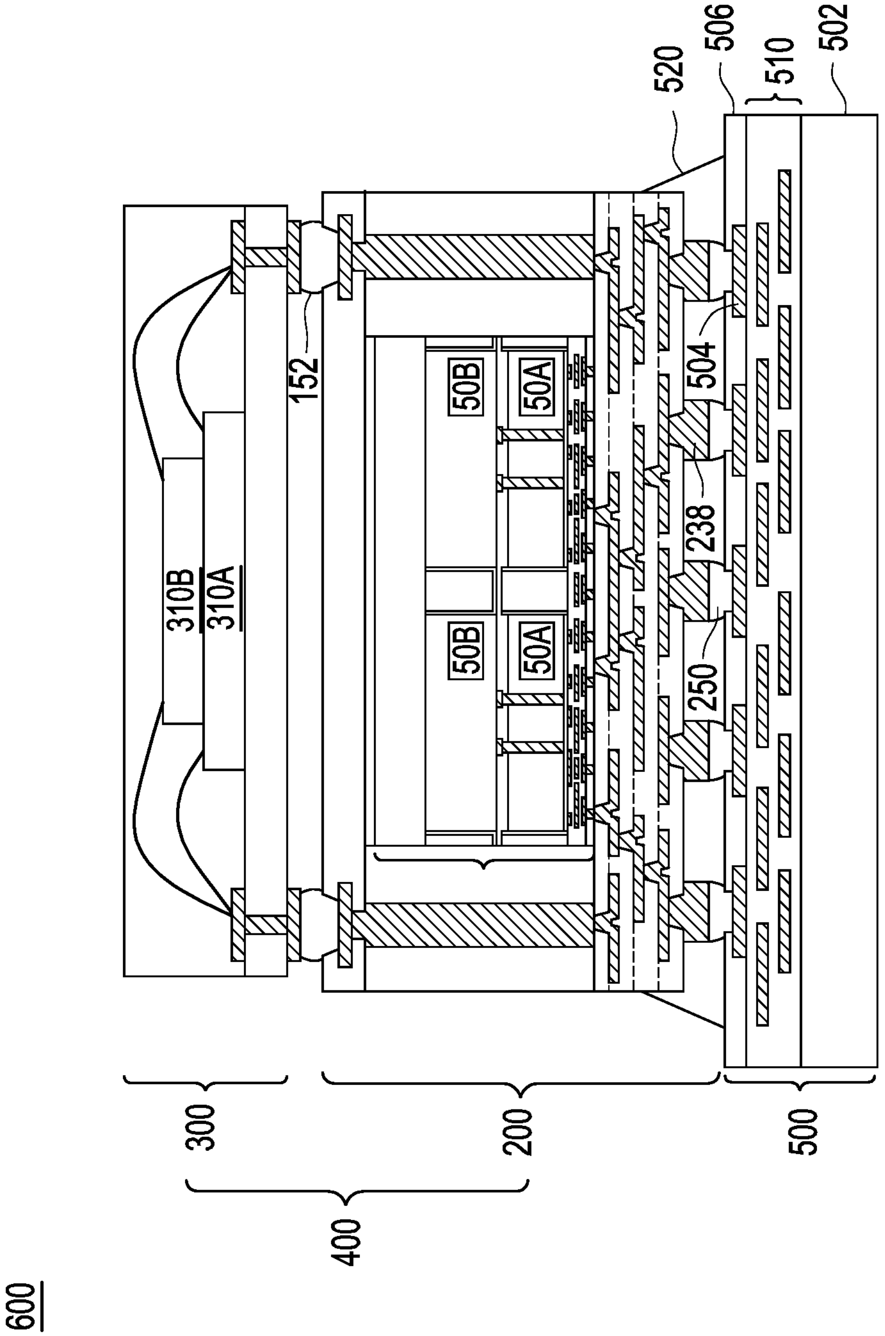

FIGS. 26 through 28 illustrate intermediate stages the formation of an integrated fan-out (InFO) package using the integrated circuit package 100 having the crack stopper structures 106 and 126 (under any of the previously discussed configurations in the package 100) as a chiplet device die of the InFO package. For simplicity, details of the integrated circuit packages 100 have been omitted.

In FIG. 26, a carrier substrate 202 is provided, and a release layer 204 is formed on the carrier substrate 202. The carrier substrate 202 may be like unto the carrier substrate 102 of FIG. 2 and the release layer 204 may be like unto the bonding film 104B and may be formed using similar processes and materials.

In FIG. 26, a back-side redistribution structure 206 may be formed on the release layer 204. In the embodiment shown, the back-side redistribution structure 206 includes a dielectric layer 208, a metallization pattern 210 (sometimes referred to as redistribution layers or redistribution lines), and a dielectric layer 212. The back-side redistribution structure 206 is optional. In some embodiments, a dielectric layer without metallization patterns is formed on the release layer 204 in lieu of the back-side redistribution structure 206.

The dielectric layer 208 may be formed on the release layer 204. The bottom surface of the dielectric layer 208 may be in contact with the top surface of the release layer 204. In some embodiments, the dielectric layer 208 is formed of a polymer, such as polybenzoxazole (PBO), polyimide, benzocyclobutene (BCB), or the like. In other embodiments, the dielectric layer 208 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 208 may be formed by any acceptable deposition process, such as spin coating, CVD, laminating, the like, or a combination thereof.

The metallization pattern 210 may be formed on the dielectric layer 208. As an example to form metallization pattern 210, a seed layer is formed over the dielectric layer 208. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist (not shown) is then formed and patterned on the seed layer. The photoresist may be formed by spin coating or the like and may be exposed to light for patterning. The pattern of the photoresist corresponds to the metallization pattern 210. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 210.

The dielectric layer 212 may be formed on the metallization pattern 210 and the dielectric layer 208. In some embodiments, the dielectric layer 212 is formed of a polymer, which may be a photo-sensitive material such as PBO, polyimide, BCB, or the like, that may be patterned using a lithography mask. In other embodiments, the dielectric layer 212 is formed of a nitride such as silicon nitride; an oxide such as silicon oxide, PSG, BSG, BPSG; or the like. The dielectric layer 212 may be formed by spin coating, lamination, CVD, the like, or a combination thereof. The dielectric layer 212 is then patterned to form openings exposing portions of the metallization pattern 210. The patterning may be formed by an acceptable process, such as by exposing the dielectric layer 212 to light when the dielectric layer 212 is a photo-sensitive material or by etching using, for example, an anisotropic etch. If the dielectric layer 212 is a photo-sensitive material, the dielectric layer 212 can be developed after the exposure.

In some embodiments, the back-side redistribution structure 206 may include any number of dielectric layers and metallization patterns. If more dielectric layers and metallization patterns are to be formed, steps and processes discussed above may be repeated. The metallization patterns may include one or more conductive elements. The conductive elements may be formed during the formation of the metallization pattern by forming the seed layer and conductive material of the metallization pattern over a surface of the underlying dielectric layer and in the opening of the underlying dielectric layer, thereby interconnecting and electrically coupling various conductive lines. A similar process as used to form the back-side redistribution structure 206 may also be used to form the redistribution structure 158, discussed above, and vice versa.

Through vias 216 are formed in the openings in the redistribution structure 206 and extend away from the topmost dielectric layer of the back-side redistribution structure 206 (e.g., the dielectric layer 212). As an example to form the through vias 216, a seed layer (not shown) is formed over the back-side redistribution structure 206, e.g., on the dielectric layer 212 and portions of the metallization pattern 210 exposed by the openings 214. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the through vias 216.

Packages 100 are adhered to the dielectric layer 212 by an adhesive 218. The packages 100 may be prepared such that the conductive connectors 168 are omitted and only the die connectors 166 are formed. The adhesive 218 is on back-sides of the packages 100 and adheres the packages 100 to the back-side redistribution structure 206, such as to the dielectric layer 212. The adhesive 218 may be any suitable adhesive, epoxy, die attach film (DAF), or the like. The adhesive 218 may be applied to back-sides of the packages 100, may be applied over the surface of the carrier substrate 202 if no back-side redistribution structure 206 is utilized, or may be applied to an upper surface of the back-side redistribution structure 206 if applicable. For example, the adhesive 218 may be applied to the back-sides of the packages 100 before singulating the package regions 102P to separate the packages 100 (see, e.g., FIG. 24). Although one of the packages 100 is illustrated for each package component 200 (e.g., package component 200A or 200B), it should be understood that multiples of the packages 100 may be used in any combination.

Next, an encapsulant 220 is formed on and around the various components. After formation, the encapsulant 220 encapsulates the through vias 216 and packages 100. The encapsulant 220 may be a molding compound, epoxy, or the like. The encapsulant 220 may be applied by compression molding, transfer molding, or the like, and may be formed over the carrier substrate 202 such that the through vias 216 and/or the packages 100 are buried or covered. The encapsulant 220 is further formed in gap regions between the packages 100. The encapsulant 220 may be applied in liquid or semi-liquid form and then subsequently cured. The encapsulant 220 laterally surrounds the packages 100 and has lateral extents which are greater than the lateral extents of the various features of the packages 100.

A planarization process is then performed on the encapsulant 220 to expose the through vias 216 and the die connectors 166 (see FIGS. 20 and 21). The planarization process may also remove material of the through vias 216, dielectric layer 156, and/or die connectors 166 until the die connectors 166 and through vias 216 are exposed. Top surfaces of the through vias 216, die connectors 166, dielectric layer 156, and encapsulant 220 are substantially coplanar after the planarization process within process variations. The planarization process may be, for example, a chemical-mechanical polish (CMP), a grinding process, or the like. In some embodiments, the planarization may be omitted, for example, if the through vias 216 and/or die connectors 166 are already exposed.

Next, a front-side redistribution structure 222 is formed over the encapsulant 220, through vias 216, and packages 100. The front-side redistribution structure 222 includes dielectric layers 224, 228, 232, and 236; and metallization patterns 226, 230, and 234. The metallization patterns may also be referred to as redistribution layers or redistribution lines. The front-side redistribution structure 222 is shown as an example having three layers of metallization patterns. More or fewer dielectric layers and metallization patterns may be formed in the front-side redistribution structure 222. The front-side redistribution structure 222 may be formed using processes and materials similar to those discussed above with respect to the redistribution structure 206. If fewer dielectric layers and metallization patterns are to be formed, steps and process discussed above may be omitted or repeated.

Under bump metallizations (UBMs) 238 are formed for external connection to the front-side redistribution structure 222. The UBMs 238 have bump portions on and extending along the major surface of the dielectric layer 236, and have via portions extending through the dielectric layer 236 to physically and electrically couple the metallization pattern 234. As a result, the UBMs 238 are electrically coupled to the through vias 216 and the package 100. The UBMs 238 may be formed of the same material as the metallization pattern 226. In some embodiments, the UBMs 238 have a different size than the metallization patterns 226, 230, and 234.

Under bump metallizations (UBMs) 238 are formed for external connection to the front-side redistribution structure 222. The UBMs 238 have bump portions on and extending along the major surface of the dielectric layer 236, and have via portions extending through the dielectric layer 236 to physically and electrically couple the metallization pattern 234. As a result, the UBMs 238 are electrically coupled to the through vias 216 and the package 195. The UBMs 238 may be formed of the same material as the metallization pattern 226. In some embodiments, the UBMs 238 have a different size than the metallization patterns 226, 230, and 234.

Conductive connectors 250 are formed on the UBMs 238. The conductive connectors 250 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 250 may include a conductive material such as solder, copper, aluminum, gold, nickel, silver, palladium, tin, the like, or a combination thereof. In some embodiments, the conductive connectors 250 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 250 comprise metal pillars (such as a copper pillar) formed by sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

The completed integrated fan out package components 200, such as package component 200A and package component 200B may be singulated in a subsequent process. The resulting package components 200 are integrated fan-out packages. In some embodiments additional package components may be attached to package components 200 prior to or after singulation.

In FIG. 27, a carrier substrate de-bonding is performed to detach (or "de-bond") the carrier substrate 202 (FIG. 26) from the back-side redistribution structure 206, e.g., the dielectric layer 208. In accordance with some embodiments, the de-bonding includes projecting a light such as a laser light or an UV light on the release layer 204 so that the release layer 204 decomposes under the heat of the light and the carrier substrate 202 can be removed. The structure is then flipped over and placed on tape 255.

To attach a second package component 300 to the package components 200, first, conductive connectors 252 are formed extending through the dielectric layer 208 to contact the metallization pattern 210 or in embodiments without a redistribution structure 206, the conductive connectors may contact the vias 216. Second package components 300 are coupled to the package components 200. One or more of the second package components 300 is coupled in each of the first package regions 400A and the second package regions 400B to form an integrated circuit device stack 400 in each region including the package components 200. The integrated circuit device stack 400 is an integrated fan out package on package structure.

The second package components 300 include, for example, a substrate 302 and one or more stacked dies 310 (e.g., 310A and 310B) coupled to the substrate 302. Although one set of stacked dies 310 (310A and 310B) is illustrated, in other embodiments, a plurality of stacked dies 310 (each having one or more stacked dies) may be disposed side-by-side coupled to a same surface of the substrate 302. The substrate 302 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 302 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 302 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for the substrate 302.

The substrate 302 may include active and passive devices (not shown). A wide variety of devices such as transistors, capacitors, resistors, combinations of these, and the like may be used to generate the structural and functional requirements of the design for the second package components 300. The devices may be formed using any suitable methods. The substrate 302 may also include metallization layers (not shown) and the conductive vias 308. In some embodiments, the substrate 302 is substantially free of active and passive devices.

The substrate 302 may have bond pads 304 on a first side of the substrate 302 to couple to the stacked dies 310, and bond pads 306 on a second side of the substrate 302, the second side being opposite the first side of the substrate 302, to couple to the conductive connectors 252. In the illustrated embodiment, the stacked dies 310 are coupled to the substrate 302 by wire bonds 312, although other connections may be used, such as conductive bumps. In an embodiment, the stacked dies 310 are stacked memory dies. For example, the stacked dies 310 may be memory dies such as low-power (LP) double data rate (DDR) memory modules, such as LPDDR1, LPDDR2, LPDDR3, LPDDR4, or the like memory modules.

The stacked dies 310 and the wire bonds 312 may be encapsulated by a molding material 314. The molding material 314 may be molded on the stacked dies 310 and the wire bonds 312, for example, using compression molding. In some embodiments, the molding material 314 is a molding compound, a polymer, an epoxy, silicon oxide filler material, the like, or a combination thereof. A curing process may be performed to cure the molding material 314; the curing process may be a thermal curing, a UV curing, the like, or a combination thereof.

After the second package components 300 are formed, the second package components 300 are mechanically and electrically bonded to the package component 200 by way of the conductive connectors 252, the bond pads 306, and a metallization pattern of the back-side redistribution structure 206. In some embodiments, the stacked dies 310 may be coupled to the packages 100 through the wire bonds 312, the bond pads 304 and 306, the conductive vias 308, the conductive connectors 252, the back-side redistribution structure 206, the through vias 216, and the front-side redistribution structure 222.

In some embodiments, an underfill (not shown) is formed between the package components 200 and the second package components 300, surrounding the conductive connectors 252. The underfill may reduce stress and protect the joints resulting from the reflowing of the conductive connectors 252. The underfill may be formed by a capillary flow process after the second package components 300 are attached, or may be formed by a suitable deposition method before the second package components 300 are attached.

A singulation process is performed by cutting along scribe line regions, e.g., between the first package region 400A and the second package region 400B using any suitable singulation technique, such as by sawing, laser cutting, or the like. The cutting singulates the first package region 400A from the second package region 400B. The resulting singulated integrated circuit device stack 400 is from one of the first package region 400A or the second package region 400B. In some embodiments, the singulation process is performed after the second package components 300 are coupled to the package components 200. In other embodiments, the singulation process is performed before the second package components 300 are coupled to the package components 200, such as after the carrier substrate 202 is de-bonded and the conductive connectors 252 are formed.

In FIG. 28, each integrated circuit device stack 400 may then be mounted to a package substrate 500 using the conductive connectors 250 to form 3D package 600. The package substrate 500 includes a substrate core 502 and bond pads 504 over the substrate core 502. The substrate core 502 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 502 may be an SOI substrate. Generally, an SOI substrate includes a layer of a semiconductor material such as epitaxial silicon, germanium, silicon germanium, SOI, SGOI, or combinations thereof. The substrate core 502 may be an organic substrate. The substrate core 502 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for substrate core 502.

The substrate core 502 may include active and passive devices (not shown). A wide variety of devices such as transistors, capacitors, resistors, combinations of these, and the like may be used to generate the structural and functional requirements of the design for the device stack. The devices may be formed using any suitable methods. The substrate core 502 may also include a redistribution structure 510 including metallization layers and vias, with the bond pads 504 being physically and/or electrically coupled to the metallization layers and vias.

In some embodiments, the conductive connectors 250 are reflowed to attach the package component 200 to the bond pads 504. The conductive connectors 250 electrically and/or physically couple the package substrate 500, including metallization layers in the substrate core 502, to the package component 200. In some embodiments, a solder resist 506 is formed on the substrate core 502. The conductive connectors 250 may be disposed in openings in the solder resist 506 to be electrically and mechanically coupled to the bond pads 504. The solder resist 506 may be used to protect areas of the substrate core 502 from external damage.

The conductive connectors 250 may have an epoxy flux (not shown) formed thereon before they are reflowed with at least some of the epoxy portion of the epoxy flux remaining after the package component 200 is attached to the package substrate 500. This remaining epoxy portion may act as an underfill to reduce stress and protect the joints resulting from reflowing the conductive connectors 250. In some embodiments, an optional underfill 520 may be formed between the package component 200 and the package substrate 500 and surrounding the conductive connectors 250. The underfill 520 may be formed by a capillary flow process after the package component 200 is attached or may be formed by a suitable deposition method before the package component 200 is attached.

Figure 29:
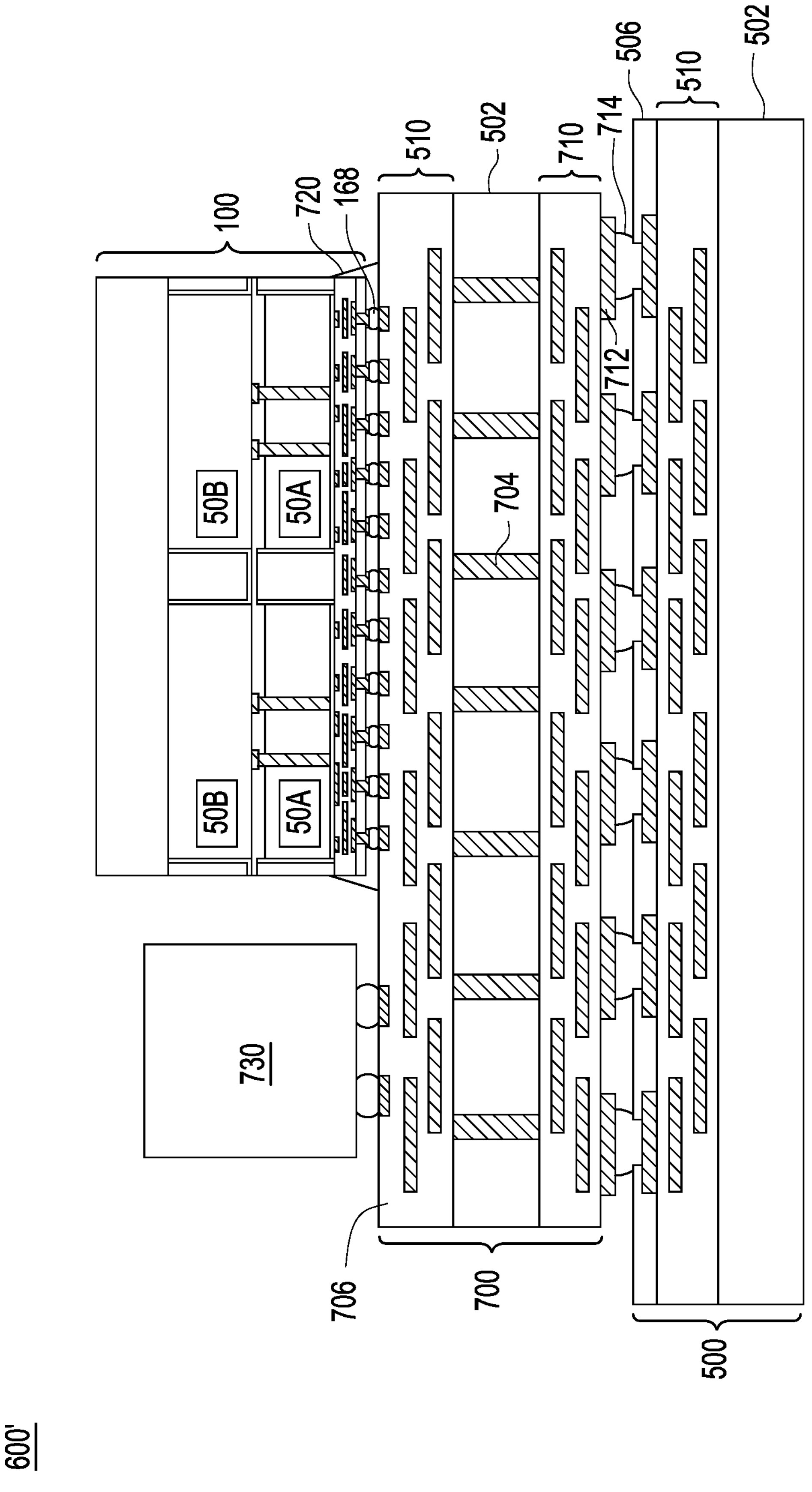
FIG. 29 is a cross-sectional view of an integrated circuit package, in accordance with some other embodiments.

FIG. 29 illustrates the packages 100 bonded to an interposer 700 which is then bonded to a substrate 500 to form a chip-on-wafer-on-substrate (CoWoS) package 600'. Although one of the packages 100 is illustrated as being bonded to interposer 700, it should be understood that multiples of the packages 100 may be used in any combination. The packages 100 may be bonded by conductive connectors 168 solder or by direct metal-to-metal bonding of the die connectors 166 with the interposer 700, or by any other suitable process. An optional underfill 720 similar to underfill 520 may be formed to surround the joints of the die connectors 166.

FIG. 29 also illustrates additional devices 730 bonded to the interposer 700. The additional devices may include memory devices, voltage regulators, antennas, logic devices, display devices, etc. In some embodiments, the interposer 700 may be used to provide electrical connections between the additional devices 730 and the packages 100 so that they may electrically interact.

The interposer 700 may be any suitable substrate and may be similar to the package substrate 500 with like reference numbers designating like structures. The redistribution structure 510 may include contact pads 706 for receiving the packages 100. The interposer 700 may also include a second redistribution structure 710 disposed on an opposite side of the substrate core 502 than the redistribution structure 510. The second redistribution structure 710 may be formed using processes and materials similar to those used to form the redistribution structure 510. The substrate core 502 includes through-vias 704 which electrically couple the redistribution structure 510 to the second redistribution structure 710. The through-vias 704 may be formed by forming openings in the substrate core 502 by etching or laser-drilling or another suitable process and then filling the openings with a conductive material. A barrier layer material may also be used in the openings prior to depositing the conductive material to surround the conductive material in the openings.

The interposer 700 may also include contact pads 712 coupled to the second redistribution structure 710. Each of the contact pads 712 may also include a solder ball or a solder bump 714 disposed thereon to form a ball grid array on the bottom of the interposer 700. The ball grid array may be used for flip chip bonding. The solder bumps 714 may be formed by depositing a solder material on the pads and reflowing the solder material.

Embodiments may achieve advantages. By utilizing a crack stopper structure surrounding attached integrated circuit devices, a number and severity of cracks can be reduced or eliminated. Cracks that propagate from an outer edge of a singulated package may be terminated at the crack stopper structure or in the crack stopper structure rather than allowed to continue propagation into the integrated circuit device. The crack stopper structures may include multiple layers and may include gradient layers disposed between the multiple layers to further enhance the crack stopping properties of the crack stopper structure. Reliability of the resulting integrated circuit packages during testing or operation may thus be improved.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

One embodiment is a method including forming a first crack stopper layer of a first crack stopper structure over a first integrated circuit die and along sidewalls of the first integrated circuit die. The method also includes forming a second crack stopper layer of the first crack stopper structure over the first crack stopper layer. The method also includes depositing a first gap-filling dielectric around the first crack stopper structure and the first integrated circuit die. Other embodiments of this aspect include corresponding computer systems, apparatus, and computer programs recorded on one or more computer storage devices, each configured to perform the actions of the methods.

In an embodiment, the method may include, prior to forming the second crack stopper layer, forming a dielectric film over the first crack stopper layer. In an embodiment, forming the second crack stopper layer may include depositing a first sub-layer of the second crack stopper layer over the dielectric film, and forming a second sub-layer of the second crack stopper layer over the first sub-layer of the second crack stopper layer. In an embodiment, forming the second sub-layer of the second crack stopper layer includes performing a pre-deposition treatment process to the first gap-filling dielectric or a post-deposition treatment to the first sub-layer of the second crack stopper layer. In an embodiment, the method may include, prior to forming the first sub-layer of the second crack stopper layer, forming a third sub-layer of the second crack stopper layer interposed between the dielectric film and the first sub-layer of the second crack stopper layer. In an embodiment, forming the third sub-layer of the second crack stopper layer includes performing a pre-deposition treatment to the first sub-layer of the second crack stopper layer or performing a post-deposition treatment to the dielectric film. In an embodiment, the first sub-layer may include a first dielectric material, where the first gap-filling dielectric may include a second dielectric material, and where the second sub-layer may include a third dielectric material, the third dielectric material being a combination of the first dielectric material and the second dielectric material. In an embodiment, the method may include bonding a second integrated circuit die to the first integrated circuit die, forming a second crack stopper structure over and along sidewalls of the second integrated circuit die, and depositing a second gap-filling dielectric around the second crack stopper structure and the second integrated circuit die. In an embodiment, the method may include, before bonding the second integrated circuit die, recessing a back side of a substrate of the first integrated circuit die to form a recess and expose conductive vias of the first integrated circuit die, and depositing a bonding layer in the recess, the bonding layer extending laterally further than the first integrated circuit die. In an embodiment, the method may include attaching a support substrate to the second gap-filling dielectric and the second integrated circuit die, and singulating a first package from the support substrate, the first package including the first integrated circuit die and the second integrated circuit die.

Another embodiment is a device including a first device tier, the first device tier including a first integrated circuit die, a first dielectric structure laterally surrounding the first integrated circuit die, and a first gap-filling dielectric laterally surrounding the first dielectric structure, the first dielectric structure including at least two dielectric material layers distinct from the first gap-filling dielectric. The device also includes a second device tier, the second device tier including a second integrated circuit die, a second dielectric structure laterally surrounding the second integrated circuit die, and a second gap-filling dielectric laterally surrounding the second dielectric structure, the second integrated circuit die bonded in a face-to-back manner to the first integrated circuit die. The device also includes a support substrate attached to the second integrated circuit die.

In an embodiment, the first dielectric structure includes a first layer and a second layer and a first dielectric film interposed between the first layer and the second layer, the first dielectric film having a same material composition as the first gap-filling dielectric. In an embodiment, the second layer includes a first sub-layer and a second sub-layer, the second sub-layer interposed between the first gap-filling dielectric and the first sub-layer, the first sub-layer having a first hardness, the first gap-filling dielectric having a second hardness less than the first hardness, and the second sub-layer having a third hardness between the first hardness and the second hardness. In an embodiment, the second layer further includes a third sub-layer, the third sub-layer interposed between the first sub-layer and the first dielectric film, the third sub-layer having a same material composition as the second sub-layer. In an embodiment, the first layer of the first dielectric structure has a thickness 2 to 3 times greater than a thickness of the second layer of the first dielectric structure. In an embodiment, a third integrated circuit die is disposed in the first device tier, the third integrated circuit die adjacent to the first integrated circuit die, wherein the second integrated circuit die spans over both the first integrated circuit die and the third integrated circuit die. In an embodiment, the first dielectric structure includes a first dielectric layer and a second dielectric layer, where a material of the second dielectric layer includes each element of the first dielectric layer and of the first gap-filling dielectric.

Another embodiment is a device including a first die, the first die laterally surrounded by a first dielectric material layer. The device also includes a second dielectric material layer laterally surrounding the first dielectric material layer. The device also includes a dielectric fill material laterally surrounding the second dielectric material layer, the first dielectric material layer having a same material composition as the dielectric fill material, the second dielectric material layer having a different material composition than the dielectric fill material.

In an embodiment, the second dielectric material layer includes a first sub-layer and a second sub-layer, the first sub-layer having a first elemental composition, the first dielectric fill material having a second elemental composition, and the second sub-layer including each element of the first elemental composition and the second elemental composition combined. In an embodiment, the second dielectric material layer includes a third sub-layer having a third elemental composition, where the third elemental composition includes each element of the first elemental composition and each element of the second elemental composition combined.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:

a first device tier, the first device tier including a first integrated circuit die, a first dielectric structure laterally surrounding the first integrated circuit die, and a first gap-filling dielectric laterally surrounding the first dielectric structure, the first dielectric structure including at least two dielectric material layers distinct from the first gap-filling dielectric, wherein the first dielectric structure includes a first layer, a second layer, and a first dielectric film between the first layer and the second layer, the first dielectric film having a same material composition as the first gap-filling dielectric, wherein the second layer includes a first sub-layer and a second sub-layer, the second sub-layer interposed between the first gap-filling dielectric and the first sub-layer, the first sub-layer having a first hardness, the first gap-filling dielectric having a second hardness less than the first hardness, and the second sub-layer having a third hardness between the first hardness and the second hardness;

a second device tier, the second device tier including a second integrated circuit die, a second dielectric structure laterally surrounding the second integrated circuit die, and a second gap-filling dielectric laterally surrounding the second dielectric structure, the second integrated circuit die bonded in a face-to-back manner to the first integrated circuit die; and a support substrate attached to the second integrated circuit die.

2. The device of claim 1, wherein the second layer further includes a third sub-layer, the third sub-layer interposed between the first sub-layer and the first dielectric film, the third sub-layer having a same material composition as the second sub-layer.

3. The device of claim 1, wherein the first layer of the first dielectric structure has a thickness 2 to 3 times greater than a thickness of the second layer of the first dielectric structure.

4. The device of claim 1, further comprising a third integrated circuit die disposed in the first device tier, the third integrated circuit die adjacent to the first integrated circuit die, wherein the second integrated circuit die spans over both the first integrated circuit die and the third integrated circuit die.

5. The device of claim 1, wherein an upper surface of the first layer is level with an upper surface of the second layer.

6. A device comprising:

a first die, the first die laterally surrounded by a first dielectric material layer;

a second dielectric material layer laterally surrounding the first dielectric material layer; and a dielectric fill material laterally surrounding the second dielectric material layer, the first dielectric material layer having a same material composition as the dielectric fill material, the second dielectric material layer having a different material composition than the dielectric fill material, wherein an upper surface of the dielectric fill material is level with an upper surface of the first dielectric material layer, wherein a bottom surface of the dielectric fill material is level with a bottom surface of the first dielectric material layer.

7. The device of claim 6, wherein the second dielectric material layer includes:

a first sub-layer comprising a first elemental composition, wherein the dielectric fill material comprises a second elemental composition; and a second sub-layer comprising each element of the first elemental composition and the second elemental composition combined.

8. The device of claim 7, wherein the second dielectric material layer includes:

a third sub-layer comprising a third elemental composition, wherein the third elemental composition comprises each element of the first elemental composition and each element of the second elemental composition combined.

9. The device of claim 6, further comprising:

a third dielectric material layer laterally surrounding the first die, wherein the third dielectric material layer is between the first dielectric material layer and the first die.

10. The device of claim 9, wherein the third dielectric material layer and the second dielectric material layer are formed of a same material.

11. The device of claim 9, further comprising:

a fourth dielectric material layer laterally surrounding the first die, wherein the fourth dielectric material layer is between the third dielectric material layer and the first die; and a fifth dielectric material layer laterally surrounding the first die, wherein the fifth dielectric material layer is between the fourth dielectric material layer and the first die.

12. The device of claim 11, wherein the fourth dielectric material layer and the first dielectric material layer are formed of a same material.

13. The device of claim 12, wherein the fifth dielectric material layer, the third dielectric material layer, and the second dielectric material layer are formed of a same material.

14. The device of claim 6, wherein the first die includes a conductive feature protruding from a semiconductor substrate, and further comprising:

an insulating layer over the semiconductor substrate of the first die and over the dielectric fill material, wherein the insulating layer extends along sidewalls of the conductive feature.

15. A device comprising:

a first die mounted on a first substrate, wherein the first die comprises a semiconductor substrate and a conductive feature protruding from a first surface of the semiconductor substrate;

a first dielectric material layer on a sidewall of the first die and over the first substrate;

a second dielectric material layer over the first dielectric material layer;

a third dielectric material layer over the second dielectric material layer;

a dielectric fill material over the third dielectric material layer, the second dielectric material layer having a same material composition as the dielectric fill material, the third dielectric material layer having a different material composition than the dielectric fill material, a first surface of the dielectric fill being opposite from and facing away from the first substrate; and an insulating layer over the first surface of the semiconductor substrate of the first die and over the first surface of the dielectric fill material, wherein the insulating layer extends along sidewalls of the conductive feature.

16. The device of claim 15, wherein sidewalls of the first dielectric material layer, the second dielectric material layer, the third dielectric material layer and the dielectric fill material are coterminous.

17. The device of claim 15, wherein the third dielectric material layer includes:

a first sub-layer; and a second sub-layer, the second sub-layer interposed between the dielectric fill material and the first sub-layer, the first sub-layer having a first hardness, the second sub-layer having a second hardness, the first hardness being greater than the second hardness.

18. The device of claim 17, wherein the dielectric fill material has a third hardness, the second hardness being greater than the third hardness.

19. The device of claim 15, wherein the first dielectric material layer has a thickness 1 to 3 times greater than a thickness of the third dielectric material layer.

20. The device of claim 15, wherein an upper surface of the dielectric fill material is level with an upper surface of the first dielectric material layer, wherein a bottom surface of the dielectric fill material is level with a bottom surface of the first dielectric material layer.

* * * * *